United States Patent
Shvartsman et al.

(10) Patent No.: US 6,236,203 B1
(45) Date of Patent: May 22, 2001

(54) SUPER SHIELDING OF FINITE LENGTH STRUCTURES IN OPEN MAGNETIC AND ELECTRIC SYSTEMS

(75) Inventors: Shmaryu M. Shvartsman, Mayfield Heights; Robert W. Brown, Solon; Hiroyuki Fujita, Highland Heights; Michael A. Morich, Mentor; Labros S. Petropoulos, Solon, all of OH (US)

(73) Assignees: Picker International, Inc., Highland Heights; Case Western Reserve University, Cleveland, both of OH (US)

(*) Notice: Subject to any disclaimer, the term of this patent is extended or adjusted under 35 U.S.C. 154(b) by 0 days.

(21) Appl. No.: 09/162,005

(22) Filed: Sep. 28, 1998

(51) Int. Cl.[7] .............................. G01R 33/20; G01V 3/00
(52) U.S. Cl. ......................................... 324/309; 324/318
(58) Field of Search ..................................... 324/318, 309, 324/307, 320, 322, 311, 312; 335/299

(56) References Cited

U.S. PATENT DOCUMENTS

| | | | |
|---|---|---|---|
| 4,794,338 | 12/1988 | Roemer et al. | 324/319 |
| 4,978,920 | * 12/1990 | Mansfield et al. | 324/318 |
| 5,132,618 | 7/1992 | Sugimoto | 324/318 |
| 5,266,913 | * 11/1993 | Chapman | 335/216 |
| 5,296,810 | 3/1994 | Morich | 324/318 |
| 6,078,177 | * 6/2000 | Petropoulos et al. | 324/318 |
| 6,100,692 | * 8/2000 | Petropoulos et al. | 324/318 |

OTHER PUBLICATIONS

Iise Lucas "Numerical solution of magnostatic boundary–value problems by iterative integration using Green's function" Journal of Applied Physics, vol. 47 No. 4 pp. 1645–1652 Apr. 1976.*

* cited by examiner

Primary Examiner—Christine Oda
Assistant Examiner—Tiffany A. Fetzner
(74) Attorney, Agent, or Firm—Fay, Sharpe, Fagan, Minnich & McKee, LLP

(57) ABSTRACT

Methods of designing an active shield for substantially zeroing an electro-magnetic field on one side of a predetermined boundary in open magnetic resonance imaging systems and in open electric systems are provided. The methods include defining a finite length geometry for a primary structure which, in the case of zeroing a magnetic field, carries a first current distribution on its surface. A finite length geometry is also defined for a secondary structure which, in the case of zeroing a magnetic field, carries a second current distribution on its surface. In the case of zeroing an electric field, the current distributions are replaced with charge distributions. A total magnetic or electric field resulting from a combination of the first and second current or charge distributions respectively is constrained such that normal components (in the magnetic field case) or tangential components (in the electric field case) thereof substantially vanish at the surface of one of the primary and secondary structures. The first current or charge distribution is constrained to the surface of the primary structure, and the second current or charge distribution is constrained to the surface of the secondary structure. The first and second current or charge distributions are then calculated concurrently allowing both the first and second current or charge distributions to vary while observing the constraints such that a predetermined magnetic or electric field is achieved in a first region and a magnetic or electric field on one side of a predetermined boundary is substantially zeroed.

20 Claims, 28 Drawing Sheets

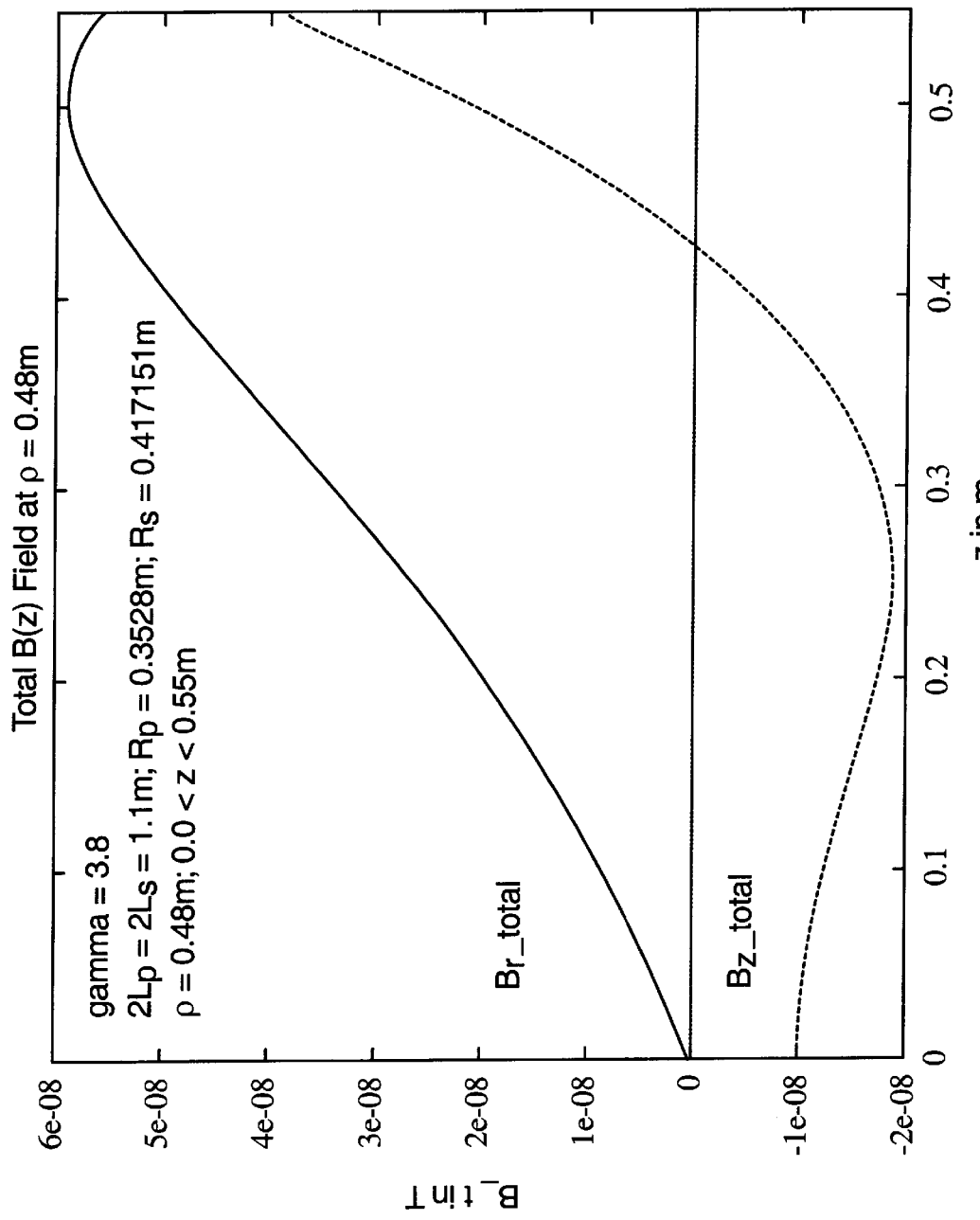

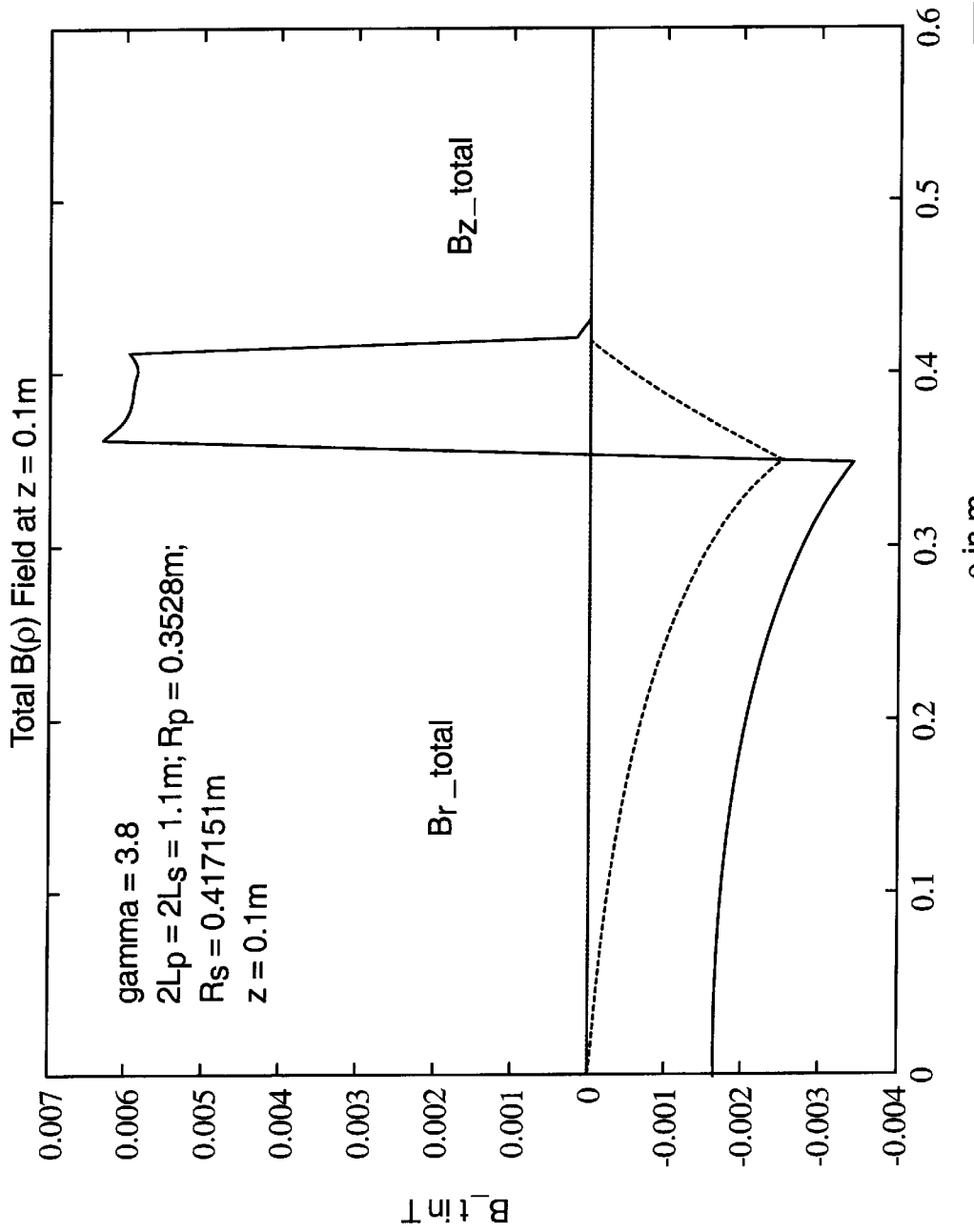

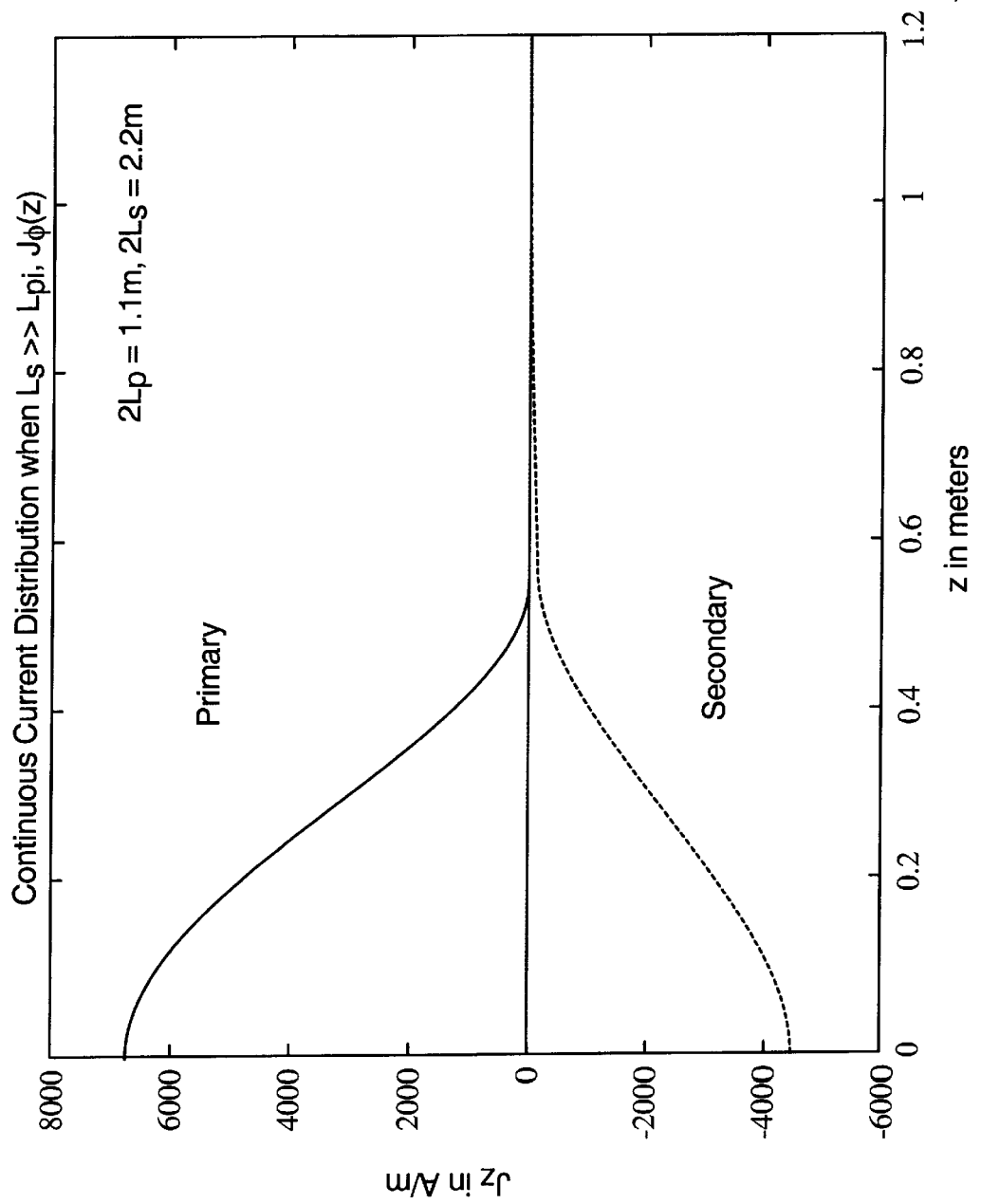

SUPER SHIELDING OF FINITE LENGTH STRUCTURES IN OPEN MAGNETIC AND ELECTRIC SYSTEMS

BACKGROUND OF THE INVENTION

The present invention relates to the art of active electromagnetic shielding. It finds particular application in conjunction with self-shielded magnetic gradient coils used in magnetic resonance imaging (MRI), and will be described with particular reference thereto. However, it is to be appreciated that the present invention is also amenable to other like applications where high quality efficient active shielding of magnetic and/or electric fields is desired.

In MRI systems, gradient coil assemblies are commonly pulsed with electrical current pulses to produce magnetic gradients across a main magnetic field in the vicinity of an imaging region. Commonly, the magnetic field gradients interact with external metallic structures such as the magnet cold shields, the magnet dewar, and the like. This interaction tends to generate eddy currents in the affected structures. These eddy currents, in turn, generate eddy magnetic fields which have a deleterious effect on the temporal and spatial quality of the magnetic field in the vicinity of the imaging region and, hence, in the resultant image quality.

The eddy current problem is often addressed by placing an active shielding coil between the primary gradient coil and the affected structure. The shielding coils are designed to substantially zero or cancel the residual magnetic field external to itself thereby preventing the formation of eddy currents in potentially vulnerable structures.

Previously methods for production for magnetic gradients in MRI systems consisted of winding discrete coils in a bunched or distributed fashion on an electrically insulating hollow cylindrical former and driving the coils with a current source of limited voltage. Conventional bunched coil designs include the Maxwell and the Modified Maxwell Pair for z-gradient production (i.e. axial gradient production), and the Golay or Modified Golay (multi-arc) Saddle Coils for x and/or y-gradient production (i.e. transverse gradient production). Typically, these methods consisted of iteratively placing coil loops or arcs on the cylindrical formers until the desired gradient strength, gradient uniformity, and inductance (related to stored energy) were achieved. These previous designs were generally developed in a "forward approach" whereby a set of initial coil positions were defined (i.e., the initial coil distribution), the fields and the inductance/energy calculated, and if not within particular design parameters, the coil positions would be shifted (statistically or otherwise) and results re-evaluated. This iterative procedure continued until a suitable design was obtained.

More recent methods of generating magnetic fields in magnetic resonance imaging systems utilize an "inverse approach." In the "inverse approach" method, the gradient magnetic field is forced to match predetermined values at specified spatial locations inside the imaging volume and a continuous current density is calculated which is capable of producing such a field. The "inverse approach" method assumes that the primary gradient coil has finite dimensions while those of the secondary or shield coil are left unrestricted (infinite). After the generation of continuous current distributions for both the primary and the shield or secondary coils, an apodization algorithm is performed on the continuous current density of the shield coil in order to restrain it to desirable dimensions. Following the modification of the shielding coil's continuous current, the Stream Function technique is employed in order to obtain discrete current patterns for both coils. Application of the Biot-Savart law to the discrete current pattern ensures that the discretization procedure was proper. This approach creates generally more energy efficient gradient coil assemblies with higher gradient strengths and faster slew rates as compared to the "forward approach" method.

One particular prior art approach is discussed in U.S. Pat. No. 4,794,338 to Roemer, et al. The approach of designing a shielded gradient coil assembly introduced by Roemer, et al. is based on the "forward approach" method. The outcome is a shielded gradient coil assembly with a moderate to low efficiency rate in terms of gradient strength and slew rate. Further, there is no precondition to the method for controlling eddy current effects inside the imaging region.

Another particular prior art gradient coil assembly is described in U.S. Pat. No. 5,296,810 to Morich. Morich describes a cylindrically shaped shielded gradient coil assembly for MRI applications. Morich uses the "inverse approach" method of designing gradient coil assemblies where the primary coil has a finite length while the length of the shielding coil is considered infinite. This configuration generates coils with high gradient strengths and slew rates while at the same time reduces the eddy current effects when the length of the shield coil is substantially longer (20% or more) than the length of the primary coil. In order to restrain the current of the shielding coil within desired dimensional boundaries, apodization techniques (e.g., guassian apodization) are employed. In this manner, the overall length of the shielding coil is approximately 20% longer than the total length of the primary gradient coil. Since the shielding coil was modeled as having an infinite length, in order to confine the length of the shielding coil to finite dimensions, current truncation is employed. The current apodization process towards the ends of the shielding coil cause disturbances in the shielding field and ultimately result in unwanted eddy current effects inside the imaging region. These effects become more deleterious as the length of the shielding coil approaches the length of the primary coil, or as both coil dimensions approach the imaging region.

In another particular prior art shielded gradient coil assembly described in U.S. Pat. No. 5,132,618 to Sugimoto, the design is based on the "inverse approach" method. In this design, both the primary and the shielded coil lengths were assumed infinite and continuous current densities for both the primary and the secondary coil are modeled based on this assumption. In order to restrain the current densities on both the primary and secondary coils, truncation is again employed. Although the outcome of this method is similar to that of the Morich patent discussed earlier, the additional truncation of the primary coil's current in this case introduces increased levels of eddy current effects inside the imaging region.

For interventional procedures and like applications where patient access is desirable, it is advantageous to design the gradient shielding coil such that its dimensions do not exceed those of the primary gradient coil. In this manner, patient access is maximized and the feeling of openness reduces patient claustrophobia. However, in general, the previous methods and prior art discussed above suffer the drawback that as the shielding coil length approaches that of the primary coil, increased levels of eddy current effects within the imaging region deteriorate image quality. Conversely, when sufficient shielding is achieved, the dimensions of the shielding coil are sufficiently larger than those of the primary coil that the level of patient access is encumbered and an increased level of patient claustrophobia is experienced.

Additionally, prior methods commonly determine the current density for the primary coil first, and then determine the appropriate current density for the shielding or secondary coil which will produce the zeroing of the residual magnetic field outside itself. These approaches, in varying degrees, often fail to appreciate the cooperative and interactive nature of the two-coil system. Consequently, they achieve generally less favorable results.

The present invention contemplates a new and improved technique for actively shield magnetic and/or electric fields which overcomes the above-referenced problems and others.

SUMMARY OF THE INVENTION

In accordance with one aspect of the present invention, a method of designing an active shield for substantially zeroing a magnetic field on one side of a predetermined boundary is provided. It includes defining a geometry for a primary coil which carries a first current distribution on its surface. A geometry for a secondary coil is also defined which carries a second current distribution on its surface. The total magnetic field resulting from a combination of the first and second current distributions is constrained such that normal components thereof vanish at the surface of one of the primary and secondary coils. The first current distribution is constrained to the surface of the primary coil of arbitrary length, and the second current distribution is constrained to the surface of the secondary coil of arbitrary length. The first and second current distributions are calculated concurrently while observing the constraints such that a predetermined magnetic field is achieved in a first region and a magnetic field on one side of a predetermined boundary is substantially zeroed.

In accordance with a more limited aspect of the present invention, the geometries of the primary and secondary coils define finite length coaxial cylinders with the primary coil being inside the secondary coil.

In accordance with a more limited aspect of the present invention, the lengths of the primary coil and the secondary coil are substantially the same.

In accordance with a more limited aspect of the present invention, the total magnetic field resulting from the combination of the first and second current distributions is constrained such that normal components thereof vanish at the surface of the secondary coil. The substantially zeroed magnetic field is outside the predetermined boundary which is defined by a cylinder of infinite length that is coincident with the secondary coil.

In accordance with a more limited aspect of the present invention, the total magnetic field resulting from the combination of the first and second current distributions is constrained such that normal components thereof vanish at the surface of the primary coil. The substantially zeroed magnetic field is inside the predetermined boundary which is defined by a cylinder of infinite length that is coincident with the primary coil.

In accordance with a more limited aspect of the present invention, an amount of energy associated with the first and second current distributions is minimized.

In accordance with another aspect of the present invention, a gradient coil assembly is included in a magnetic resonance scanner. The magnetic resonance scanner includes a main magnet for generating a main magnetic field through an examination region, said main magnet being arranged such that its geometry defines said examination region; a couch which supports a subject to be examined within said examination region; a radio frequency coil disposed adjacent said examination region for transmitting radio frequency signals into said examination region and selectively exciting dipoles disposed therein; a radio frequency transmitter for driving said radio frequency coil; a receiver which receives magnetic resonance signals from resonating dipoles within said examination region; and, an image processor which reconstructs an image representation from received magnetic resonance signals for display on a human-readable display. The gradient coil assembly generates a substantially linear predetermined magnetic gradients across said main magnetic field in said examination region. The gradient coil assembly has at least one primary coil disposed about said examination region including a first array of current carrying coil loops arranged on a first former to define a first current density. The gradient coil assembly also has at least one secondary coil disposed about said primary coil between said primary coil and said main magnet including a second array of current carrying coil loops arranged on a second former to define a second current density. The first current density is a discretized version of a first continuous current density, and said second current density is a discretized version of a second continuous current density. A residual magnetic field outside a boundary coincident with said second former is substantially zeroed by concurrently calculating said first and second continuous current densities while: (i) constraining a magnetic field generated by a combination of said first and second continuous current densities such that normal components thereof vanish at a surface defined by said second former, (ii) constraining said first continuous current density to a surface defined by said first former, and (iii) constraining said second continuous current density to said surface defined by said second former.

In accordance with a more limited aspect of the present invention, the first and second formers are finite length coaxial cylinders.

In accordance with a more limited aspect of the present invention, first and second formers have substantially the same lengths.

In accordance with a more limited aspect of the present invention, the boundary coincident with said second former defines an infinitely long cylinder.

In accordance with a more limited aspect of the present invention, an amount of energy used by said primary and secondary coils is minimized.

In accordance with a more limited aspect of the present invention, the gradient coil assembly includes three pairs of said primary and secondary coils arranged such that each pair generates substantially linear predetermined magnetic gradients along one of three mutually orthogonal axes. Said axes arranged such that one of the axes is coincident with a central axis of the primary coil.

In accordance with another aspect of the present invention, a method of designing an active shield for substantially zeroing an electric field on one side of a predetermined boundary is provided. It includes defining a geometry for a primary structure which carries a first charge distribution on its surface. A geometry for a second structure is also defined which carries a second charge distribution on its surface. The total electric field resulting from a combination of the first and second charge distributions is constrained such that tangential components thereof vanish at the surface of one of the primary and secondary structures. The first charge distribution is constrained to the surface of the primary structure, and the second charge distribution is constrained to the surface of the secondary structure. The first and second charge wed distributions are calculated concurrently while observing the constraints such that a predetermined electric field is achieved in a first region and an electric field on one side of a predetermined boundary is substantially zeroed.

In accordance with a more limited aspect of the present invention, the geometries of the primary and secondary structures define finite length coaxial cylinders with the primary strucuture being inside the secondary structure.

In accordance with a more limited aspect of the present invention, the lengths of the primary structure and the secondary structure are substantially the same.

In accordance with a more limited aspect of the present invention, the total electric field resulting from the combination of the first and second charge distributions is constrained such that tangential components thereof vanish at the surface of the secondary structure. The substantially zeroed electric field is outside the predetermined boundary which is defined by a cylinder of infinite length that is coincident with the secondary structure.

In accordance with a more limited aspect of the present invention, the total electric field resulting from the combination of the first and second charge distributions is constrained such that tangential components thereof vanish at the surface of the primary structure. The substantially zeroed electric field is inside the predetermined boundary which is defined by a cylinder of infinite length that is coincident with the primary structure.

One advantage of the present invention is that high quality electro-magnetic shielding is achieved.

Another advantage of the present invention is that it provides an analytical solution to a wide range of shielding applications.

Yet another advantage of the present invention is the improved design of a gradient coil assembly for use in MRI scanners.

Another advantage of the present invention is that high quality magnetic gradients are achieved in the examination region of an MRI scanner while reducing eddy current effects caused by residual magnetic fields outside the gradient coil assembly.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

FIG. 4B is a graph showing the total magnetic field as a function of z at $\rho=0.48$ m in the region 0.0 <z<0.55 m in accordance with aspects of the present invention;

FIG. 6B is a graph showing the total magnetic field as a function of $\rho$ at z=0.1 m in accordance with aspects of the present invention;

FIG. 7 is a graph showing $J_\phi$ components of a current density on primary and secondary coils in accordance with aspects of the present invention when the length of the shield coil is longer than the length of the primary coil;

DETAILED DESCRIPTION OF THE PREFERRED EMBODIMENTS

Figure 1A:
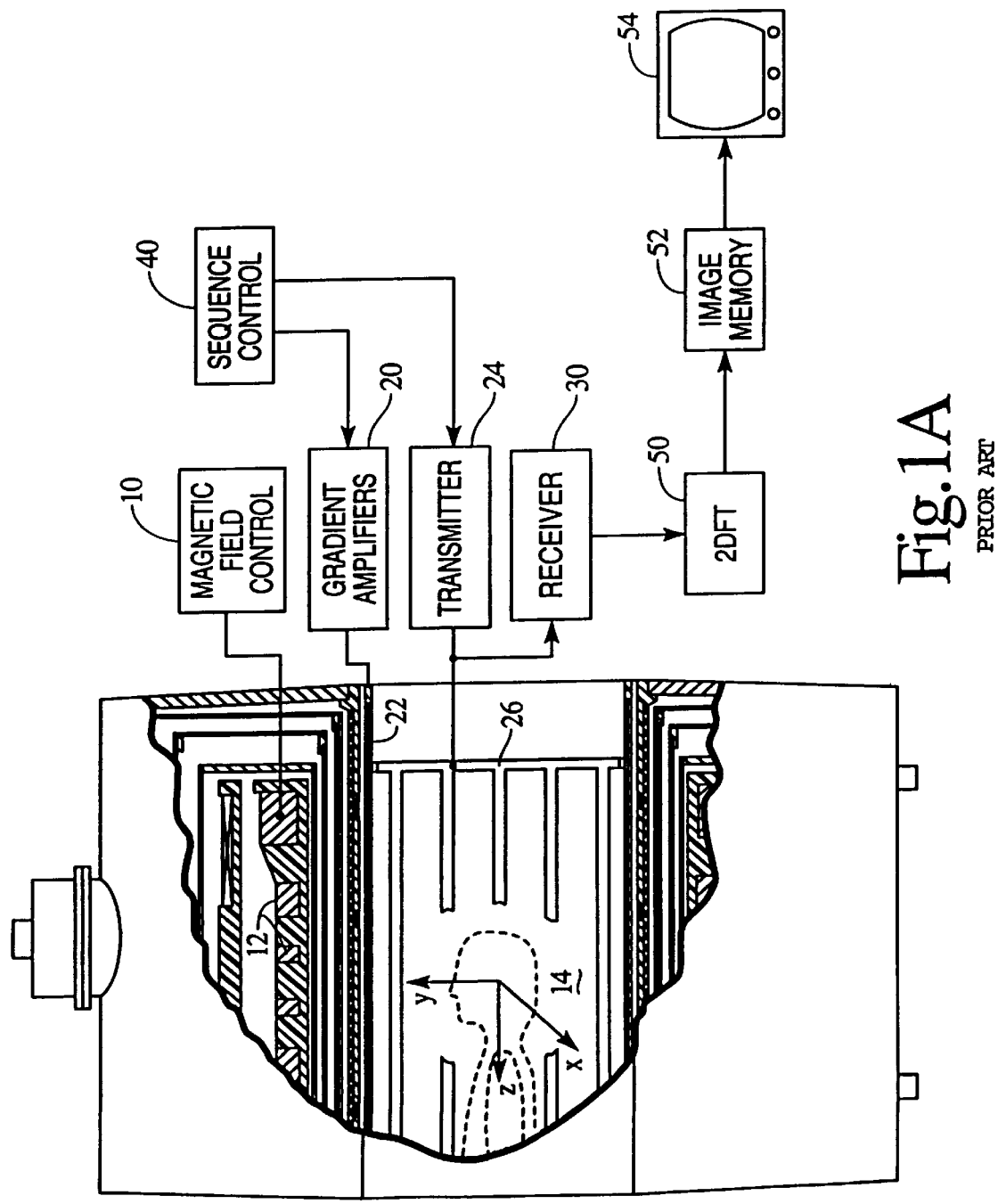
FIG. 1A is a diagrammatic illustration of a magnetic resonance imaging apparatus including a shielded gradient coil assembly designed in accordance with the present invention.

With reference to FIG. 1A, a main magnetic field control 10 controls superconducting or resistive magnets 12 such that a substantially uniform, temporally constant main magnetic field is created along a z axis through an examination region 14. A couch (not illustrated) suspends a subject to be examined within the examination region 14. A magnetic resonance echo means applies a series of radio frequencies (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectrography sequences. More specifically, gradient pulse amplifiers 20 apply current pulses to selected ones or pairs of gradient coil assemblies 22 to create magnetic field gradients along mutually orthogonal x, y, and z axes of the examination region 14. A digital radio frequency transmitter 24 transmits radio frequency pulses or pulse packets to a whole-body RF coil 26 to transmit RF pulses into the examination region. A typical radio frequency pulse is composed of a packet of immediately contiguous pulse segments of short duration which taken together with each other and any applied gradients achieve a selected magnetic resonance manipulation. For whole-body applications, the resonance signals are commonly picked up by the whole-body RF coil 26.

For generating images of local regions of the subject, specialized radio frequency coils are placed continuous to the selected region. For example, an insertable RF coil may be inserted surrounding a selected region at the isocenter of the bore. The insertable RF coil is used to excite magnetic resonance and receive magnetic resonance signals emitting from the patient in the region being examined. Alternatively, the insertable RF coil can be used to only receive resonance signals introduced by whole-body coil RF transmissions. In any event, the resultant radio frequency signals are picked up by the whole-body RF coil 26, the insertable RF coil, or other specialized RF coils and demodulated by a receiver 30, preferably a digital receiver.

A sequence control circuit 40 controls the gradient pulse amplifiers 20 and the transmitter 24 to generate any of a plurality of multiple echo sequences such as echo planar imaging, echo volume imaging, gradient and spin echo imaging, fast spin echo imaging, and the like. For the selected sequence, the receiver 30 receives a plurality of data lines in rapid succession following each RF excitation pulse. Ultimately, the radio frequency signals received are demodulated and reconstructed into an image representation by a reconstruction processor 50 which applies a two dimensional Fourier transform or other appropriate reconstruction algorithm. The image may represent a planar slice through the patient, an array of parallel planar slices, a three dimensional volume, or the like. The image is then stored in an image memory 52 where it may be accessed by a display, such as a video monitor 54 which provides a human readable display of the resultant image.

Figure 1C:
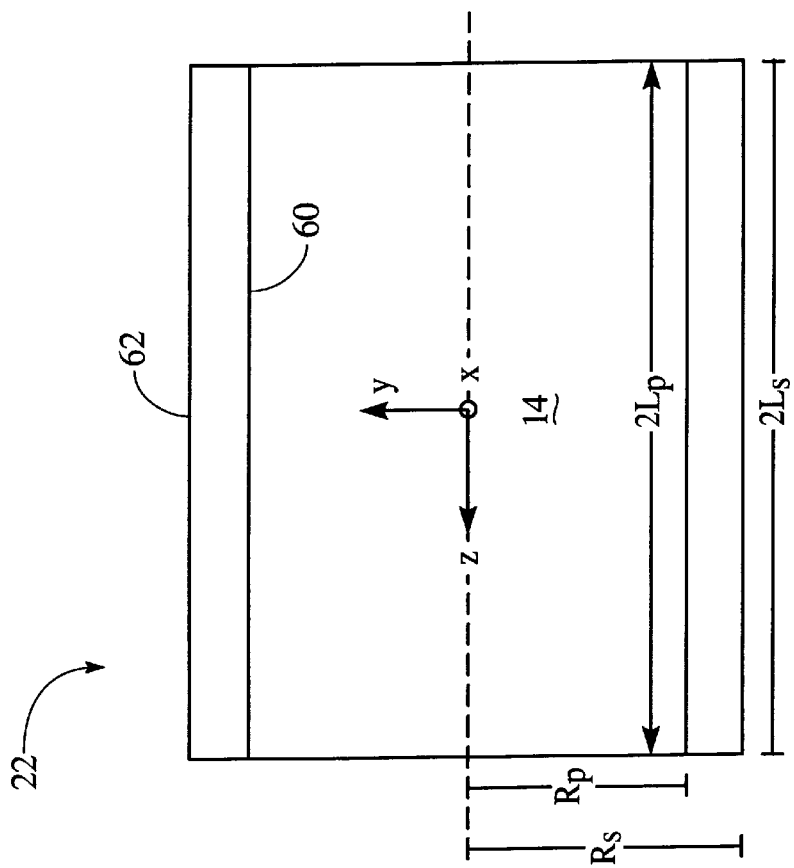
FIGS. 1B and 1C are diagrammatic illustrations of a shielded gradient coil assembly designed in accordance with the present invention.
Figure 1B:
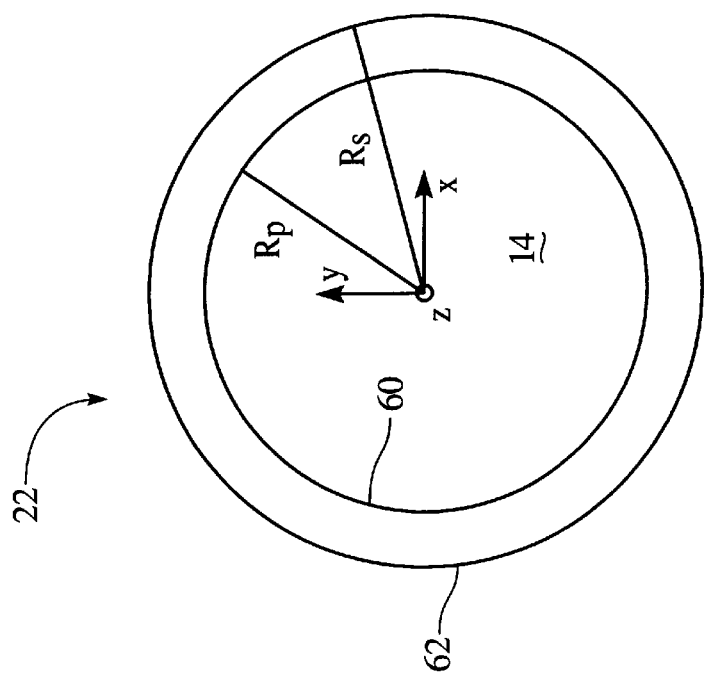

With reference to FIGS. 1B and 1C, the geometrical configuration of the actively shielded gradient coil assembly 22 is shown. In a preferred embodiment, the gradient coil assembly 22 includes three coaxial primary coil 60 and secondary coil 62 pairs (in the interest of simplification only one pair is shown) arranged such that each pair generates substantially linear predetermined magnetic gradients along one of the three mutually orthogonal axes, x, y, and z. The z axis preferably coincides with the central axis of the coils. For this configuration, the total length of the primary coil 60 is denoted as $2L_\rho$, and the length of the secondary coil 62 is denoted as $2L_s$. The radius of the primary coil 60 is denoted as $R_\rho$ while the radius of the secondary or shielding coil 62 is denoted as $R_s$.

Heretofore, the conventional design for shielded gradient coil assemblies has generally been based upon the assumption that the total length of the shielding coil is unrestricted and thus its current density is assumed as infinitely extended. Consequently, as "infinite" shielding coils are not available for practical applications, the current density was subsequently apodized or truncated to fit on appropriate finite length elements.

On the other hand, the technique employed herein involves the design of a shielded gradient coil configuration whereby the current for the shielding coil is initially restricted within the boundaries of a shielding coil having a finite length. Moreover, the technique employed herein generates the current densities on both the primary and secondary coils concurrently to thereby account for the cooperative and interactive nature of the two coils.

In the present invention, for open systems such as two coaxial cylinders of arbitrary radii ($R_\rho$ for the inner cylinder or primary coil and $R_s$ for the outer cylinder or secondary coil) and arbitrary lengths ($2L_\rho$ for the primary coil and $2L_s$ for the secondary coil), current distributions (in the case of magnetic field shielding) or alternately charge distributions (in the case of electric field shielding) on both cylinders are simultaneously found such that a quasi-static magnetic field or quasi-static electric field vanishes in the entire region outside an infinitely long cylindrical space having a radius coincident with that of the secondary coil (defined and referred to hereinafter as an exterior super shielding effect). Similarly, current or charge distributions (different from those for exterior super shielding) are also found such that a quasi-static magnetic field or quasi-static electric field vanishes in the entire region inside an infinitely long cylindrical space having a radius coincident with that of the primary coil (defined and referred to hereinafter as an interior super shielding effect). In both circumstances, for the exterior and/or interior super shielding, there is sufficient freedom such that the desired field behavior inside the primary coil, or outside the secondary coil, respectively, is achieved.

The following details the method of the present invention for determining the current or charge distributions of primary and secondary coils to achieve the aforementioned super shielding effects. More specifically, in an exemplary gradient coil assembly 22 having the geometric configuration illustrated in FIGS. 1B and 1C, the method is applied to achieve the exterior super shielding effect for a magnetic field.

SUPER SHIELDING OF THE MAGNETIC FIELD

I. Current Distribution

First, consider a current density distribution $\vec{J}(\vec{r})$ on a cylinder having a radius R and a total length 2L. For the cylindrical components on the surface of the cylinder given by $$\vec{J}(\rho,\phi,z) = \{\hat{e}_\phi J_\phi(\phi,z) + \hat{e}_z J_z(\phi,z)\}\delta(\rho - R) \quad (1),$$

where $\delta(\rho - R)$ is the restriction that confines the electrical current on a cylinder surface with radius R, the current density continuity equation $\nabla \cdot \vec{J}(\vec{r}) = 0$ has the form:

$$\frac{1}{R}\frac{\partial J_\phi}{\partial \phi} + \frac{\partial J_z}{\partial z} = 0. \quad (2)$$

A Fourier series representation follows from the periodicity in $\phi$. Current conservation eliminates the $J_z$-component of the zeroth harmonic, and reduces the current density to the form:

$$\vec{J}(\vec{r}) = \left(\vec{J}_0(z) + \sum_{i=1}^{2}\sum_{n=1}^{\infty} \vec{J}_n^{(i)}(\phi, z)\right)\delta(\rho - R); \quad (3)$$

where $$\vec{J}_0(z) = \hat{e}_\phi f_0(z) \quad (4),$$

$$\vec{J}_n^{(1)}(\phi,z) = \hat{e}_\phi f_n(z)\cos(n\phi) + \hat{e}_x q_n(z)\sin(n\phi) \quad (5),$$

$$\vec{J}_n^{(2)}(\phi,z) = \hat{e}_\phi g_n(z)\sin(n\phi) + \hat{e}_z p_n(z)\cos(n\phi) \quad (6),$$

and where $f_0(z)$ is an arbitrary function and $f_n(z)$, $q_n(z)$, $g_n(z)$, and $p_n(z)$ satisfy the following relations for $\eta \geq 1$:

$$\frac{n}{R}f_n(z) - q'_n(z) = 0, \quad \frac{n}{R}g_n(z) + p'_n(z) = 0, \quad (7)$$

where $q_n^1(z)$ and $p_n^1(z)$ are the first derivatives of $q_n(z)$ and $p_n(z)$ respectively, and $f_n(z)$, $q_n^1(z)$, $g_n(z)$, and $p_n^1(z)$ are adjusted to achieve desired field qualities. The end-condition is that there can be no abrupt change in the $J_\phi$-component of the current density, yielding $$q_n(|z|\geq L) = p_n(|z|\geq L) = 0 \quad (8).$$

However, there can be an abrupt change in the $J_\phi$-component of the current density, yielding $$f_n(|z|<L) = 0 \quad (9).$$

For an azimuthally directed current density, only the term $\vec{J}_0(z)$ in equation (4) is employed. For other applications, a combination of the terms of equations (4)–(6) is employed.

II. Magnetic Field

Next, consider the vector potential $\vec{A}(\vec{r})$ corresponding to the current distribution from equation (3), which takes the form:

$$\vec{A}(\vec{r}) = \frac{\mu_o}{4\pi}\int G(\vec{r},\vec{r}')\vec{J}(\vec{r}')d\vec{r}' \quad (10)$$

where $G(\vec{r},\vec{r}')$ is the Green function of the Maxwell equations which in cylindrical coordinates has the following form:

$$G(\vec{r},\vec{r}') = \frac{2}{\pi}\sum_{m=-\infty}^{\infty} e^{im(\phi-\phi')}\int_0^\infty \cos(k(z-z'))T_m(k,\rho,\rho')dk \quad (11)$$

where $$T_m(k,\rho,\rho^1) = \theta(\rho-\rho^1)I_m(k\rho^1)K_m(k\rho) + \theta(\rho^1-\rho)I_m(k\rho)K_m(k\rho^1) \quad (12)$$

and where $I_m(k\rho)$ and $K_m(k\rho)$ are the modified Bessel functions of the first and second kind, and $\theta(x)$ is the Heaviside step function. The vector potential then has the following representation:

$$\vec{A}(\vec{r}) = \vec{A}_0(\vec{r}) + \sum_{i=1}^{2}\sum_{n=1}^{\infty} \vec{A}_n^{(i)}(\vec{r}) \quad (13)$$

where $\vec{A}_0(\vec{r})$ corresponds to the current density $\vec{J}_0(z)$ and the terms with the indices i=1, 2 correspond to the current densities $\vec{J}_n^{(1)}(\phi,z)$ and $\vec{J}_n^{(2)}(\phi,z)$ respectively.

Starting with the magnetic field corresponding to the term $\vec{J}_0(z)$ in equation (3), there are only two components of the magnetic field in this case, $B_{0,\rho}(\vec{r})$ and $B_{0,z}(\vec{r})$, which take the following forms:

$$B_{0,\rho}(\vec{r}) = -\frac{\mu_o R}{\pi}\int_0^\infty kT_{1,0}(k,\rho,R)\int_{-L}^{L} f_0(z')\sin(k(z-z'))dz'dk \quad (14)$$

and, $$B_{0,z}(\vec{r}) = -\frac{\mu_o R}{\pi}\int_0^\infty kT_{2,0}(k,\rho,R)\int_{-L}^{L} f_0(z')\cos(k(z-z'))dz'dk \quad (15)$$

where $$T_{1,n}(k,\rho,R) = \theta(\rho-R)I'_n(kR)K'_n(k\rho) + \theta(R-\rho)I'_n(k\rho)K'_n(kR) \quad (16)$$

and, $$T_{2,n}(k,\rho,R) = \theta(\rho-R)I'_n(kR)K_n(k\rho) + \theta(R-\rho)I_n(k\rho)K'_n(kR). \quad (17)$$

The magnetic field expressions that correspond to the current densities $\vec{J}_n^{(1)}(\phi,z)$, for $\eta \geq 1$ are $$B_{n,\rho}^{(1)}(\vec{r}) = \quad (18)$$
$$-\frac{\mu_o R^2}{\pi}\frac{\cos(n\phi)}{n}\int_0^\infty k^2 T_{1,n}(k,\rho,R)\int_{-L}^{L} q_n(z')\cos(k(z-z'))dz'dk,$$

$$B_{n,\phi}^{(1)}(\vec{r}) = \quad (19)$$
$$-\frac{\mu_o R^2}{\pi\rho}\sin(n\phi)\int_0^\infty kT_{2,n}(k,\rho,R)\int_{-L}^{L} q_n(z')\cos(k(z-z'))dz'dk,$$

and $$B_{n,z}^{(1)}(\vec{r}) = \quad (20)$$
$$\frac{\mu_o R^2}{\pi}\frac{\cos(n\phi)}{n}\int_0^\infty k^2 T_{2,n}(k,\rho,R)\int_{-L}^{L} q_n(z')\sin(k(z-z'))dz'dk.$$

The expressions for the magnetic field that correspond to the current density $\vec{J}_n^{(2)}(\phi,z)$, for $\eta \geq 1$ are found from equations (18)–(20) by the following substitutions:

$$\cos(\eta\phi) \to -\sin(\eta\phi), \sin(\rho\phi) \to \cos(\eta\phi), q_n(z) \to p_\theta(z) \quad (21).$$

To shield the coil system, consider two coaxial cylinders of arbitrary radii, $R_\rho$ for the inner cylinder or primary coil and $R_x$ for outer cylinder or secondary coil, and arbitrary lengths of, $2L_p$ and $2L_s$, respectively. On each cylinder, the current distribution has the form given by equation (3). The total magnetic field then is a vector sum of the magnetic fields that correspond to the primary and secondary coils. In what follows all quantities that correspond to the primary coil are labeled with an index 'p', while all quantities that correspond to the secondary coil are labeled with an index 's'.

III. Exterior Super Shielding of the Magnetic Field

For excellent shielding of the magnetic field outside the secondary coil, a constraint is introduced which simulates the boundary condition expected for a very good conductor (or even a 'superconductor') by making the normal component of the total magnetic field vanish at the surface of the secondary coil, expressed analytically as $$B_{\eta,\rho}^{tot(1)}(\vec{r})|_{\rho=R_s}=0 \tag{22}$$

which holds for any $\eta \geq 0$. Sufficient conditions satisfying equation (22) are $$F_{0,L_s}^{\pm}(k) + \frac{R_p}{R_s}\frac{I_0'(kR_p)}{I_0'(kR_s)}F_{0,L_p}^{\pm}(k) = 0 \tag{23}$$

for axial coils (such as z-gradient coils or main magnet coils), and $$Q_{n,L_s}^{\pm}(k) + \frac{R_p^2}{R_s^2}\frac{I_n'(kR_p)}{I_n'(kR_s)}Q_{n,L_p}^{\pm}(k) = 0, n \geq 1 \tag{24}$$

for transverse coils (such as x-gradient coils or y-gradient coils); where, $$F_{0,L}^{\pm}(k) = \int_{-L}^{L} f_0(z)\binom{\cos(kz)}{\sin(kz)} dz \tag{25}$$

and $$Q_{n,L}^{\pm}(k) = \int_{-L}^{L} q_n(z)\binom{\cos(kz)}{\sin(kz)} dz, n \geq 1 \tag{26}$$

and the sign '+' refers to an even function of z and the sign '−' refers to an odd function of z. The full implications of these conditions determine those current densities on both coils that satisfy the boundary condition of equation (22).

An inverse Fourier transform of equations (23) and (24) together with the definitions from equations (25) and (26) lead to two types of additional consistency conditions $$\frac{1}{\pi}\int_0^{\infty} F_{0,L_p}^{\pm}(k)\binom{\cos(kz)}{\sin(kz)} dk = \theta(L_p - |z|)f_0^{\pm,(p)}(z) \tag{27}$$

and $$\frac{1}{\pi}\int_0^{\infty} F_{0,L_s}^{\pm}(k)\binom{\cos(kz)}{\sin(kz)} dk = \theta(L_s - |z|)f_0^{\pm,(s)}(z) \tag{28}$$

for axial coils, and $$\frac{1}{\pi}\int_0^{\infty} Q_{n,L_p}^{\pm}(k)\binom{\cos(kz)}{\sin(kz)} dk = \theta(L_p - |z|)q_n^{\pm,(p)}(z), n \geq 1 \tag{29}$$

and $$\frac{1}{\pi}\int_0^{\infty} Q_{n,L_s}^{\pm}(k)\binom{\cos(kz)}{\sin(kz)} dk = \theta(L_s - |z|)q_n^{\pm,(s)}(z), n \geq 1 \tag{30}$$

for transverse coils, where $$f_0^{\pm,(\rho,s)}(z)=\tfrac{1}{2}(f_0^{(\rho,s)}(z)\pm f_0^{(\rho,s)}(-z))\ q_n^{\pm,(\rho,s)}(z)=\tfrac{1}{2}(q_n^{(\rho,s)}(z)\pm i\ q_n^{(\rho,s)}(-z)) \tag{31}$$

When $|z|>L_p$ the equations (27) and (29) represent constraints for the current density on the primary coil. When $|z|\geq L_s$ the equations (28) and (30) represent constraints for the current density on the secondary coil. These consistency conditions represent the fact that the current does not flow off the ends of the coils. That is to say, the current densities are confined to finite cylinders.

For exterior shielding of the axial coils, the sufficiency condition (23) plus the consistency conditions (27)–(28) constitute the supershielding set of equations. By an inverse Fourier transform of (23), subject to (27)–(28), and an application of the Fourier convolution theorem, the supershielding set of equations is found to be equivalent to $$\theta(L_s - |z|)f_0^{\pm,(s)}(z) + \frac{1}{\pi}\int_{-L_p}^{L_p} r_a(z-y)f_0^{\pm,(p)}(y)\,dy = 0 \tag{23a}$$

where $$r_a(z-y) = \int_0^{\infty} R_a(k)\cos k(z-y)\,dk \tag{23b}$$

which is the Fourier transform of the coefficient in (23)

$$R_a(k) = \frac{R_p}{R_s}\frac{I_0'(kR_p)}{I_0'(kR_s)}. \tag{23c}$$

For exterior shielding of the transverse coils, the sufficiency condition (24) plus the consistency conditions (29)–(30) constitute the supershielding set of equations. By an inverse Fourier transform of (24), subject to (29)–(30), and an application of the Fourier convolution theorem, the supershielding set of equations is found to be equivalent to $$\theta(L_s - |z|)q_n^{\pm,(s)}(z) + \frac{1}{\pi}\int_{-L_p}^{L_p} r_t(z-y)q_n^{\pm,(p)}(y)\,dy = 0 \tag{24a}$$

where $$r_t(z-y) = \int_0^{\infty} R_t(k)\cos k(z-y)\,dk \tag{24b}$$

which is the Fourier transform of the coefficient in (24)

$$R_t(k) = \frac{R_p^2}{R_s^2}\frac{I_n'(kR_p)}{I_n'(kR_s)}. \tag{24c}$$

The shielding conditions from equations (23) and (24) are now used to write the expressions for all components of the total magnetic field. Inside an infinite cylinder with a radius given by the primary coil radius (i.e. $\rho<R_p$) this is expressed as follows:

$$B_{0,\rho}^{tot}(\vec{r}) = \quad (32)$$
$$-\frac{\mu_o R_p}{\pi}\int_0^\infty k I_0'(k\rho)G_0(k,R_p,R_s)\int_{-L_p}^{L_p} f_0^{(p)}(z')\sin(k(z-z'))dz'dk,$$

$$B_{0,z}^{tot}(\vec{r}) = \quad (33)$$
$$-\frac{\mu_o R_p}{\pi}\int_0^\infty k I_0(k\rho)G_0(k,R_p,R_s)\int_{-L_p}^{L_p} f_0^{(p)}(z')\cos(k(z-z'))dz'dk,$$

$$B_{n,\rho}^{tot(1)}(\vec{r}) = -\frac{\mu_o R_p^2}{\pi}\frac{\cos(n\phi)}{n}\times \quad (34)$$
$$\int_0^\infty k^2 I_n'(k\rho)G_n(k,R_p,R_s)\int_{-L_p}^{L_p} q_n^{(p)}(z')\cos(k(z-z'))dz'dk, n\geq 1,$$

$$B_{n,\phi}^{tot(1)}(\vec{r}) = \frac{\mu_o R_p^2}{\pi\rho}\sin(n\phi)\times \quad (35)$$
$$\int_0^\infty k I_n(k\rho)G_n(k,R_p,R_s)\int_{-L_p}^{L_p} q_n^{(p)}(z')\cos(k(z-z'))dz'dk, n\geq 1,$$

and $$B_{n,z}^{tot(1)}(\vec{r}) = \frac{\mu_o R_p^2}{\pi}\frac{\cos(n\phi)}{n}\times \quad (36)$$
$$\int_0^\infty k I_n(k\rho)G_n(k,R_p,R_s)\int_{-L_p}^{L_p} q_n^{(p)}(z')\sin(k(z-z'))dz'dk, n\geq 1$$

where $$G_n(k,R_p,R_s) = K_n'(kR_p) - \frac{I_n'(kR_p)}{I_n'(kR_s)}K_n'(kR_s). \quad (37)$$

In the region between two cylinders of infinite length whose radii are the same as those of the primary and secondary coils (i.e. $R_p<\rho<R_s$), the expressions for the total magnetic field are as follows:

$$B_{0,\rho}^{tot}(\vec{r}) = -\frac{\mu_o R_p}{\pi}\int_0^\infty k\frac{I_0'(kR_p)}{I_0'(kR_s)}\times\{I_0'(k\rho)K_0'(kR_s)- \quad (38)$$
$$I_0'(kR_s)K_0'(k\rho)\}\int_{-L_p}^{L_p} f_0^{(p)}(z')\sin(k(z-z'))dz'dk,$$

$$B_{0,z}^{tot}(\vec{r}) = \frac{\mu_o R_p}{\pi}\int_0^\infty k\frac{I_0'(kR_p)}{I_0'(kR_s)}\times\{I_0(k\rho)K_0'(kR_s)- \quad (39)$$
$$I_0'(kR_s)K_0(k\rho)\}\int_{-L_p}^{L_p} f_0^{(p)}(z')\cos(k(z-z'))dz'dk,$$

$$B_{n,\rho}^{tot(1)}(\vec{r}) = \quad (40)$$
$$-\frac{\mu_o R_p^2}{\pi}\frac{\cos(n\phi)}{n}\int_0^\infty k^2\frac{I_n'(kR_p)}{I_n'(kR_s)}\times\{-I_n'(k\rho)K_n'(kR_s)+I_n'(kR_s)K_n'(k\rho)\}$$
$$\int_{-L_p}^{L_p} q_n^{(p)}(z')\cos(k(z-z'))dz'dk, n\geq 1,$$

$$B_{n,\phi}^{tot(1)}(\vec{r}) = \frac{\mu_o R_p^2}{\pi\rho}\sin(n\phi)\int_0^\infty \frac{I_n'(kR_p)}{I_n'(kR_s)}\times\{-I_n(k\rho)K_n'(kR_s)+ \quad (41)$$
$$I_n'(kR_s)K_n(k\rho)\}\int_{-L_p}^{L_p} q_n^{(p)}(z')\cos(k(z-z'))dz'dk, n\geq 1,$$

and $$B_{n,z}^{tot(1)}(\vec{r}) = \frac{\mu_o R_p^2}{\pi}\frac{\cos(n\phi)}{n}\int_0^\infty k\frac{I_n'(kR_p)}{I_n'(kR_s)}\times\{-I_n(k\rho)K_n'(kR_s)+ \quad (42)$$
$$I_n'(kR_s)K_n(k\rho)\}\int_{-L_p}^{L_p} q_n^{(p)}(z')\sin(k(z-z'))dz'dk, n\geq 1.$$

In the region outside an infinite cylinder whose radius is the same as that of the secondary coil (i.e. $\rho>R_s$), the total magnetic field vanishes, which is expressed as follows:

$$B_{\eta,\rho}^{tot(1)}(\vec{r})=B_{\eta,\phi}^{tot(1)}(\vec{r})=B_{\eta,z}^{tot(1)}(\vec{r})=0, \eta\geq 0 \quad (43).$$

Equation (43) represents the principal result of this section. The shielding conditions given by equations (23)–(24), together with the consistency conditions from equations (27)–(30), lead to the complete cancellation of the magnetic field in the space outside the infinite cylinder coincident with the secondary coil. Moreover, the field components inside this infinite cylinder all vanish reasonably rapidly in the z-direction as the distance increases from the ends of the coils.

IV. Interior super shielding of the Magnetic Field

For excellent shielding of the magnetic field inside the primary coil, a constraint is introduced which simulates the boundary condition expected for a very good conductor (or even a 'superconductor') by making the normal component of the total magnetic field vanish at the surface of the primary coil, expressed analytically as $$B_{\eta,\rho}^{tot(1)}(\vec{r})|_{\eta=R_\rho}=0 \quad (44)$$

which holds for any mode $\eta\geq 0$. Sufficient conditions satisfying equation (44) are $$F_{0,L_p}^\pm(k) + \frac{R_s}{R_p}\frac{K_0'(kR_s)}{K_0'(kR_p)}F_{0,L_s}^\pm(k) = 0 \quad (45)$$

and $$Q_{n,L_p}^\pm(k) + \frac{R_s^2}{R_p^2}\frac{K_n'(kR_s)}{K_n'(kR_p)}Q_{n,L_s}^\pm(k) = 0, n\geq 1. \quad (46)$$

Here the same notations have been used for the Fourier transforms for the current densities as in the previous section. The consistency conditions for the system given by equations (45) and (46) have the same form as in equations (27)–(30).

For interior shielding of the axial coils, the sufficiency condition (45) plus the consistency conditions having the same form as (27)–(28) constitute the supershielding set of equations. By an inverse Fourier transform of (45), subject to the consistency conditions, and an application of the Fourier convolution theorem, the supershielding set of equations is found to be equivalent to $$\theta(L_p-|z|)f_0^{\pm,(p)}(z) + \frac{1}{\pi}\int_{-L_p}^{L_p} r_A(z-y)f_0^{\pm,(s)}(y)dy = 0 \quad (45a)$$

where $$r_A(z-y) = \int_0^\infty R_A(k)\cos k(z-y)dk \quad (45b)$$

which is the Fourier transform of the coefficient in (45)

$$R_A(k) = \frac{R_s}{R_p} \frac{K_0'(kR_s)}{K_0'(kR_p)}. \tag{45c}$$

For interior shielding of the transverse coils, the sufficiency condition (46) plus the consistency conditions having the same form as (27)–(28) constitute the supershielding set of equations. By an inverse Fourier transform of (46), subject to the consistency conditions, and an application of the Fourier convolution theorem, the supershielding set of equations is found to be equivalent to $$\Theta(L_p - |z|)q_n^{\pm,(p)}(z) + \frac{1}{\pi}\int_{-L_s}^{L_s} r_T(z-y)q_n^{\pm,(s)}(y)dy = 0 \tag{46a}$$

where $$r_T(z - y) = \int_0^\infty R_T(k)\cos k(z - y)dk \tag{46b}$$

which is the Fourier transform of the coefficient in (46)

$$R_T(k) = \frac{R_s^2}{R_p^2} \frac{K_n'(kR_s)}{K_n'(kR_p)}. \tag{46c}$$

The interior shielding conditions are now used to write the expressions for all components of the total magnetic field. Inside an infinite cylinder with a radius given by the primary coil radius (i.e. $\rho < R_p$), the total magnetic field exactly vanishes, which is expressed analytically as $$B_{\eta,\rho}^{tot(1)}(\vec{r}) = B_{\eta,\phi}^{tot(1)}(\vec{r}) = B_{\eta,z}^{tot(1)}(\vec{r}) = 0, \eta \geq 0 \tag{47}$$

In the region between two cylinders of infinite length whose radii are the same as those of the primary and secondary coils (i.e. $R_p < \rho < R_s$), the expressions for all components of the total magnetic field are $$B_{0,\rho}^{tot}(\vec{r}) = -\frac{\mu_0 R_s}{\pi} \int_0^\infty k \frac{K_0'(kR_s)}{K_0'(kR_p)} \times \{ I_0'(k\rho)K_0'(kR_p) - \tag{48}$$

$$I_0'(kR_p)K_0'(k\rho) \} \int_{-L_s}^{L_s} f_0^{(s)}(z')\sin(k(z-z'))dz'dk,$$

$$B_{0,z}^{tot}(\vec{r}) = -\frac{\mu_0 R_s}{\pi} \int_0^\infty k \frac{K_0'(kR_s)}{K_0'(kR_p)} \times \{ I_0'(k\rho)K_0'(kR_p) - \tag{49}$$

$$I_0'(kR_p)K_0(k\rho) \} \int_{-L_s}^{L_s} f_0^{(s)}(z')\cos(k(z-z'))dz'dk,$$

$$B_{n,\rho}^{tot(1)}(\vec{r}) = \tag{50}$$

$$\frac{\mu_0 R_s^2}{\pi} \frac{\cos(n\phi)}{n} \int_0^\infty k^2 \frac{K_n'(kR_s)}{K_n'(kR_p)} \times \{ -I_n'(k\rho)K_n'(kR_p) + I_n'(kR_p)$$

$$K_n'(k\rho) \} \int_{-L_s}^{L_s} q_n^{(s)}(z')\cos(k(z-z'))dz'dk, n \geq 1,$$

$$B_{n,\phi}^{tot(1)}(\vec{r}) = \frac{\mu_0 R_s^2}{\pi\rho} \sin(n\phi) \int_0^\infty k \frac{K_n'(kR_s)}{K_n'(kR_p)} \times \{ -I_n(k\rho)K_n'(kR_p) + \tag{51}$$

$$I_n'(kR_p)K_n(k\rho) \} \int_{-L_s}^{L_s} q_n^{(s)}(z')\cos(k(z-z'))dz'dk, n \geq 1,$$

and $$B_{n,z}^{tot(1)}(\vec{r}) = \tag{52}$$

$$\frac{\mu_0 R_s^2}{\pi} \frac{\cos(n\phi)}{n} \int_0^\infty k \frac{K_n'(kR_s)}{K_n'(kR_p)} \times \{ -I_n(k\rho)K_n'(kR_p) + I_n'(kR_p)$$

$$K_n(k\rho) \} \int_{-L_s}^{L_s} q_n^{(s)}(z')\sin(k(z-z'))dz'dk, n \geq 1.$$

In the region outside an infinite cylinder whose radius is the same as that of the secondary coil (i.e. $\rho > R_s$), all components of the total magnetic field have the following form:

$$B_{0,\rho}^{tot}(\vec{r}) = \tag{53}$$

$$-\frac{\mu_0 R_s}{\pi} \int_0^\infty kK_0'(k\rho)D_0(k, R_p, R_s) \int_{-L_s}^{L_s} f_0^{(s)}(z')\sin(k(z-z'))dz'dk,$$

$$B_{0,z}^{tot}(\vec{r}) = \tag{54}$$

$$-\frac{\mu_0 R_s}{\pi} \int_0^\infty kK_0(k\rho)D_0(k, R_p, R_s) \int_{-L_s}^{L_s} f_0^{(s)}(z')\cos(k(z-z'))dz'dk,$$

$$B_{0,\rho}^{tot(1)}(\vec{r}) = -\frac{\mu_0 R_s^2}{\pi} \frac{\cos(n\phi)}{n} \times \tag{55}$$

$$\int_0^\infty k^2 K_n'(k\rho)D_n(k, R_p, R_s) \int_{-L_s}^{L_s} q_n^{(s)}(z')\cos(k(z-z'))dz'dk,$$

$$n \geq 1,$$

$$B_{n,\phi}^{tot(1)}(\vec{r}) = \frac{\mu_0 R_p^2}{\pi\rho} \sin(n\phi) \times \tag{56}$$

$$\int_0^\infty kK_n(k\rho)D_n(k, R_p, R_s) \int_{-L_s}^{L_s} q_n^{(s)}(z')\cos(k(z-z'))dz'dk,$$

$$n \geq 1,$$

and $$B_{0,\rho}^{tot(1)}(\vec{r}) = -\frac{\mu_0 R_s^2}{\pi} \frac{\cos(n\phi)}{n} \times \tag{57}$$

$$\int_0^\infty k^2 K_n'(k\rho)D_n(k, R_p, R_s) \int_{-L_s}^{L_s} q_n^{(s)}(z')\cos(k(z-z'))dz'dk,$$

$$n \geq 1,$$

where $$D_n(k, R_p, R_s) = I_n'(kR_s) - \frac{K_n'(kR_s)}{K_n'(kR_s)} I_n'(kR_p). \tag{58}$$

Equation (47) is the principal result of this section. The interior shielding conditions from equations (45) and (46) together with their consistency conditions lead to the complete cancellation of the magnetic field in the space inside the infinite cylinder coincident with the primary coil. Again, the field components inside this infinite cylinder all vanish reasonably rapidly in the z-direction as the distance increases from the ends of the coils.

Functional Analysis

A definite solution for the current distributions on the primary and secondary coils is obtained by posting an energy-like functional and incorporating the shielding constraints, along with other design constraints, in an extreme calculation.

I. Exterior Super Shielding of the Magnetic Field

The functional analysis begins with the introduction of an energy-like functional having the form:

$$W_g = \sum_{n=0}^{\infty} (W_{n,g}^{(-)} + W_{n,g}^{(+)}) \tag{59}$$

where $$W_{0,g}^{(\pm)} = \frac{\mu_0}{2} \int_0^{\infty} g(k) W_0(k, R_p, R_s) F_{0,L_p}^{(\pm)2}(k) dk, \tag{60}$$

$$W_0'(k, R_p, R_s) = -R_p^2 I_0'(kR_p) Q_0(k, R_p, R_s), \tag{61}$$

$$W_{n,g}^{(\pm)} = \frac{\mu_0}{2} \int_0^{\infty} g(k) W_n(k, R_p, R_s) Q_{n,L_p}^{(\pm)2}(k) dk, \tag{62}$$

and $$W_n'(k, R_p, R_s) = -\frac{R_p^4 k^2}{n^2} I_n'(kR_p) G_n(k, R_p, R_s), n \geq 1, \tag{63}$$

and where g(k) is a regularization function for controlling the energy and the current behavior and will be introduced later. This function grows sufficiently fast with k in order to eliminate singular currents at the edges of the coils. For g=1, on the other hand, the functional $W_g$ reduces to a Parseval's representation of the energy functional when the shielding conditions have been implemented. This takes the following form:

$$W_{g=1} = \frac{1}{2} \int \vec{J}(\vec{r}) \cdot \vec{A}(\vec{r}) d\vec{r} \tag{64}$$

The diagonal form (in the mode index η as well as in the symmetry index ±) of the functional $W_g$ represents the fact that, when the shielding conditions are imposed the mutual inductance between two coils with different mode indices and symmetry indices ±, is zero. Next, in order to minimize the energy, the minimum of the functional $W_g$ subject to the constraints imposed is found through the use of Lagrange multipliers. The constraints used in this variational principle are the shielding conditions from equations (23)–(24), its consistency conditions from equations (27)–(30), and desired values of the magnetic field at some predetermined points. The consistency conditions represented by equations (27)–(30) are replaced with their discretized versions as follows:

$$\frac{1}{\pi} \int_0^{\infty} F_{0,L_p}^{\pm}(k) \begin{pmatrix} \cos(k z_a^{(p)}) \\ \sin(k z_a^{(p)}) \end{pmatrix} dk = 0, a = 1, \ldots, N_p, |z_a^{(p)}| > L_p, \tag{65}$$

$$\frac{1}{\pi} \int_0^{\infty} F_{0,L_s}^{\pm}(k) \begin{pmatrix} \cos(k z_b^{(s)}) \\ \sin(k z_b^{(s)}) \end{pmatrix} dk = 0, b = 1, \ldots, N_s, |z_b^{(s)}| > L_p, \tag{66}$$

$$\frac{1}{\pi} \int_0^{\infty} Q_{n,L_p}^{\pm}(k) \begin{pmatrix} \cos(k z_a^{(p)}) \\ \sin(k z_a^{(p)}) \end{pmatrix} dk = 0, b = 1, \ldots, N_s, |z_b^{(p)}| \geq L_p, \tag{67}$$

and $$\frac{1}{\pi} \int_0^{\infty} Q_{n,L_s}^{\pm}(k) \begin{pmatrix} \cos(k z_b^{(s)}) \\ \sin(k z_b^{(s)}) \end{pmatrix} dk = 0, b = 1, \ldots, N_s, |z_b^{(s)}| \geq L_s \tag{68}$$

where $N_p$, $N_s$ are the number of points where the current densities vanish outside the primary and secondary coils (in the z direction). When $|Z_a^{(p)}| < L_p$ and $|Z_b^{(s)}| < L_s$ the expressions for the currents density can be obtained from equations (27)–(30) as follows:

$$f_0^{\pm,(p)}(z) = \frac{1}{\pi} \int_0^{\infty} F_{0,L_p}^{\pm}(k) \begin{pmatrix} \cos(kz) \\ \sin(kz) \end{pmatrix} dk, \tag{69}$$

$$f_0^{\pm,(s)}(z) = \frac{1}{\pi} \int_0^{\infty} F_{0,L_s}^{\pm}(k) \begin{pmatrix} \cos(kz) \\ \sin(kz) \end{pmatrix} dk, \tag{70}$$

$$q_n^{\pm,(p)}(z) = \frac{1}{\pi} \int_0^{\infty} Q_{n,L_p}^{\pm}(k) \begin{pmatrix} \cos(kz) \\ \sin(kz) \end{pmatrix} dk, \tag{71}$$

and $$q_n^{\pm,(s)}(z) = \frac{1}{\pi} \int_0^{\infty} Q_{n,L_s}^{\pm}(k) \begin{pmatrix} \cos(kz) \\ \sin(kz) \end{pmatrix} dk. \tag{72}$$

The corresponding constrained functionals that correspond to a particular mode is given by:

$$E_0^{(\pm)} = W_{0,g}^{(\pm)} - \mu_o \int_0^{\infty} \lambda_0^{\pm}(k) \left[ F_{0,L_s}^{(\pm)}(k) + \frac{R_p}{R_s} \frac{I_0'(kR_p)}{I_0'(kR_s)} F_{0,L_p}^{(\pm)}(k) \right] dk - \tag{73}$$

$$\sum_{j=1}^{N} \overline{\lambda}_{0j}^{\pm} \cdot [\overline{B}_0^{\pm}(\rho_j, \phi_j, z_j)|_{\rho_j < R_p} - \overline{B}_{0,j}^{target}] -$$

$$\mu_o \sum_{a=1}^{N_p} \lambda_{0,a}^{\pm(p)} \int_0^{\infty} F_{0,L_p}^{(\pm)}(k) \begin{pmatrix} \cos(k z_a^{(s)}) \\ \sin(k z_a^{(s)}) \end{pmatrix} dk -$$

$$\mu_o \sum_{b=1}^{N_s} \lambda_{0,b}^{\pm(s)} \int_0^{\infty} F_{0,L_s}^{(\pm)}(k) \begin{pmatrix} \cos(k z_b^{(s)}) \\ \sin(k z_b^{(s)}) \end{pmatrix} dk$$

and $$E_n^{(\pm)} = W_{n,g}^{(\pm)} - \mu_o \int_0^{\infty} k \lambda_n^{\pm}(k) \left[ Q_{n,L_s}^{(\pm)}(k) + \frac{R_p^2}{R_s^2} \frac{I_n'(kR_p)}{I_n'(kR_s)} Q_{n,L_p}^{(\pm)}(k) \right] dk - \tag{74}$$

$$\sum_{j=1}^{N} \overline{\lambda}_{nj}^{\pm} \cdot [\overline{B}_n^{\pm}(\rho_j, \phi_j, z_j)|_{\rho_j < R_p} - \overline{B}_{n,j}^{target}] -$$

$$\mu_o \sum_{a=1}^{N_p} \lambda_{n,a}^{\pm(p)} \int_0^{\infty} Q_{n,L_p}^{(\pm)}(k) \begin{pmatrix} \cos(k z_a^{(s)}) \\ \sin(k z_a^{(s)}) \end{pmatrix} dk -$$

$$\mu_o \sum_{b=1}^{N_s} \lambda_{n,b}^{\pm(s)} \int_0^{\infty} Q_{n,L_s}^{(\pm)}(k) \begin{pmatrix} \cos(k z_b^{(s)}) \\ \sin(k z_b^{(s)}) \end{pmatrix} dk$$

where $\lambda_\eta^\pm(k)$ are Lagrange multipliers for the shielding conditions from equations (23), (24), $\lambda_{\eta,a}^{i(p)}$ and $\lambda_{\eta,b}^{i(s)}$ are the Lagrange multipliers for the points in the consistency conditions represented by equations (27) and (28), and equations (29) and (30) respectively, $\overline{B}_{n,j}^{target}$ are the field constraints, and $\overline{\lambda}_{n,j}^\pm$ are their Lagrange multipliers. The variational principle for each mode of the functional $E_\eta^i$ is given by:

$$\frac{\delta E_0^\pm}{\delta F_{0,L_p}^\pm(k)} = 0, \frac{\delta E_0^\pm}{\delta F_{0,L_s}^\pm(k)} = 0, \frac{\delta E_0^\pm}{\delta \lambda_0^\pm(k)} = 0, \tag{75}$$

$$\frac{\partial E_0^\pm}{\partial \overline{\lambda}_{0,j}^\pm} = 0, \frac{\partial E_0^\pm}{\partial \lambda_{0,a}^{\pm(p)}} = 0, \frac{\partial E_0^\pm}{\partial \lambda_{0,a}^{\pm(s)}} = 0, \tag{76}$$

$$\frac{\delta E_n^\pm}{\delta Q_{n,L_p}^\pm(k)} = 0, \frac{\delta E_n^\pm}{\delta Q_{n,L_s}^\pm(k)} = 0, \frac{\delta E_n^\pm}{\delta \lambda_n^\pm(k)} = 0, , n \geq 1, \tag{77}$$

and

-continued $$\frac{\partial E_n^{\pm}}{\partial \overline{\lambda}_{n,j}^{\pm}} = 0, \quad \frac{\partial E_n^{\pm}}{\partial \lambda_{n,a}^{\pm(p)}} = 0, \quad \frac{\partial E_n^{\pm}}{\partial \lambda_{n,a}^{\pm(s)}} = 0, \quad n \geq 1, \tag{78}$$

which leads to the expressions for the Fourier transforms of the current densities in terms of the Lagrange multipliers $\overline{\lambda}_{\eta,j}^{\pm}, \lambda_{\eta,a}^{\pm(p)}, \lambda_{\eta,b}^{\pm(s)}$ as follows:

$$F_{0,L_p}^{\pm}(k) = \tag{79}$$

$$\sum_{j=1}^{N} (\mu_o)^{-1} \left( \frac{\delta \overline{B}_0^{\pm}(\rho_j, \phi_j, z_j)|_{\rho_j < R_p}}{\delta F_{0,L_p}^{\pm}(k)} \middle/ g(k) W_0^{\pm}(k, R_p, R_s) \right) \cdot \overline{\lambda}_{0,j}^{\pm} +$$

$$\sum_{a=1}^{N_p} \frac{\begin{pmatrix} \cos(k\mathcal{Z}_a^{(p)}) \\ \sin(k\mathcal{Z}_a^{(p)}) \end{pmatrix}}{g(k) W_0^{\pm}(k, R_p, R_s)} \lambda_{0,a}^{\pm(p)} -$$

$$\frac{R_p}{R_s} \frac{I_0'(kR_p)}{I_0'(kR_s)} \sum_{b=1}^{N_s} \frac{\begin{pmatrix} \cos(k\mathcal{Z}_b^{(s)}) \\ \sin(k\mathcal{Z}_b^{(s)}) \end{pmatrix}}{g(k) W_0^{\pm}(k, R_p, R_s)} \lambda_{0,b}^{\pm(s)}$$

and $$F_{0,L_s}^{\pm}(k) = -\frac{R_p}{R_s} \frac{I_0'(kR_p)}{I_0'(kR_s)} F_{0,L_p}^{\pm}(k) \tag{80}$$

for axial coils, and $$Q_{n,L_p}^{\pm}(k) = \tag{81}$$

$$\sum_{j=1}^{N} (\mu_o)^{-1} \left( \frac{\delta \overline{B}_n^{\pm}(\rho_j, \phi_j, z_j)|_{\rho_j < R_p}}{\delta F_{n,L_p}^{\pm}(k)} \middle/ g(k) W_n^{\pm}(k, R_p, R_s) \right) \cdot \overline{\lambda}_{n,j}^{\pm} +$$

$$\sum_{a=1}^{N_p} \frac{\begin{pmatrix} \cos(k\mathcal{Z}_a^{(p)}) \\ \sin(k\mathcal{Z}_a^{(p)}) \end{pmatrix}}{g(k) W_n^{\pm}(k, R_p, R_s)} \lambda_{n,a}^{\pm(p)} -$$

$$\frac{R_p^2}{R_s^2} \frac{I_n'(kR_p)}{I_n'(kR_s)} \sum_{b=1}^{N_s} \frac{\begin{pmatrix} \cos(k\mathcal{Z}_b^{(s)}) \\ \sin(k\mathcal{Z}_b^{(s)}) \end{pmatrix}}{g(k) W_n^{\pm}(k, R_p, R_s)} \lambda_{n,b}^{\pm(s)}$$

and $$Q_{n,L_s}^{\pm}(k) = -\frac{R_p^2}{R_s^2} \frac{I_n'(kR_p)}{I_n'(kR_s)} Q_{n,L_p}^{\pm}(k), \quad n \geq 1 \tag{82}$$

for transverse coils.

Using the properties of the Bessel function, in order for the functional $W_g$ to be finite, the function $g(k)$ grows as $k \to \infty$. One possible choice for the function $g(k)$ is:

$$g(k) = \exp(k\gamma(R_s - R_p)) \tag{83}$$

where $\gamma$ is a positive constant parameter.

Substituting the expressions from equations (80)–(82) into equations (76) and (78) the following system of algebraic equations for the Lagrange multipliers is obtained:

$$\sum_{l=1}^{\mathcal{N}} Z_{pl,n}^{\pm} \Lambda_{l,n}^{\pm} = Q_{p,n}^{\pm}, \quad \mathcal{N} = N + N_p + N_s \tag{84}$$

where $$\Lambda_{l,n}^{\pm} = \begin{pmatrix} \overrightarrow{\lambda}_{n,j}^{\pm} \\ \lambda_{n,a}^{\pm(p)} \\ \lambda_{n,b}^{\pm(s)} \end{pmatrix}, \quad Q_{p,n}^{\pm} = \begin{pmatrix} \mu_o^{-1} \overrightarrow{B}_{n,j}^{target} \\ 0 \\ 0 \end{pmatrix} \tag{85}$$

and $$-Z_{pl,n}^{\pm} = \begin{pmatrix} C_{ij,n}^{\pm} & A_{ia,n}^{\pm} & B_{ib,n}^{\pm} \\ D_{a_1 j,n}^{\pm} & E_{a_1 a,n}^{\pm} & F_{a_1 b,n}^{\pm} \\ G_{b_1 j,n}^{\pm} & N_{b_1 a,n}^{\pm} & M_{b_1 b,n}^{\pm} \end{pmatrix}, \quad n \geq 0 \tag{86}$$

and where the matrices involved here are expressed through the integrals over k. Assuming that the matrix $Z_{pl,\eta}^{-1}$ is not degenerate, the Lagrange multipliers are found in the following form:

$$\Lambda_{l,n}^{\pm} = \sum_{p=1}^{\mathcal{N}} (Z_n^{-1})_{lp}^{\pm} Q_{p,n}^{\pm}. \tag{87}$$

Once the Lagrange multipliers $\Lambda_{l,\eta}^{\pm}$ are found, the expressions for the Fourier transforms $F_{0,L_p(L_s)}^{\pm}(k)$ and $Q_{n,L_p(L_s)}^{\pm}(k)$ are obtained using the equations (80)–(82). Then the equations (69)–(72) define those current distributions on both coils that lead to the exterior super shielding effect represented by equation (43).

II. Interior Super Shielding of the Magnetic Field

Next, the extremum calculation for the interior super shielding of the magnetic field is addressed. The energy-like functional considered in this case is $$W_g = \sum_{n=0}^{\infty} (W_{n,g}^{(-)} + W_{n,g}^{(+)}) \tag{88}$$

where $$W_{0,g}^{(\pm)} = \frac{\mu_0}{2} \int_0^{\infty} g(k) W_0(k, R_p, R_s) F_{0,L_s}^{(\pm)2}(k) \, dk, \tag{89}$$

$$W_0(k, R_p, R_s) = -R_s^2 K_0'(kR_s) D_0(k, R_p, R_s), \tag{90}$$

$$W_{n,g}^{(\pm)} = \frac{\mu_0}{2} \int_0^{\infty} g(k) W_n(k, R_p, R_s) Q_{n,L_s}^{(\pm)2}(k) \, dk, \tag{91}$$

and $$W_n(k, R_p, R_s) = -\frac{R_s^4 k^2}{n^2} K_n'(kR_s) D_n(k, R_p, R_s), \quad n \geq 1, \tag{92}$$

and where $g(k)$ is the same function that was introduced in the previous section.

The constrained functionals $E_\eta^{(i)}$ have the same form as in equations (73) and (74) where exterior super shielding conditions from equations (23) and (24) are replaced by the interior super shielding conditions from equations (45) and (46), respectively.

SUPER SHIELDING OF THE ELECTRIC FIELD

I. Electric Field

First, consider a charge distribution $\sigma(\overline{r})$ on a cylinder having a radius R and total length 2L. A Fourier series representation follows from the periodicity in $\phi$ and therefore $$\sigma(\vec{r}) = \sum_{n=0}^{\infty} (\sigma_n(z)\cos(n\phi) + \kappa_n(z)\sin(n\phi)) \qquad (93)$$

where $\sigma_n(z)$ and $k_n(z)$ are arbitrary functions of z. The end-condition is that there can be an abrupt change in the charge density, yielding $$\sigma_\eta(|z|>L) = k_\eta(|z|>L) = 0 \qquad (94).$$

The scalar potential of the electric field is defined as $$\Phi(\vec{r}) = \frac{1}{4\pi\epsilon_o} \int G(\vec{r},\vec{r}')\sigma(\vec{r}')d\vec{r}' \qquad (95)$$

where the Green function $G(\vec{r},\vec{r}^1)$ is given by equation (11). Then the scalar potential can be written as $$\Phi(\vec{r}) = \sum_{i=1}^{2} \sum_{n=0}^{\infty} \Phi_n^{(i)}(\vec{r}) \qquad (96)$$

where $$\Phi_n^{(1)}(\vec{r}) = \frac{R}{\pi\epsilon_o}\cos(n\phi)\int_0^\infty T_n(k,\rho,R)\int_{-L}^{L}\sigma_n(z')\cos(k(z-z'))dz'\,dk \qquad (97)$$

and $$\Phi_n^{(2)}(\vec{r}) = \frac{R}{\pi\epsilon_o}\sin(n\phi)\int_0^\infty T_n(k,\rho,R)\int_{-L}^{L}\kappa_n(z')\cos(k(z-z'))dz'\,dk \qquad (98)$$

and where the function $T_\eta(k,\rho,R)$ is defined in equation (12). Then the electric field is given by $$\vec{E}(\vec{r}) = \sum_{i=1}^{2}\sum_{n=0}^{\infty} \vec{E}_n^{(i)}(\vec{r}) \qquad (99)$$

where $$\vec{E}_n^{(i)}(\vec{r}) = -\vec{\nabla}\Phi_n^{(i)}(\vec{r}), \qquad (100)$$

in terms of the cylindrical coordinates can be presented in the following form (for each mode $\eta$):

$$E_{n,\rho}^{(1)}(\vec{r}) = \qquad (101)$$
$$-\frac{R}{\pi\epsilon_o}\cos(n\phi)\int_0^\infty kT_n'(k,\rho,R)\int_{-L}^L \sigma_n(z')\cos(k(z-z'))dz'\,dk,$$

$$E_{n,\phi}^{(1)}(\vec{r}) = \qquad (102)$$
$$\frac{R}{\pi\epsilon_o \rho}n\sin(n\phi)\int_0^\infty kT_n(k,\rho,R)\int_{-L}^L \sigma_n(z')\cos(k(z-z'))dz'\,dk,$$

and $$E_{n,z}^{(1)}(\vec{r}) = \frac{R}{\pi\epsilon_o}\cos(n\phi)\int_0^\infty kT_n(k,\rho,R)\int_{-L}^L \sigma_n(z')\sin(k(z-z'))dz'\,dk \qquad (103)$$

where $$T_n'(k,\rho,R) = \theta(\rho-R)I_n(kR)K_n'(k\rho) + \theta'(R-\rho)I_n'(k\rho)K_n(kR). \qquad (104)$$

The expressions for $\vec{E}_\eta^{(2)}(\vec{r})$ is obtained from equations (101)–(103) by the following substitutions:

$$\cos(\eta\phi)\to\sin(\eta\phi),\ \sin(\eta\phi)\to-\cos(\eta\phi),\ \sigma_\eta(z)\to k_\eta(z) \qquad (105).$$

To shield the system, consider two coaxial cylinders of arbitrary radii, $R_p$ for the inner cylinder or primary structure and $R_s$ for the outer cylinder or secondary structure, and arbitrary lengths of these cylinders, $2L_p$ and $2L_s$ respectively. On each cylinder, the charge distribution has the form given by equation (93). The total electric field then is a vector sum of the electric fields that correspond to that of the primary and secondary structures. In what follows all quantities that correspond to the primary structure will be labeled by an index 'p', while all quantities that correspond to the secondary structure will be labeled by an index 's'.

II. Exterior Super Shielding of the Electric Field

For excellent shielding of the electric field outside the secondary structure, the boundary conditions for the total electric field are that the tangential components of the total electric field vanish on the surface of the secondary structure, which is analytically represented as follows:

$$E_{\eta,\phi}^{tot,(1)}(\vec{r})|_{\rho=R_s} = E_{\eta,z}^{tot,(1)}(\vec{r})|_{\rho=R_s} = 0, \rho \geq 0 \qquad (106).$$

A sufficient condition satisfying this equation is [for simplicity herein, in what follows only the electric field labeled by the index i=1 is considered; the corresponding expressions for the electric field labeled by the index i=2 are obtained using the substitutions of equation (105)]:

$$\sum_{n,L_s}^{\pm}(k) + \frac{R_p}{R_s}\frac{I_n(kR_p)}{I_n(kR_s)}\sum_{n,L_p}^{\pm}(k) = 0 \qquad (107)$$

where $$\sum_{n,L}^{\pm}(k) = \int_{-L}^{L}\sigma_n^{\pm}(z)\binom{\cos(kz)}{\sin(kz)}dz \qquad (108)$$

and the sign '+' refers to an even function of z and the sign '−' refers to an odd function of z. The full implications of these conditions determine those charge densities on both coils that satisfy the boundary condition from equation (106).

An inverse Fourier transform of equation (107) together with the definitions from equation (108) lead to two types of additional consistency conditions.

$$\frac{1}{\pi}\int_0^\infty \sum_{n,L_p}^{\pm}(k)\binom{\cos(kz)}{\sin(kz)}dk = \theta(L_p - |z|)\sigma_n^{\pm,(p)}(z) \qquad (109)$$

and $$\frac{1}{\pi}\int_0^\infty \sum_{n,L_s}^{\pm}(k)\binom{\cos(kz)}{\sin(kz)}dk = \theta(L_s - |z|)\sigma_n^{\pm,(s)}(z) \qquad (110)$$

where $$\sigma_n^{\pm,(p,s)}(z) = \frac{1}{2}(\sigma_n^{(p,s)}(z) \pm \sigma_n^{(p,s)}(-z)). \qquad (111)$$

When $|z|>L_p$ the equation (109) represents some constraint for the charge density on the primary structure. When $|z|>L_s$ the equation (110) represents some constraint for the current density on the secondary structure. These consistency conditions represent the fact that the charge does not exist off the ends of the structures. That is to say, the charge densities are confined to finite cylinders.

For exterior shielding, the sufficiency condition (107) plus the consistency conditions (109)–(110) constitute the super-shielding set of equations. By an inverse Fourier transform of (107), subject to (109)–(110), and an application of the Fourier convolution theorem, the supershielding set of equations is found to be equivalent to $$\Theta(L_s - |z|)\sigma_n^{\pm,(s)}(z) + \frac{1}{\pi}\int_{-L_p}^{L_p} r_e(z-y)\sigma_n^{\pm,(p)}(y)dy = 0 \qquad (107a)$$

where $$r_e(z-y) = \int_0^\infty R_e(k)\cos k(z-y)dk \qquad (107b)$$

which is the Fourier transform of the coefficient in (107)

$$R_e(k) = \frac{R_p}{R_s}\frac{I_n(kR_p)}{I_n(kR_s)}. \qquad (107c)$$

The shielding conditions from equation (107) are now used to write the expressions for all components of the total electric field. Inside an infinite cylinder with a radius given by that of the primary structure radius (i.e. $\rho<R_p$), the following is obtained:

$$E_{n,\rho}^{tot,(1)} = -\frac{R_p}{\pi\epsilon_o}\cos(n\phi) \qquad (112)$$

$$\int_0^\infty k I_n'(k\rho) M_n(k, R_p, R_s) \int_{-L_p}^{L_p} \sigma^{(p)}(z')\cos(k(z-z'))\,dz'\,dk,$$

$$E_{n,\phi}^{tot,(1)} = \frac{R_p}{\pi\epsilon_o\rho}\sin(n\phi) \qquad (113)$$

$$\int_0^\infty I_n(k\rho) M_n(k, R_p, R_s) \int_{-L_p}^{L_p} \sigma^{(p)}(z')\cos(k(z-z'))\,dz'\,dk,$$

and $$E_{n,z}^{tot,(1)} = \frac{R_p}{\pi\epsilon_o}\cos(n\phi) \qquad (114)$$

$$\int_0^\infty k I_n(k\rho) M_n(k, R_p, R_s) \int_{-L_p}^{L_p} \sigma^{(p)}(z')\sin(k(z-z'))\,dz'\,dk,$$

where $$M_n(k, R_p, R_s) = K_n(kR_p) - \frac{I_n(kR_p)}{I_n(kR_s)} K_n(kR_s). \qquad (115)$$

In the region between two cylinders having infinite lengths and whose radii are the same as those of the primary and secondary structures (i.e. $R_p<\rho<R_s$), the expressions for all components of the total electric field are $$E_{n,\rho}^{tot,(1)} = \qquad (116)$$

$$-\frac{R_p}{\pi\epsilon_o}\cos(n\phi)\int_0^\infty k\frac{I_n(kR_p)}{I_n(kR_s)} \times \{K_n'(k\rho)I_n(kR_s) - I_n'(k\rho)K_n(kR_s)\}$$

$$\int_{-L_p}^{L_p} \sigma^{(p)}(z')\cos(k(z-z'))dz'dk,$$

$$E_{n,\phi}^{tot,(1)} = \qquad (117)$$

$$\frac{R_p}{\pi\epsilon_o\rho}\cos(n\phi)\int_0^\infty \frac{I_n(kR_p)}{I_n(kR_s)} \times \{K_n(k\rho)I_n(kR_s) - I_n(k\rho)K_n(kR_s)\}$$

$$\int_{-L_p}^{L_p} \sigma^{(p)}(z')\sin(k(z-z'))dz'dk,$$

and

-continued $$E_{n,z}^{tot,(1)} = \qquad (118)$$

$$-\frac{R_p}{\pi\epsilon_o}\sin(n\phi)\int_0^\infty k\frac{I_n(kR_p)}{I_n(kR_s)} \times \{K_n(k\rho)I_n(kR_s) - I_n(k\rho)K_n(kR_s)\}$$

$$\int_{-L_p}^{L_p} \sigma^{(p)}(z')\cos(k(z-z'))dz'dk.$$

In the region outside an infinite cylinder whose radius is the same as that of the secondary structure (i.e. $\rho>R_s$), the total electric field exactly vanishes, which is expressed as follows:

$$E_{n,\rho}^{tot,(1)}(\bar{r}) = E_{n,\phi}^{tot,(1)}(\bar{r}) = E_{n,z}^{tot,(1)}(\bar{r}) = 0 \qquad (119).$$

Equation (119) is the principal result of this section. The shielding condition from equation (107) leads to the complete cancellation of the electric field in the space outside the infinite cylinder coincident with the secondary structure. Moreover, the field components inside this infinite cylinder all vanish reasonably rapidly in the z-direction as the distance increases from the ends of the structures.

III. Interior Super Shielding of the Electric Field

For excellent shielding of the electric field inside the primary structure, the following boundary conditions are used for the total electric field:

$$E_{n,\phi}^{tot}(\bar{r})|_{\rho=R_p} = E_{n,z}^{tot}(\bar{r})|_{\rho=R_p} 0, n \geq 0 \qquad (120)$$

which constrains the total electric field such that tangential components thereof vanish at the surface of the primary structure. A sufficient condition satisfying this equation is [again for simplicity herein, in what follows, only the electric field labeled by the index i=1 is considered; the corresponding expressions for the electric field labeled by the index i=2 are obtained using the substitutions from equation (105)]:

$$\sum_{n,L_p}^{\pm}(k) + \frac{R_s}{R_p}\frac{K_n(kR_s)}{K_n(kR_p)}\sum_{n,L_s}^{\pm}(k) = 0. \qquad (121)$$

The consistency conditions of this equation have exactly the same form as equations (109) and (110).

For interior shielding, the sufficiency condition (121) plus the consistency conditions of the same form as (109)–(110) constitute the supershielding set of equations. By an inverse Fourier transform of (121), subject to the consistency conditions, and an application of the Fourier convolution theorem, the supershielding set of equations is found to be equivalent to $$\Theta(L_p - |z|)\sigma_n^{\pm,(p)}(z) + \frac{1}{\pi}\int_{-L_s}^{L_s} r_i(z-y)\sigma_n^{\pm,(s)}(y)dy = 0 \qquad (121a)$$

where $$r_i(z-y) = \int_0^\infty R_i(k)\cos k(z-y)dk \qquad (121b)$$

which is the Fourier transform of the coefficient in (121)

$$R_i(k) = \frac{R_s}{R_p}\frac{K_n(kR_s)}{K_n(kR_p)}. \qquad (121c)$$

The interior shielding condition from equation (121) is now used to write the expressions for all components of the total electric field. Inside the infinite cylinder with a radius given by the primary structure radius (i.e. $\rho<R_\rho$), the total electric field exactly vanishes, which is represented by the following:

$$E_{\eta,\rho}^{tot,(1)}(\vec{r})=E_{\eta,\phi}^{tot,(1)}(\vec{r})=E_{\eta,z}^{tot,(1)}(\vec{r})=0 \qquad (122).$$

In an infinite region between infinitely long cylinders whose radii are the same as those of the primary and secondary structures (i.e. $R_\rho<\rho<R_s$), the expressions for all components of the total electric field are $$E_{n,\rho}^{tot,(1)} = \qquad (123)$$
$$-\frac{R_s}{\pi\epsilon_o}\cos(n\phi)\int_0^\infty k\frac{K_n(kR_s)}{K_n(kR_p)} \times \{I_n'(k\rho)K_n(kR_p) - K_n'(k\rho)I_n(kR_p)\}$$
$$\int_{L_s}^{L_s} \sigma^{(s)}(z')\cos(k(z-z'))dz'dk,$$

$$E_{n,\phi}^{tot,(1)} = \qquad (124)$$
$$\frac{R_s}{\pi\epsilon_o\rho}\sin(n\phi)\int_0^\infty \frac{K_n(kR_s)}{K_n(kR_p)} \times \{I_n(k\rho)K_n(kR_p) - K_n(k\rho)I_n(kR_p)\}$$
$$\int_{L_s}^{L_s} \sigma^{(s)}(z')\cos(k(z-z'))dz'dk,$$

and $$E_{n,z}^{tot,(1)} = \qquad (125)$$
$$-\frac{R_s}{\pi\epsilon_o}\cos(n\phi)\int_0^\infty \frac{K_n(kR_s)}{K_n(kR_p)} \times \{I_n(k\rho)K_n(kR_p) - K_n(k\rho)I_n(kR_p)\}$$
$$\int_{L_s}^{L_s} \sigma^{(s)}(z')\sin(k(z-z'))dz'dk.$$

In the region outside the infinite cylinder whose radius is the same as that of the secondary structure (i.e. $\rho>R_s$), all components of the total electric field are found to be $$E_{n,\rho}^{tot,(1)} = -\frac{R_s}{\pi\epsilon_o}\cos(n\phi) \qquad (126)$$
$$\int_0^\infty kK_n'(k\rho)E_n(k,R_p,R_s)\int_{L_s}^{L_s} \sigma^{(s)}(z')\cos(k(z-z'))dz'dk,$$

$$E_{n,\phi}^{tot,(1)} = \frac{R_p}{\pi\epsilon_o\rho}\sin(n\phi) \qquad (127)$$
$$\int_0^\infty K_n(k\rho)E_n(k,R_p,R_s)\int_{L_s}^{L_s} \sigma^{(s)}(z')\cos(k(z-z'))dz'dk,$$

and $$E_{n,z}^{tot,(1)} = -\frac{R_s}{\pi\epsilon_o}\cos(n\phi) \qquad (128)$$
$$\int_0^\infty K_n(k\rho)E_n(k,R_p,R_s)\int_{L_s}^{L_s} \sigma^{(s)}(z')\sin(k(z-z'))dz'dk$$

where $$E_n(k,R_p,R_s) = I_n(kR_s) - \frac{K_n(kR_s)}{K_n(kR_p)}I_n(kR_p). \qquad (129)$$

Equation (122) is the principal result of this section. The shielding condition from equation (121) and its consistency condition have led to the complete cancellation of the electric field in the space inside the infinite cylinder coincident with the primary structure. Again, the field components inside this infinite cylinder all vanish reasonably rapidly in the z-direction as the distance increases from the ends of the structures.

Functional Analysis

A definite solution for the charge distributions on the primary and secondary structures are obtained by posting an energy-like functional and incorporating the shielding constrains, along with other design constraints, in an extremum calculation.

I. Exterior Super Shielding of the Electric Field

In this case, the energy-like functional introduced take the form:

$$W_g = \sum_{n=0}^\infty (W_{n,g}^{(-)} + W_{n,g}^{(+)}) \qquad (130)$$

where $$W_{n,g}^{(\pm)} = \frac{1}{2\epsilon_o}\int_0^\infty g(k)W_n(k,R_p,R_s)\sum_{n,L_p}^{(\pm)2}(k)dk \qquad (131)$$

and $$W_n(k,R_p,R_s) = R_p^2 I_n(kR_p)M_n(k,R_p,R_s) \qquad (132)$$

and where $g(k)$ is a regularization function for controlling the energy and the current behavior. For $g=1$, on the other hand, the functional $W_g$ reduces to a Parseval's representation of the energy functional when the shielding conditions have been implemented. This is represented as follows:

$$W_{g=1} = \tfrac{1}{2}\int \sigma(\vec{r})\phi(\vec{r})d\vec{r} \qquad (133).$$

To find those current distributions that lead to the exterior super shielding of the electric field, the same constraint functional technique that was used for exterior super shielding of the magnetic field is used. The constraints are the exterior shielding constraints from equation (107), its consistency conditions, and the desired values of the electric field at some particular points.

II. Interior super Shielding of the Electric Field

In this case the introduced energy-like functional takes the form:

$$W_g = \sum_{n=0}^\infty (W_{n,g}^{(-)} + W_{n,g}^{(+)}) \qquad (134)$$

where $$W_{n,g}^{(\pm)} = \frac{1}{2\epsilon_o}\int_0^\infty g(k)W_n(k,R_p,R_s)\sum_{n,L_s}^{(\pm)2}(k)dk \qquad (135)$$

and $$W_n(k,R_p,R_s) = R_s^2 K_n(kR_p)E_n(k,R_p,R_s) \qquad (136)$$

and where $g(k)$ is a regularization function for controlling the energy and the current behavior. For $g=1$, on the other hand, the functional $W_g$ reduces to a Parseval's representation of the energy functional when the shielding conditions have been implemented. Again, this takes the form:

$$W_{g=1} = \tfrac{1}{2}\int \sigma(\vec{r})\Phi(\vec{r})d\vec{r} \qquad (137).$$

To find those charge distributions that lead to the interior super shielding of the electric field, the same constraint functional technique that was used for interior super shielding of the magnetic field is used. The constraints are the interior shielding constraints from equation (121), its consistency conditions, and the desired values of the electric field at some particular points.

EXAMPLES OF THE SUPER SHIELDING FOR THE MAGNETIC FIELD

I. $B_0$ Coil Example

In order to illustrate the method described above, consider the super shielding for the magnetic field produced by a azimuthally symmetric coil system. In this case, as it was mentioned previously, only the term $\bar{J}_0(z)$ with an even function $f_0(z)$ is employed. The geometrical dimensions of the primary coil 60 are $R_p=0.3528$ m for the radius and $2L_p=1.1$ m for the total length, while for the secondary coil 62 has a radius $R_s=0.417151$ m and $2L_s=1.1$ m for the total length. Only one constraint, set out in table 1 below, is imposed for the $B_z$ component of the magnetic field.

TABLE 1

| ρ (in m) | φ (in rad) | z (in m) | $B_z$ (in mT) |
|---|---|---|---|
| 0.000 | 0.000 | 0.00 | 1.87 |

Six constraint points for the $J_\phi$-components of the current densities outside the primary and secondary coils, set out in tables 2 and 3 respectively, are used in order to satisfy the consistency conditions.

TABLE 2

| ρ = $R_p$ (in m) | z (in m) | $J_\phi^p$ (in A/m) |
|---|---|---|
| 0.3528 | 0.5709 | 0.0 |
| 0.3528 | 0.5918 | 0.0 |
| 0.3528 | 0.6127 | 0.0 |
| 0.3528 | 0.6336 | 0.0 |
| 0.3528 | 0.6545 | 0.0 |
| 0.3528 | 0.6754 | 0.0 |

TABLE 3

| ρ = $R_s$ (in m) | z (in m) | $J_\phi^s$ (in A/m) |
|---|---|---|
| 0.417151 | 0.5709 | 0.0 |
| 0.417151 | 0.5918 | 0.0 |
| 0.417151 | 0.6127 | 0.0 |
| 0.417151 | 0.6336 | 0.0 |
| 0.417151 | 0.6545 | 0.0 |
| 0.417151 | 0.6754 | 0.0 |

Figure 2:
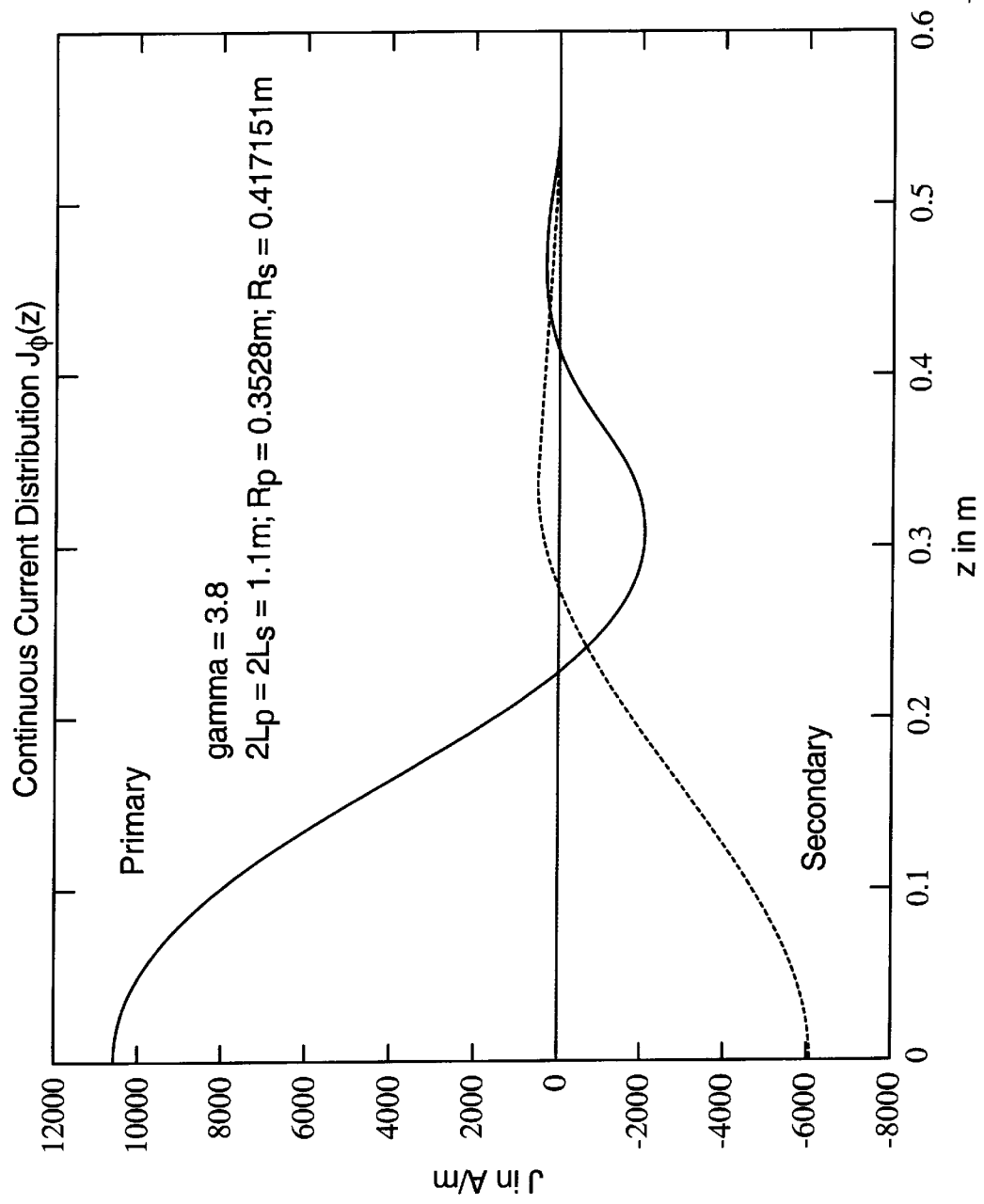
FIG. 2 is a graph showing $J_\phi$ components of a current density on primary and secondary coils in accordance with aspects of the present invention.
Figure 3:
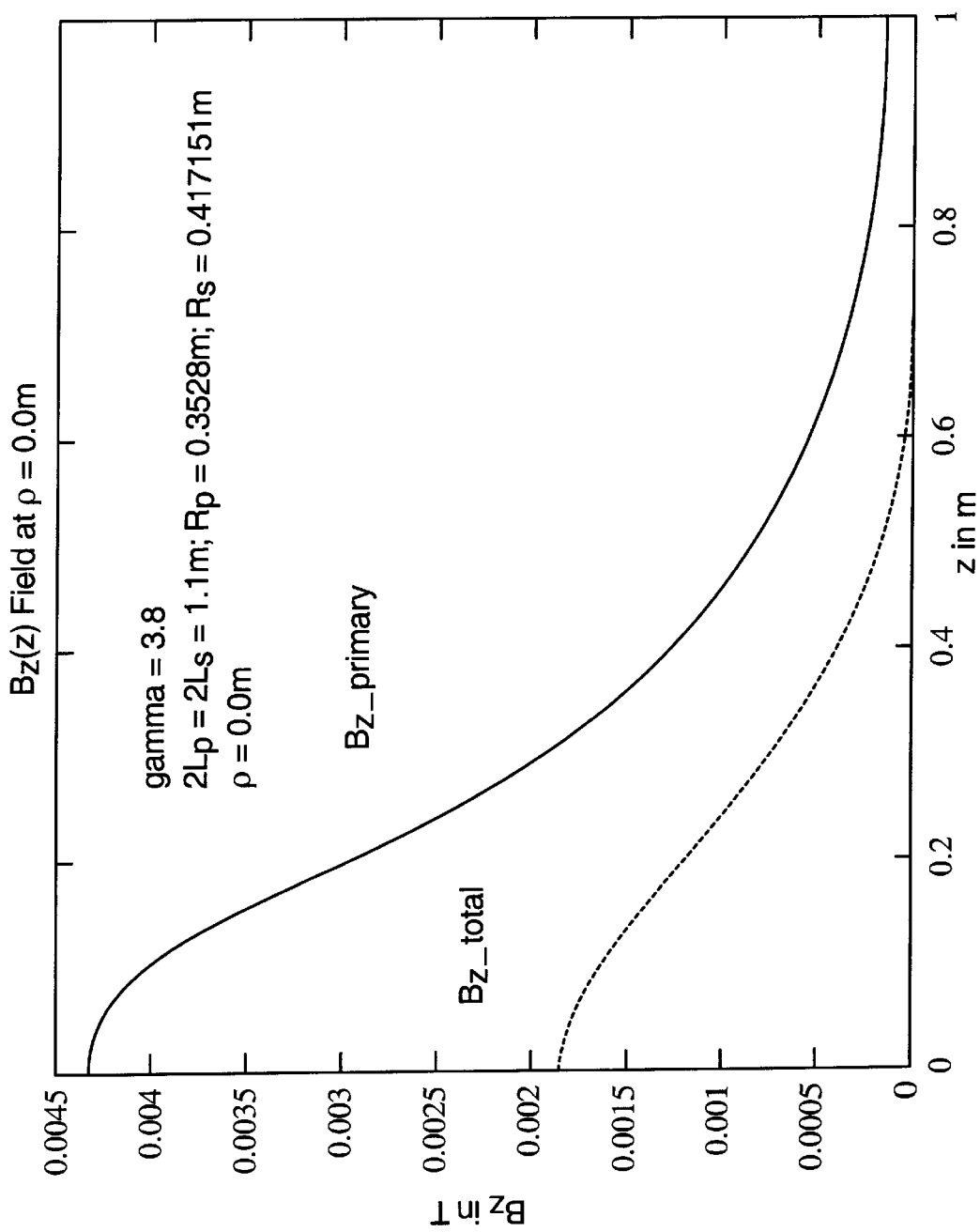
FIG. 3 is a graph showing in the z direction the behavior of the $B_z$ component of the magnetic field from the primary coil in comparison with the total magnetic field at a radial distance $\rho=0.0$ m in accordance with aspects of the present invention.
Figure 4A:
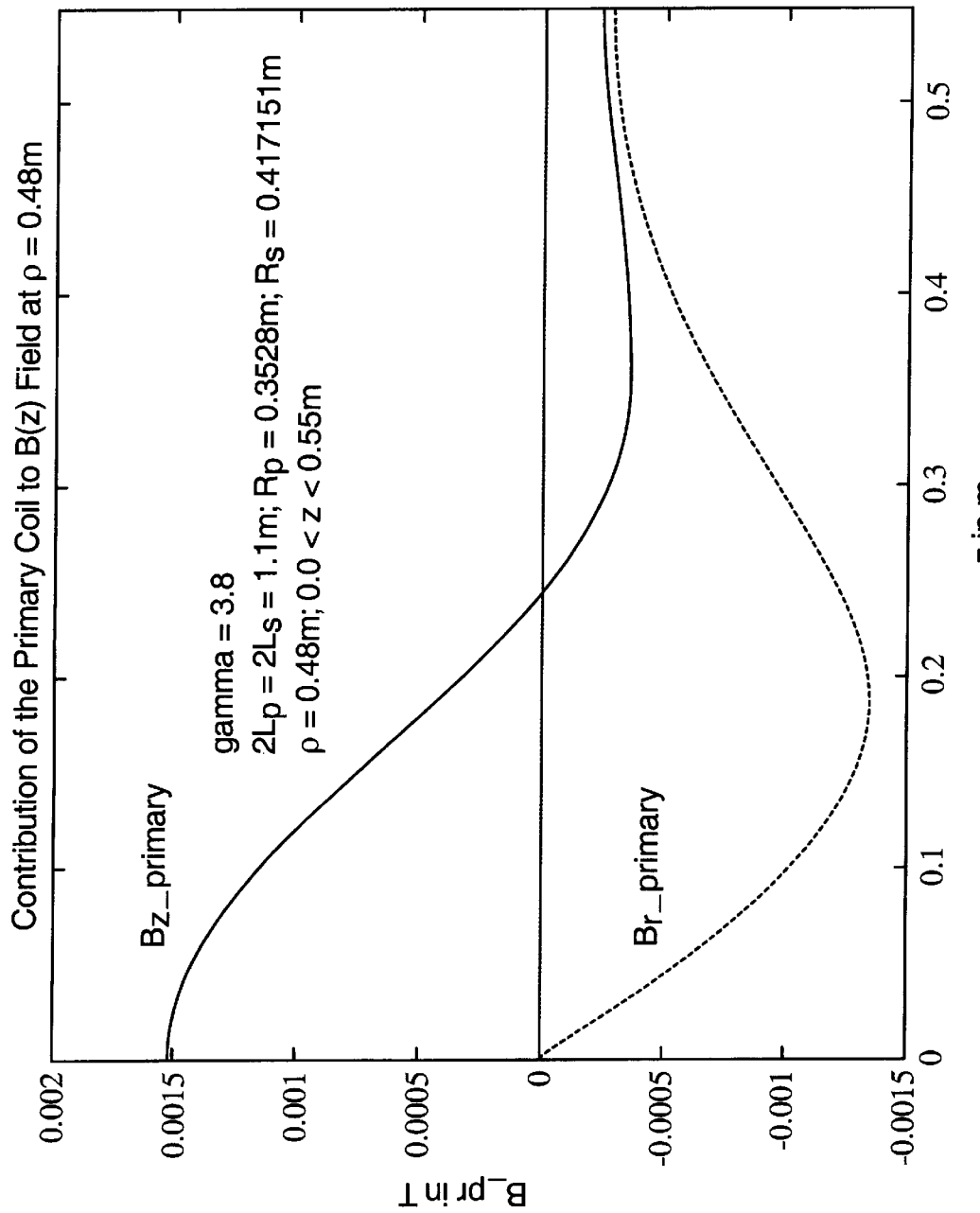
FIG. 4A is a graph showing the magnetic field from the primary coil as a function of z at $\rho=0.48$ m in the region 0.0 m<z<0.55 m in accordance with aspects of the present invention.
Figure 5A:
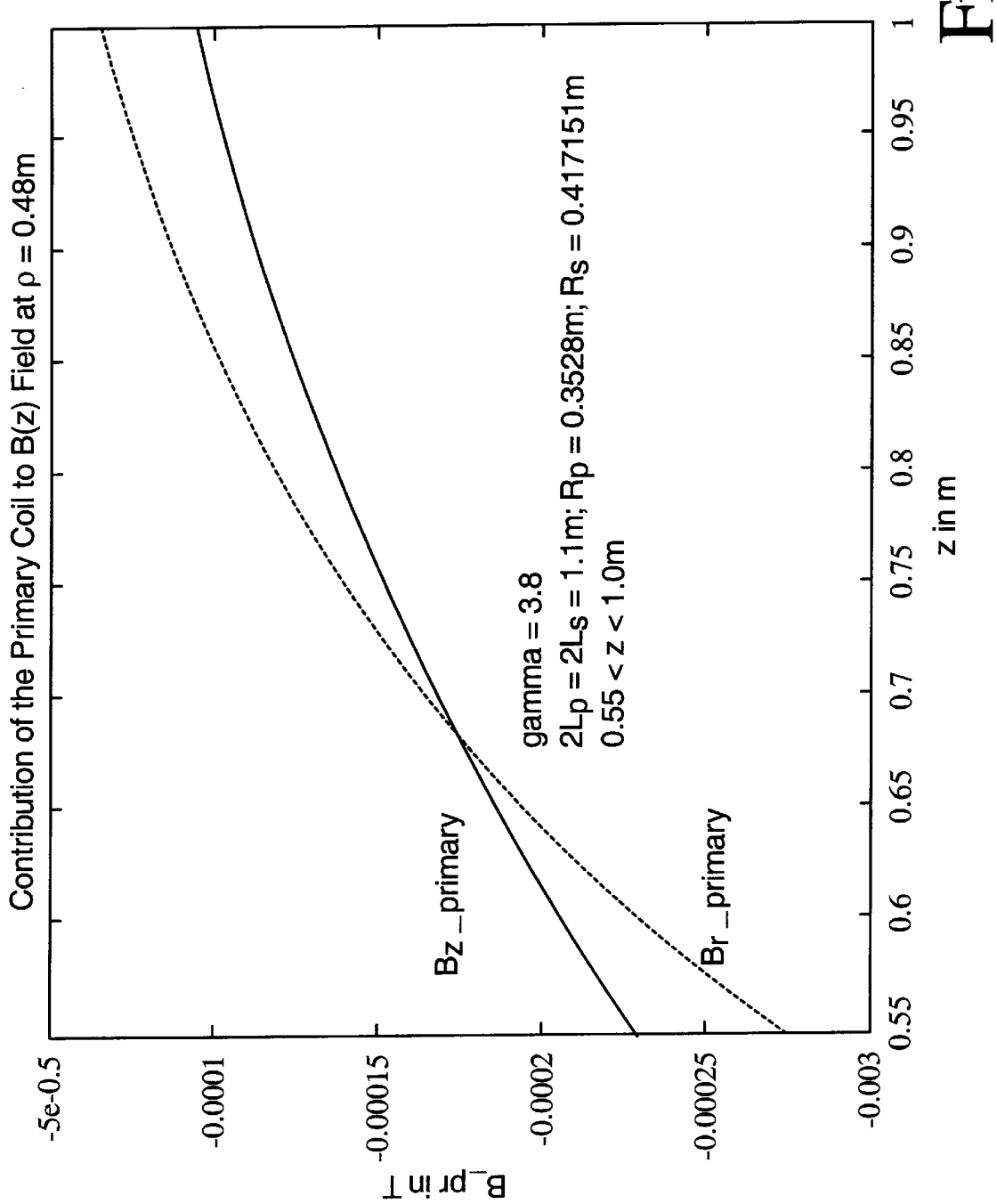
FIG. 5A is a graph showing the magnetic field from the primary coil as a function of z at $\rho=0.48$ m in the region 0.55 m<z <1.0 m in accordance with aspects of the present invention.
Figure 5B:
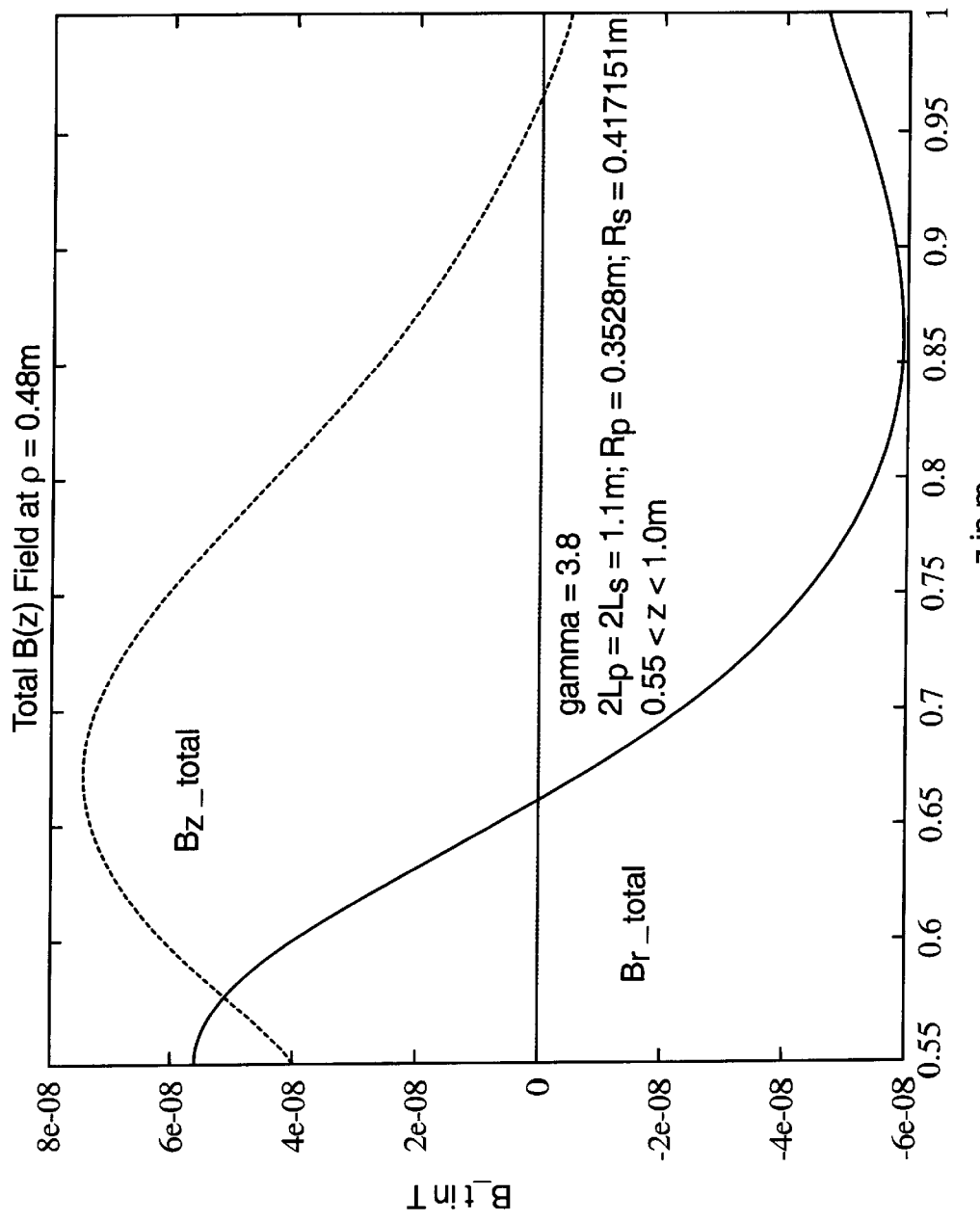
FIG. 5B is a graph showing the total magnetic field as a function of z at $\rho=0.48$ m in the region 0.55 m<z<1.0 m in accordance with aspects of the present invention.

The discrete current density for both coils, with a resolution of 1 mm, is found by numerical evaluation of the analytical expressions. Excellent shielding level occurs when the parameter γ=3.8 and only six constraint points outside the primary and secondary coils 60 and 62, respectively, that correspond to the consistency conditions, are equally spaced with a step of 0.0209 m. With reference to FIG. 2, the results for the z-dependence of the $J_\phi$-components of the current density on both coils are shown. From the Biot-Savart law, the calculated current densities are used to find all components of the magnetic field. FIG. 3 illustrates the z-dependence of the $B_z$-component of the magnetic field that corresponds to the contribution of the primary coil 60 only and the total magnetic field inside the primary coil 60 at the radial distance ρ=0.0 m. FIGS. 4A and 4B show the z dependence of the $B_\rho$- and $B_z$-components of the magnetic field within the coil system (0.0<z<0.55 m) at the radial distance ρ=0.48 mm (outside the secondary coil). FIG. 4A shows the contribution of the primary current to all components of the magnetic field of order 1.5 mT, and FIG. 4B shows the total shielded magnetic field of order 0.06 μT. FIGS. 5A and 5B illustrate the z dependence of the magnetic field outside the coil system (0.55<z<1.0 m) at the radial distance ρ=0.48 m. FIG. 5A shows the contribution of the primary current to all components of the magnetic field and FIG. 5B shows the total magnetic field. The shielding defined as follows:

$$\text{shielding factor} = \frac{\max B_{pr}(z, \rho = 0.48\,\text{m})}{\max B_{total}(z, \rho = 0.48\,\text{m})}$$

in the case under consideration is equal to $2.3\times10^4$.

Figure 6A:
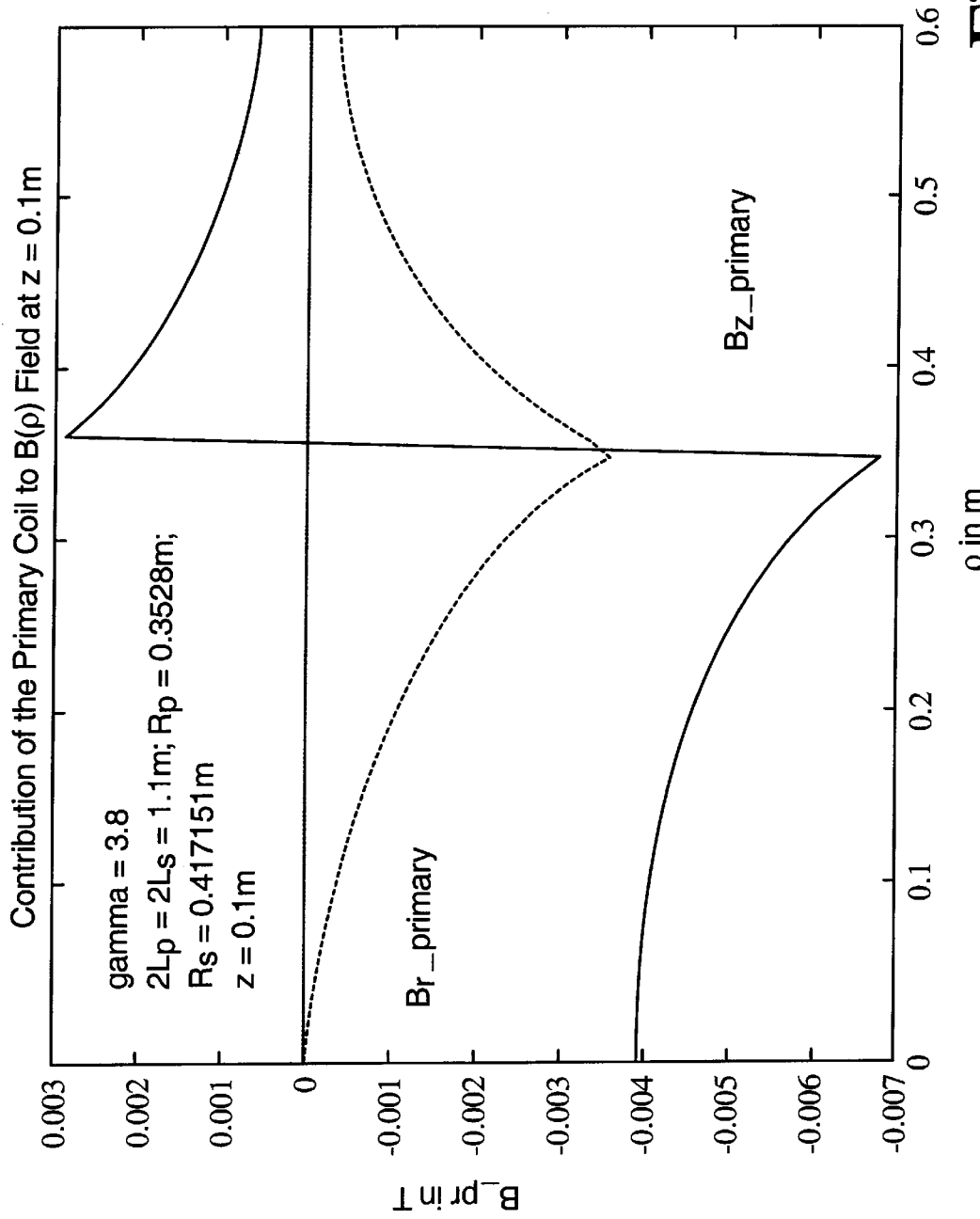
FIG. 6A is a graph showing the magnetic field from the primary coil as a function of $\rho$ at z=0.1 m in accordance with aspects of the present invention.

FIGS. 6A and 6B present the ρ dependence of the magnetic field at z=0.1 m. FIG. 6A shows the contribution of the primary current to all component of the magnetic field. It illustrates that the $B_\rho$-component of the magnetic field is continuous at ρ=$R_p$, while the $B_z$-component is discontinuous at the same point. FIG. 6B shows the ρ dependence of the total magnetic field. It illustrates that the $B_\rho$-component of the magnetic field is continuous at ρ=$R_p$ and ρ=$R_s$, while the $B_z$-component is discontinuous at the same points. All these results are consistent with the boundary conditions for the magnetic field behavior.

With reference to FIG. 7, An additional comparison is made when the length of the secondary coil $L_s$ is twice as long as the length $L_p$ of the primary coil. In this case, the field constraint is per Table 1, the primary current constraints are per Table 2, and the shield current constraints are per Table 3 but shifted further out along z by 55 cm. In this case, the current density on the primary coil is positive everywhere, while the current density on the secondary coil is negative everywhere. Comparing FIG. 2 and FIG. 7, in the case when the length of the primary coil is comparable with the length of the secondary coil, the current densities on both the primary and secondary coils have negative and positive lobes. In the case when the length of the secondary coil is considerably longer than the length of the primary coil, the current densities for both the primary and secondary coils do not go through a sign change within the length of the coils.

II. Z-Gradient Coil Example

Next, consider the example of an extra short z-gradient coil with an active shield. The gradient coil system consists of two coaxial cylindrical formers whose radii are: $R_p=0.3900$ m and $R_s=0.4725$ m, and half-lengths are $L_p=0.35$ m and $L_s=0.4$ m, respectively. Note that for this coil system, the ratios $R_p/L_p$ and $R_s/L_s$ are both greater than one $R_p/L_p=1.1143$ and $R_s/L_s=1.18125$. In designing the z-gradient coil, four field constraints were chosen. These constraints are set forth in Table 4 below.

TABLE 4

| ρ (in m) | φ (in rad) | z (in m) | $B_z$ (in mT) |
|---|---|---|---|
| 0.000 | 0.000 | 0.001 | 1.78e-5 |
| 0.185 | 0.000 | 0.001 | 1.99329e-5 |
| 0.225 | 0.000 | 0.001 | 1.99329e-5 |
| 0.000 | 0.000 | 0.220 | 0.00325 |

Nine constraint points for the $J_\phi$-components of the current densities outside the primary and secondary coils are used in order to satisfy the consistency conditions. The nine constraint points outside the primary and secondary coils are set forth in following Tables 5 and 6, respectively.

TABLE 5

| ρ = $R_p$ (in m) | z (in m) | $J_\phi^p$ (in A/m) |
|---|---|---|
| 0.3900 | 0.354 | 0.0 |
| 0.3900 | 0.374 | 0.0 |
| 0.3900 | 0.397 | 0.0 |
| 0.3900 | 0.419 | 0.0 |
| 0.3900 | 0.442 | 0.0 |
| 0.3900 | 0.464 | 0.0 |
| 0.3900 | 0.487 | 0.0 |
| 0.3900 | 0.509 | 0.0 |
| 0.3900 | 0.531 | 0.0 |

TABLE 6

| ρ = $R_s$ (in m) | z (in m) | $J_\phi^s$ (in A/m) |
|---|---|---|
| 0.4725 | 0.407 | 0.0 |
| 0.4725 | 0.422 | 0.0 |
| 0.4725 | 0.443 | 0.0 |
| 0.4725 | 0.465 | 0.0 |
| 0.4725 | 0.487 | 0.0 |
| 0.4725 | 0.508 | 0.0 |
| 0.4725 | 0.530 | 0.0 |
| 0.4725 | 0.551 | 0.0 |
| 0.4725 | 0.572 | 0.0 |

Figure 8A:
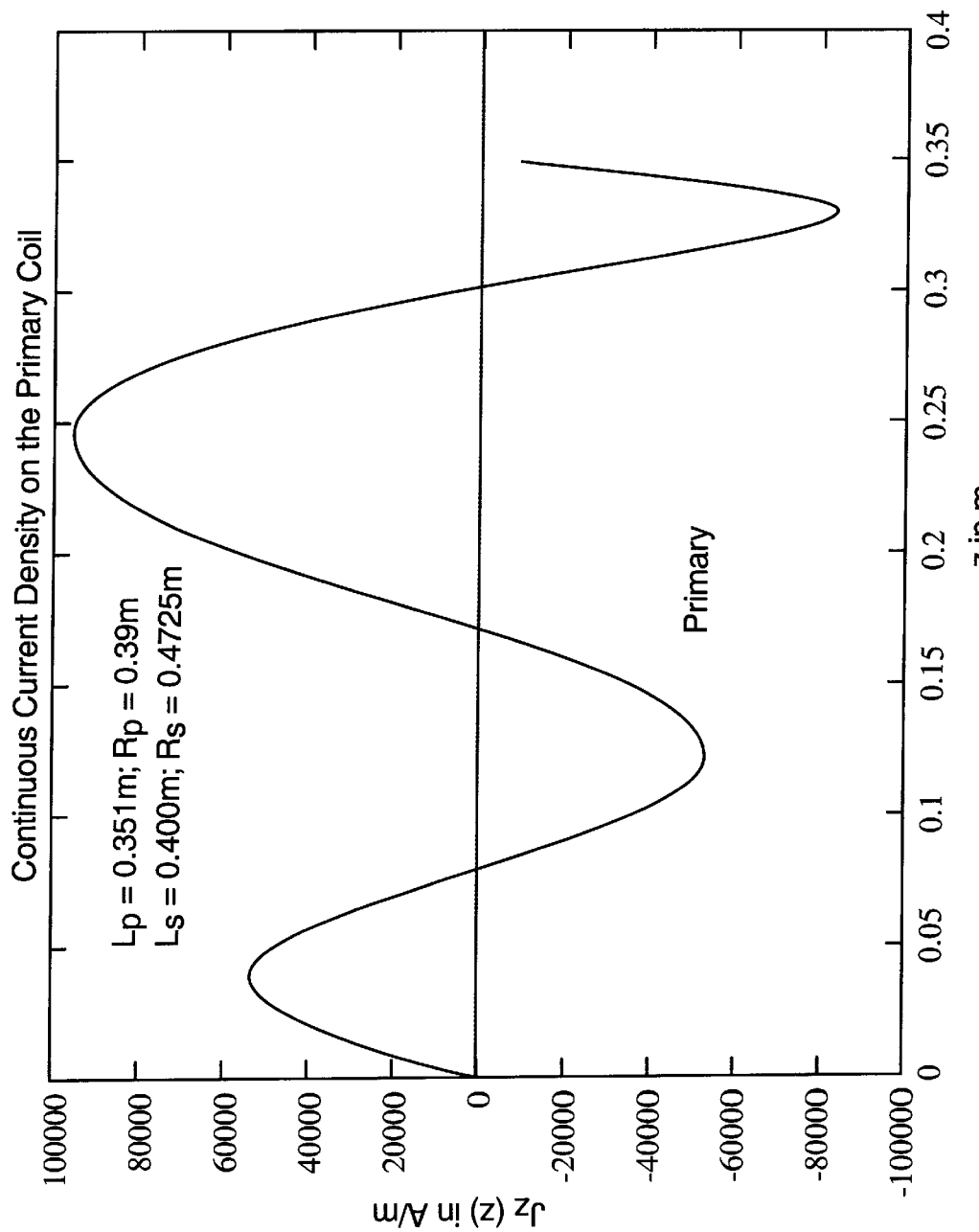
FIGS. 8A and 8B are graphs showing the z dependence of the $J_\phi$-components of the current density on the primary and secondary coils, respectively, in accordance with aspects of the present invention.
Figure 8B:
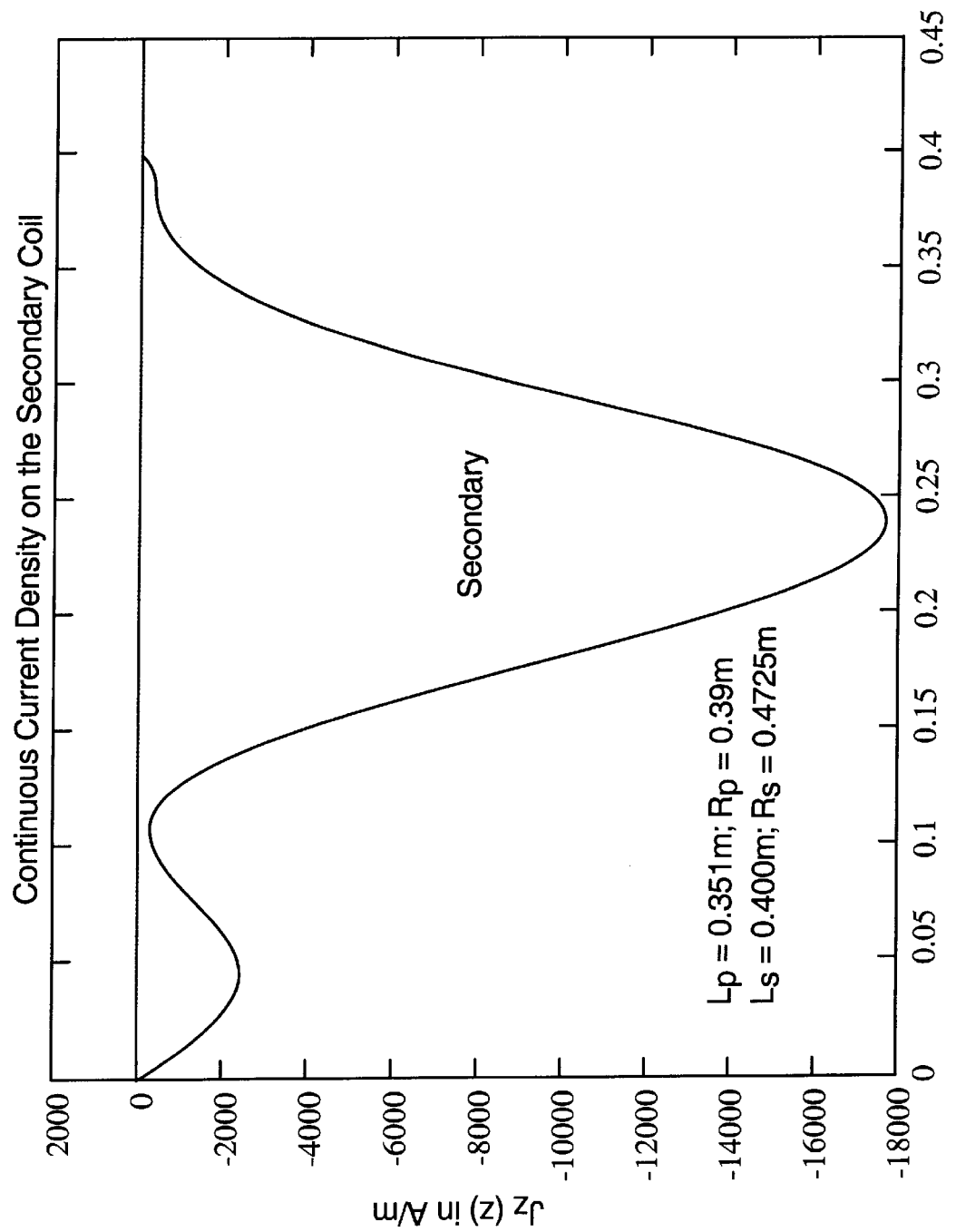

The discrete current density for both coils, with resolution of 1 mm, is found by numerical evaluation of the analytical expressions. Excellent shielding levels occur when the parameter γ=0.30. In FIGS. 8A and 8B, the results for the z-dependence of the $J_\phi$-components of the current density on both coils are shown. From the Biot-Savart law, the calculated current densities are used to find all components of the magnetic field.

Figure 9A:
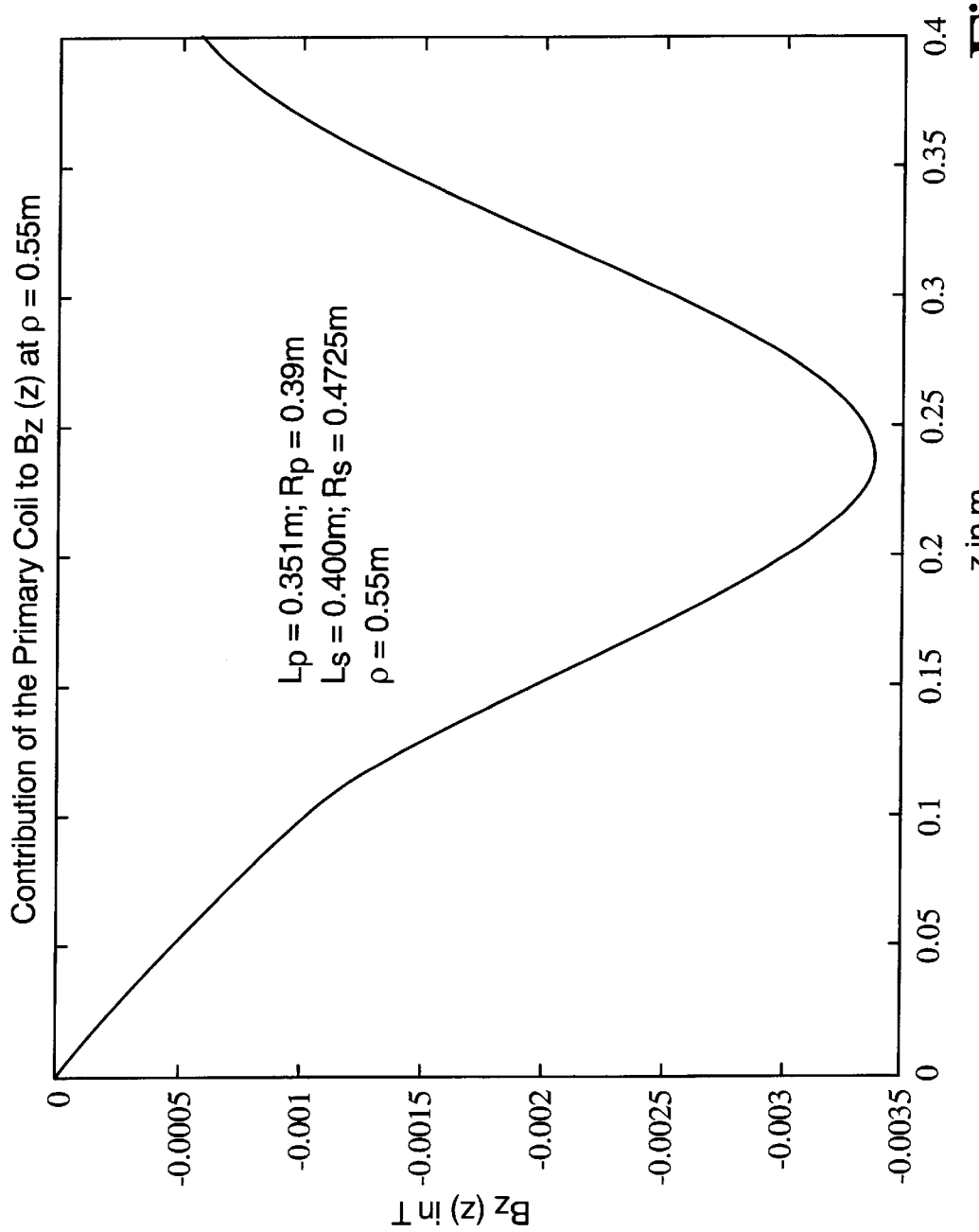
FIGS. 9A and 9B are graphs showing the z dependence of the magnetic field outside the coil system at a radial distance $\rho=0.55$ m within the length of the coil system (0.0<z<0.4 m) in accordance with aspects of the present invention.
Figure 9B:
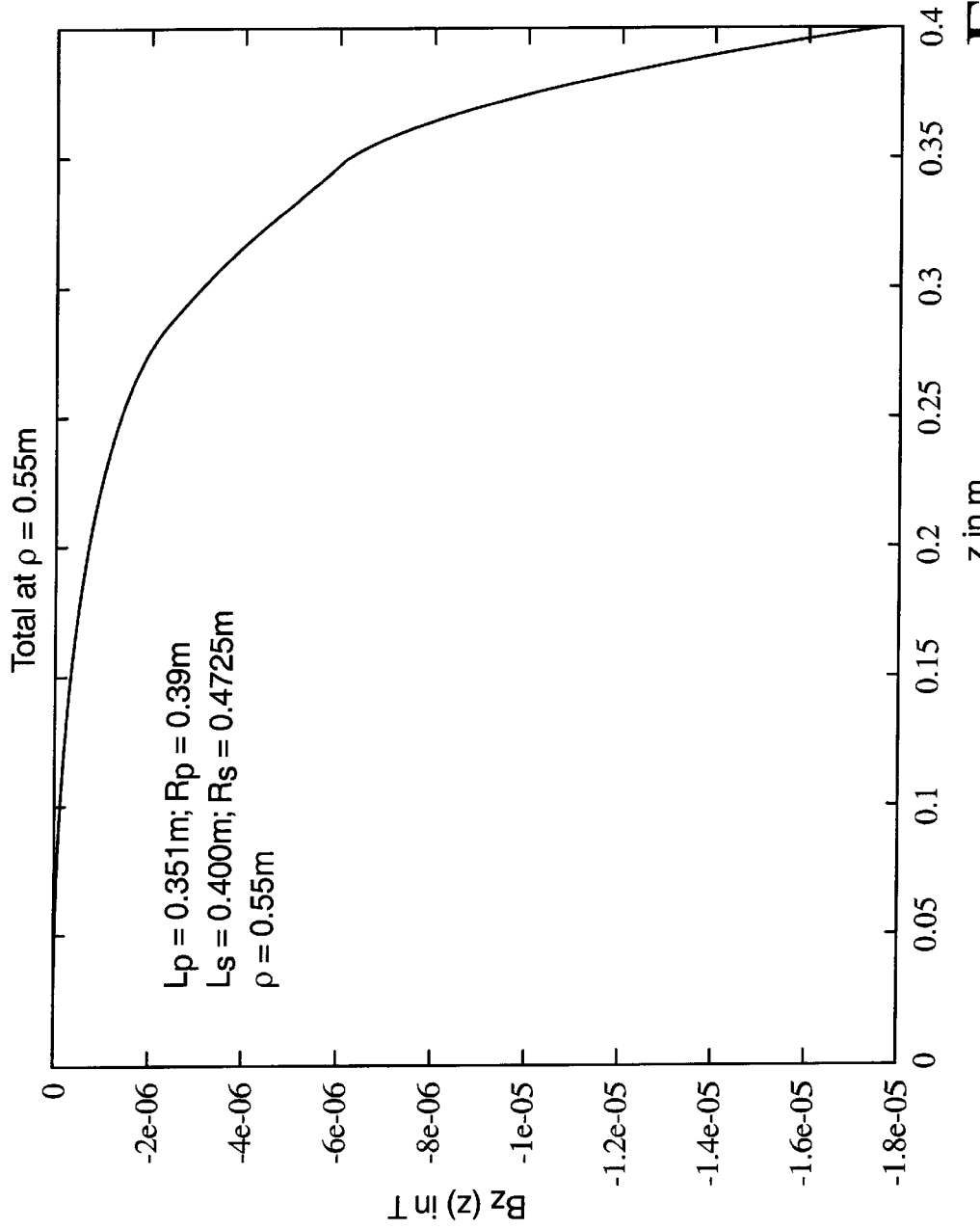
Figure 10:
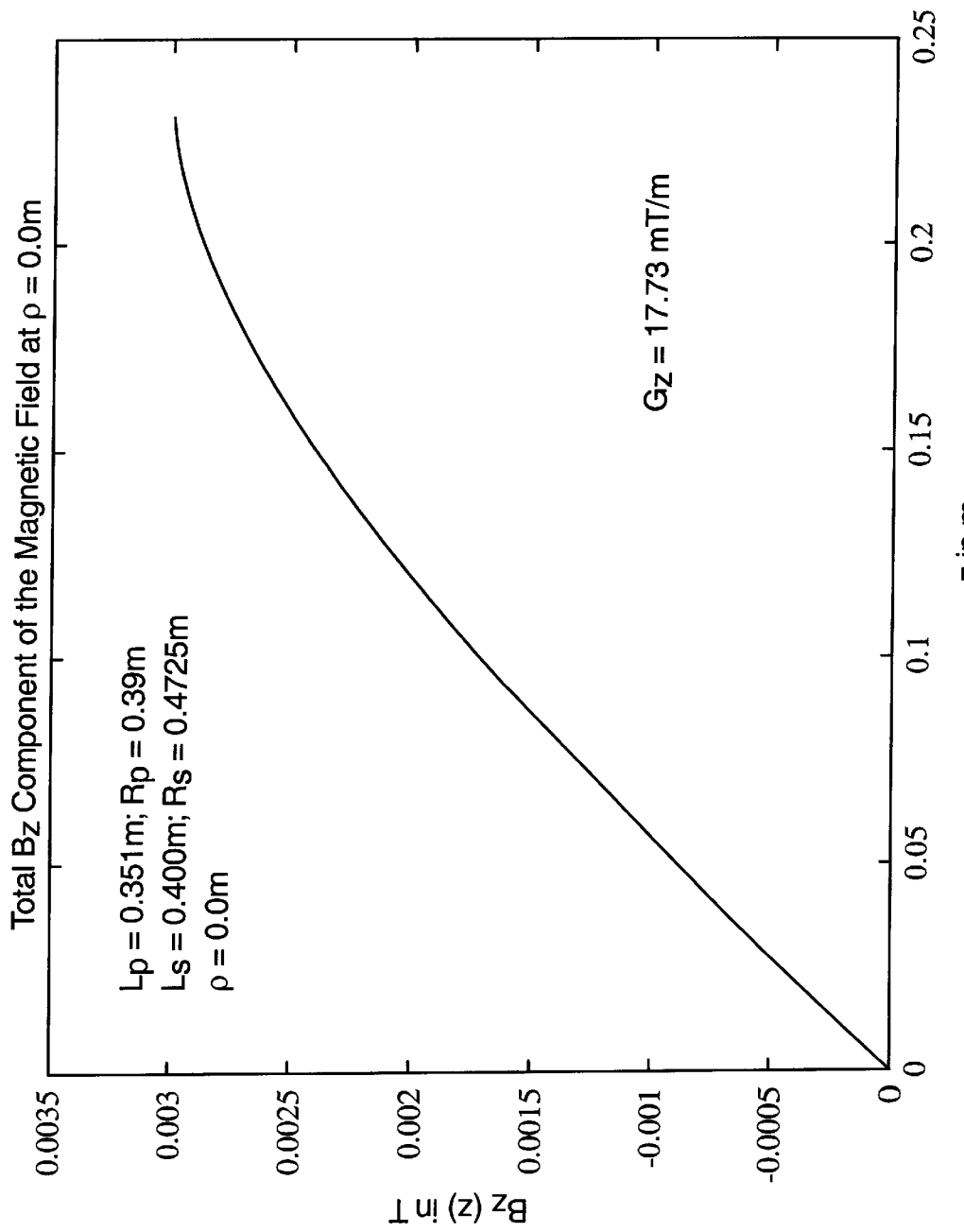
FIG. 10 is a graph showing the behavior of the $B_z$ components of the total magnetic field as a function of z inside the primary coil at $\rho=0.0$ m in accordance with aspects of the present invention.
Figure 11A:
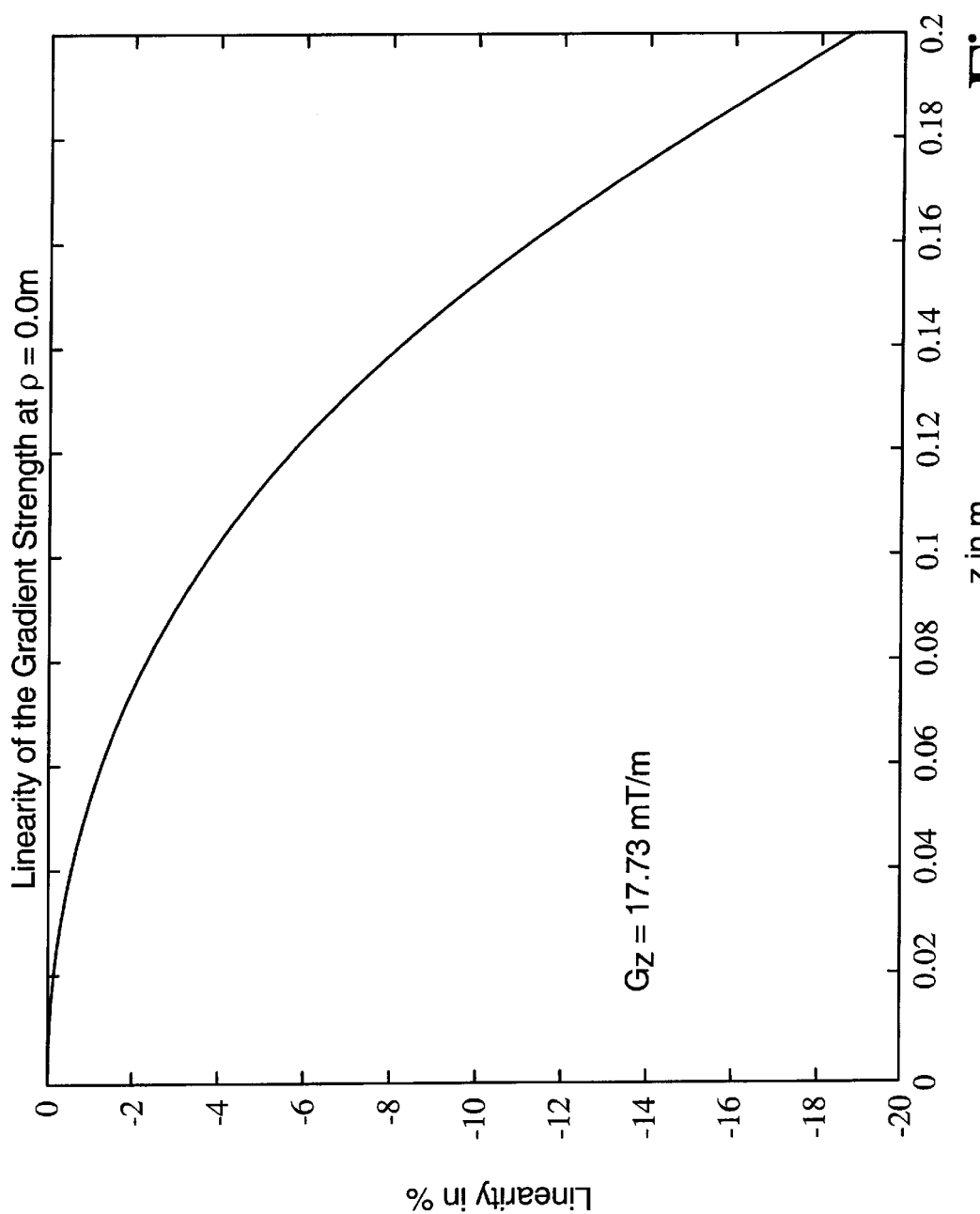
FIGS. 11A and 11B are graphs illustrating the linearity and uniformity, respectively, of the $B_z$ component of the total magnetic field in accordance with aspects of the present invention.
Figure 11B:
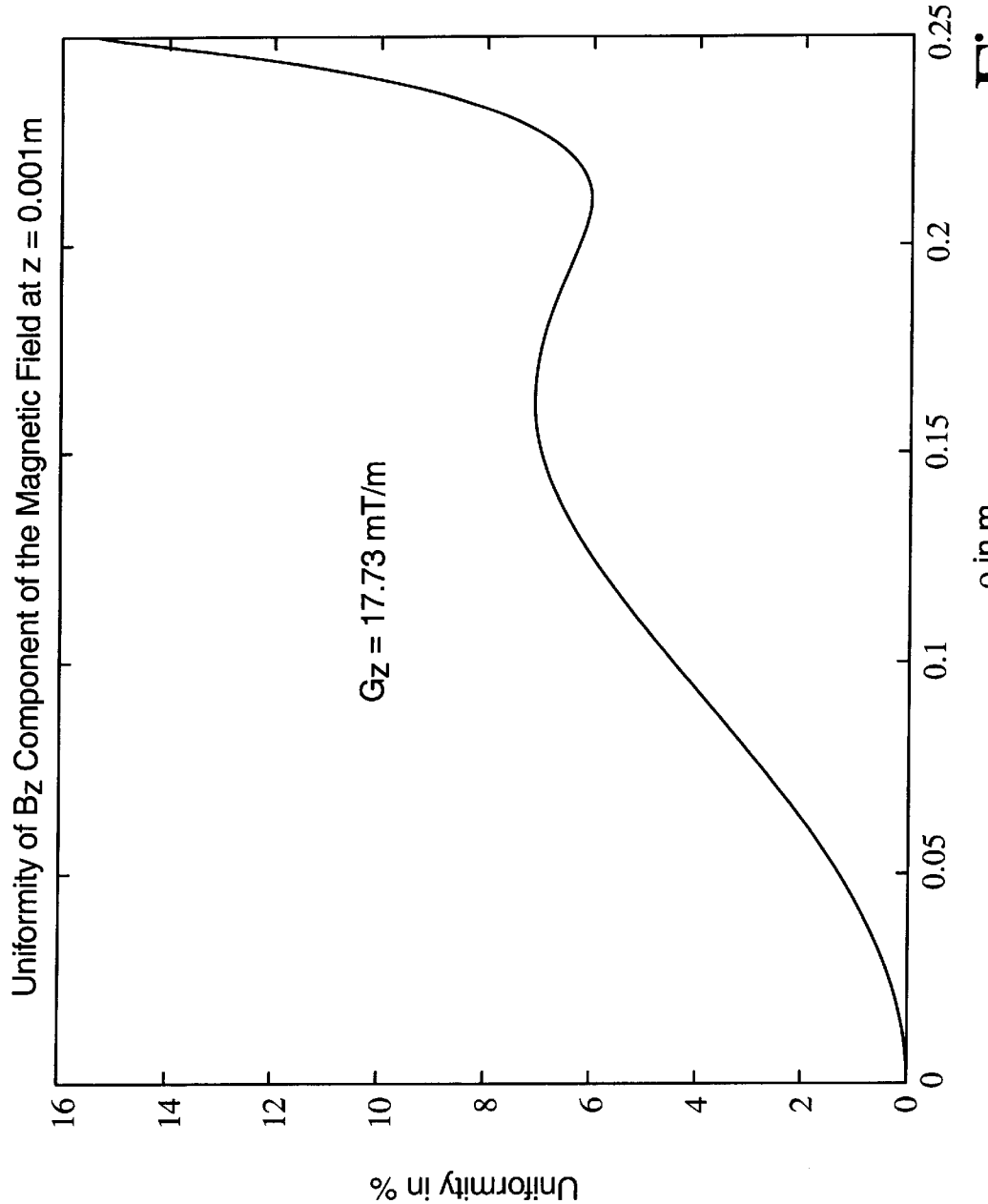

The gradient strength at the isocenter of the coil system is $G_z$=17.73 mT/m. FIGS. 9A and 9B illustrate the z dependence of the magnetic field outside the coil system at the radial distance ρ=0.55 m. Both graphs illustrate this behavior within the length of the coil system (0.0<z<0.4 m). In particular, FIG. 9A shows the total $B_z$ component of the magnetic field. In this region, the shielding factor is equal to 199.94. FIG. 10 represents the behavior of the $B_z$ components of the total magnetic field as a function of z inside the primary coil at ρ=0.0 m. FIG. 11A illustrates the linearity, and FIG. 11B, the uniformity of the $B_z$ component of the total magnetic field. The linearity is defined as $$L_{in} = \frac{G_z(z, \rho = 0.0) - G_z}{G_z} \times 100\%$$

where $G_z(z,\rho=0.0)$ is the global gradient strength of the magnetic field. The uniformity is defined as $$Unif = \frac{B_z(z = 0.001, \rho) - B_z(z = 0.001, \rho = 0.0)}{B_z(z = 0.001, \rho = 0.0)} \times 100\%$$

This uniformity illustrates how the gradient strength of the $B_z$ component of the magnetic field changes as ρ increases.

III. Electric Field Shielding Example

The surface structure system that is considered consists of two concentric cylinders: an inner cylinder whose radius is $R_p$=0.39 m and total length is $2L_p$=1.1 m, and an outer cylinder whose radius is $R_s$=0.43 m and total length is $2L_s$=1.1 m. This representative case uses charge distributions that produce non-zero longitudinal electric fields in the isocenter of the surface structure system. This means that the charge distributions are antisymmetric functions of z. One field constraint for the electric field at the isocenter is used. The cosntraint is shown in the following Table 7.

TABLE 7

| ρ (in m) | φ (in rad) | z (in m) | $E_z$ (in V/m) |
|---|---|---|---|
| 0.0 | 0.000 | 0.00 | 840.0 |

Nine contraint points for the charge distributions $O^{(p)}(z)$ and $O^{(s)}(z)$ outside the primary and secondary surface structures are used in order to satisfy the consistency conditions employed for the method of supershielding. These are given in Tables 8 and 9, respectively.

TABLE 8

| ρ = $R_p$ (in m) | z (in m) | $o^{(p)}$ (in A/m) |
|---|---|---|
| 0.39 | 0.5600 | 0.0 |
| 0.39 | 0.6120 | 0.0 |
| 0.39 | 0.7016 | 0.0 |
| 0.39 | 0.8058 | 0.0 |
| 0.39 | 0.9207 | 0.0 |
| 0.39 | 1.0444 | 0.0 |
| 0.39 | 1.1755 | 0.0 |
| 0.39 | 1.3131 | 0.0 |
| 0.39 | 1.4565 | 0.0 |

TABLE 9

| ρ = $R_s$ (in m) | z (in m) | $o^{(s)}$ (in A/m) |
|---|---|---|
| 0.43 | 0.5600 | 0.0 |
| 0.43 | 0.6120 | 0.0 |
| 0.43 | 0.7016 | 0.0 |
| 0.43 | 0.8058 | 0.0 |
| 0.43 | 0.9207 | 0.0 |
| 0.43 | 1.0444 | 0.0 |
| 0.43 | 1.1755 | 0.0 |
| 0.43 | 1.3131 | 0.0 |
| 0.43 | 1.4565 | 0.0 |

Discrete charge densities for both surface structures, with a resolution of 1 mm, are found by numerical evaluation of the analytical expressions. With the experience gained in the previous work, a significant degree of shielding is quickly obtained even prior to any systematic tweaking of the numerical method parameters. For example, it is seen below that shielding corresponding to field reductions by a factor of 3500 is obtained in the case where the cutoff parameter is chosen to be γ=15.0.

Figure 12:
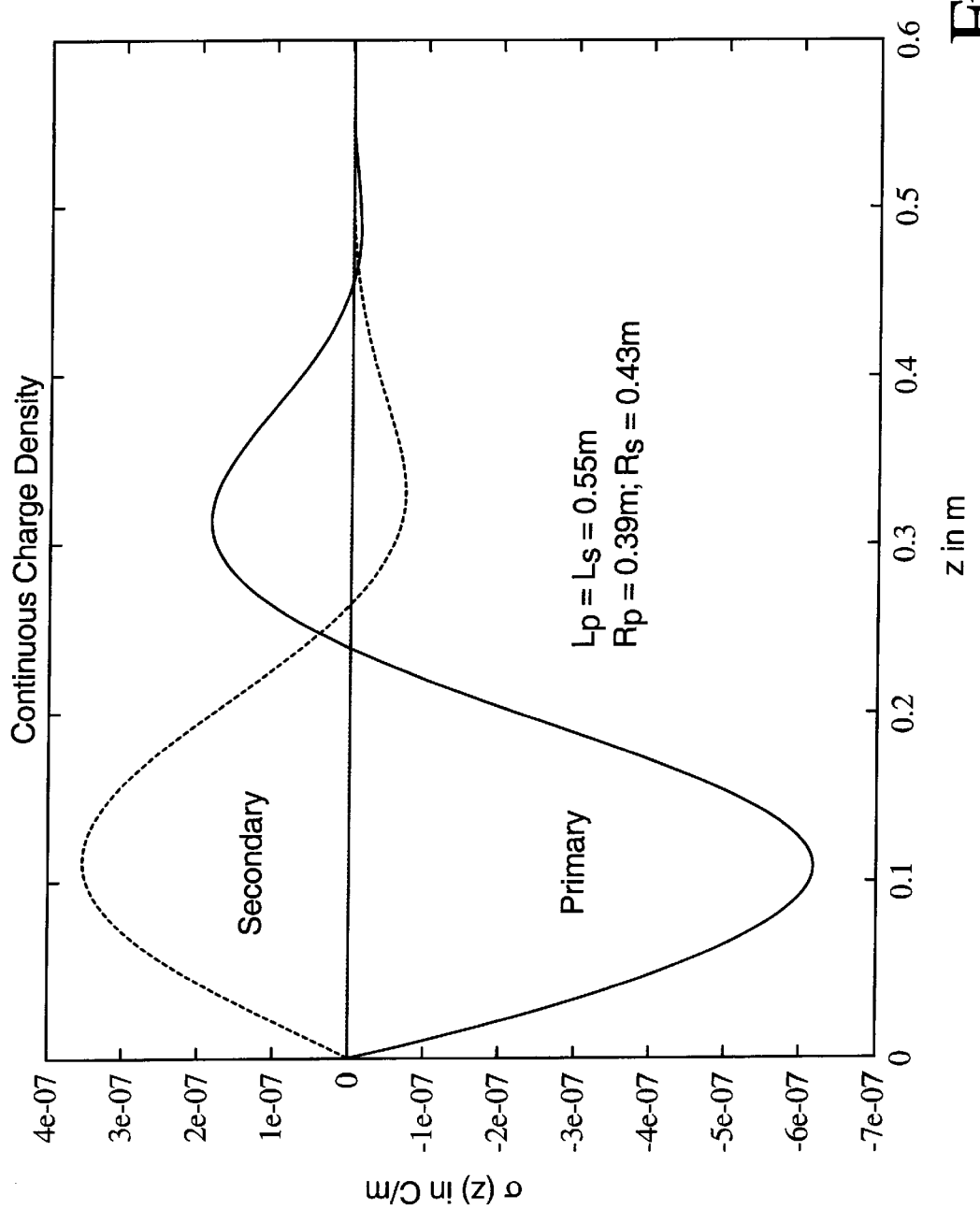
FIG. 12 is a graph showing the z dependence of a charge density on both primary and secondary surface structures in accordance with aspects of the present invention.
Figure 13A:
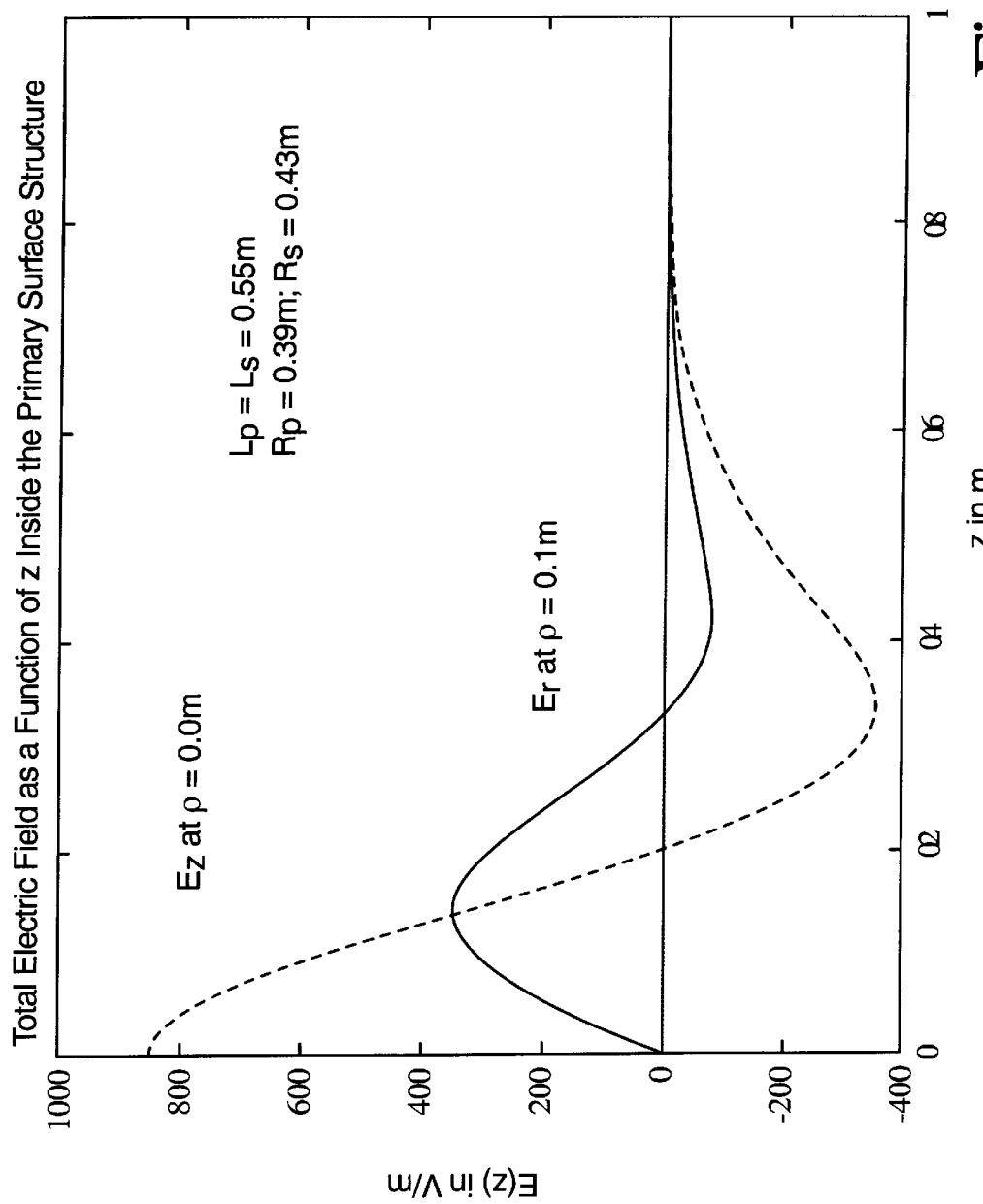
FIG. 13A is a graph showing the z dependence of two non-zero components of the total electric field inside a primary surface structure in accordance with aspects of the present invention.
Figure 13B:
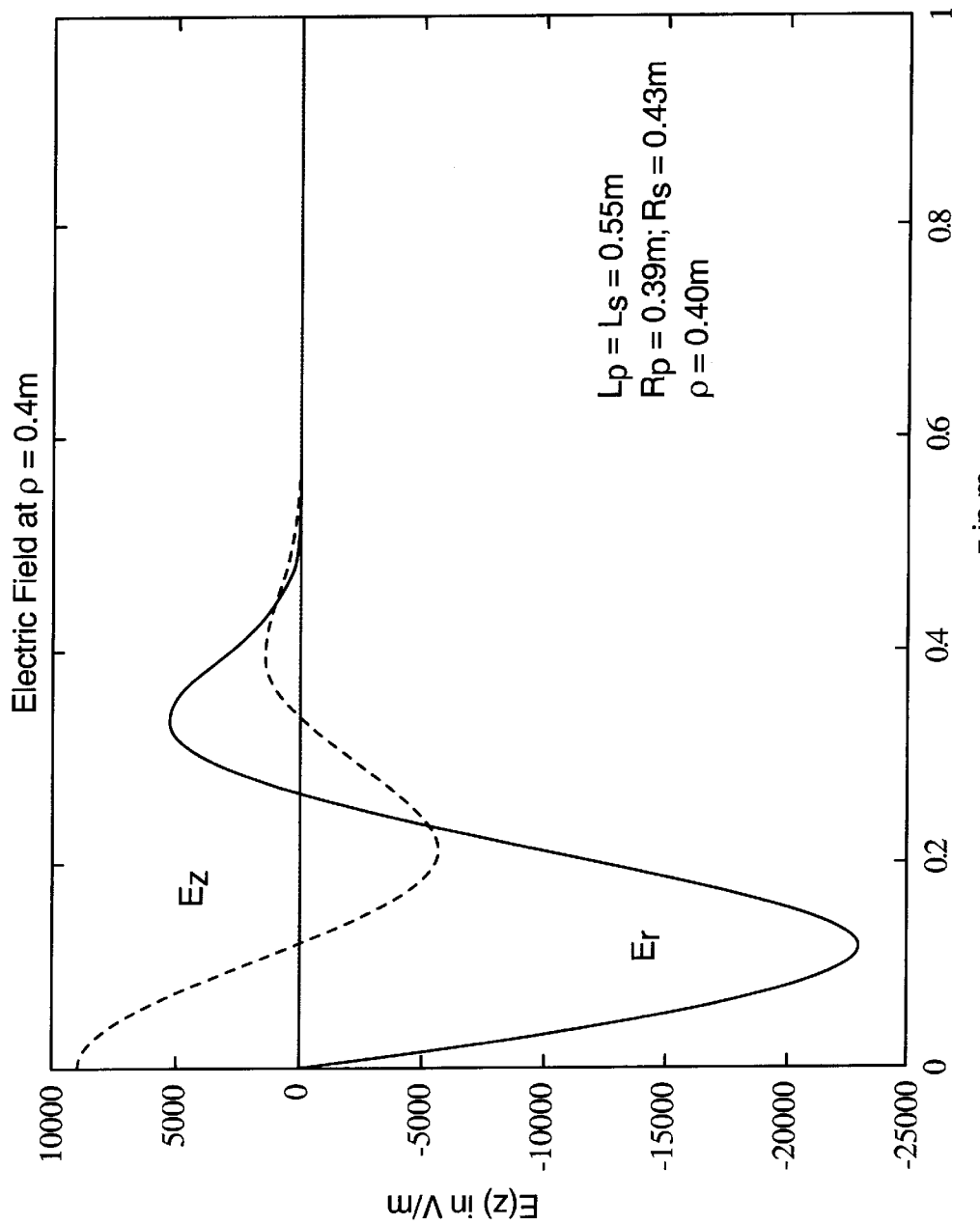
FIG. 13B is a graph showing the z dependence of two components of the electric field between a primary and secondary surface structure at a radial distance $\rho=0.4$ m in accordance with aspects of the present invention.
Figure 14A:
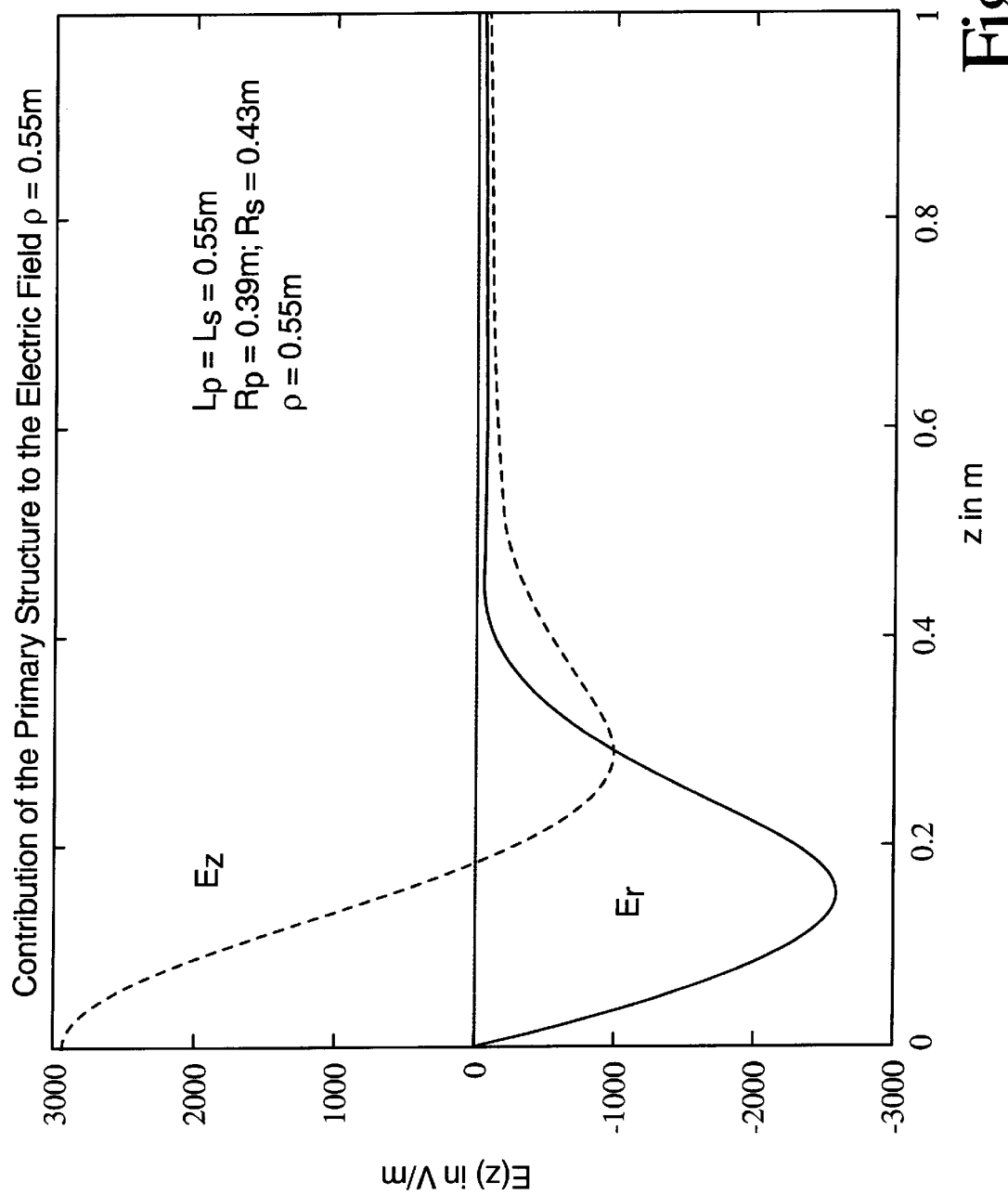
FIGS. 14A and 14B are graphs showing the contribution of the primary structure to the electric field and the total electric field at $\rho=0.55$ m, respectively, in accordance with aspects of the present invention.
Figure 14B:
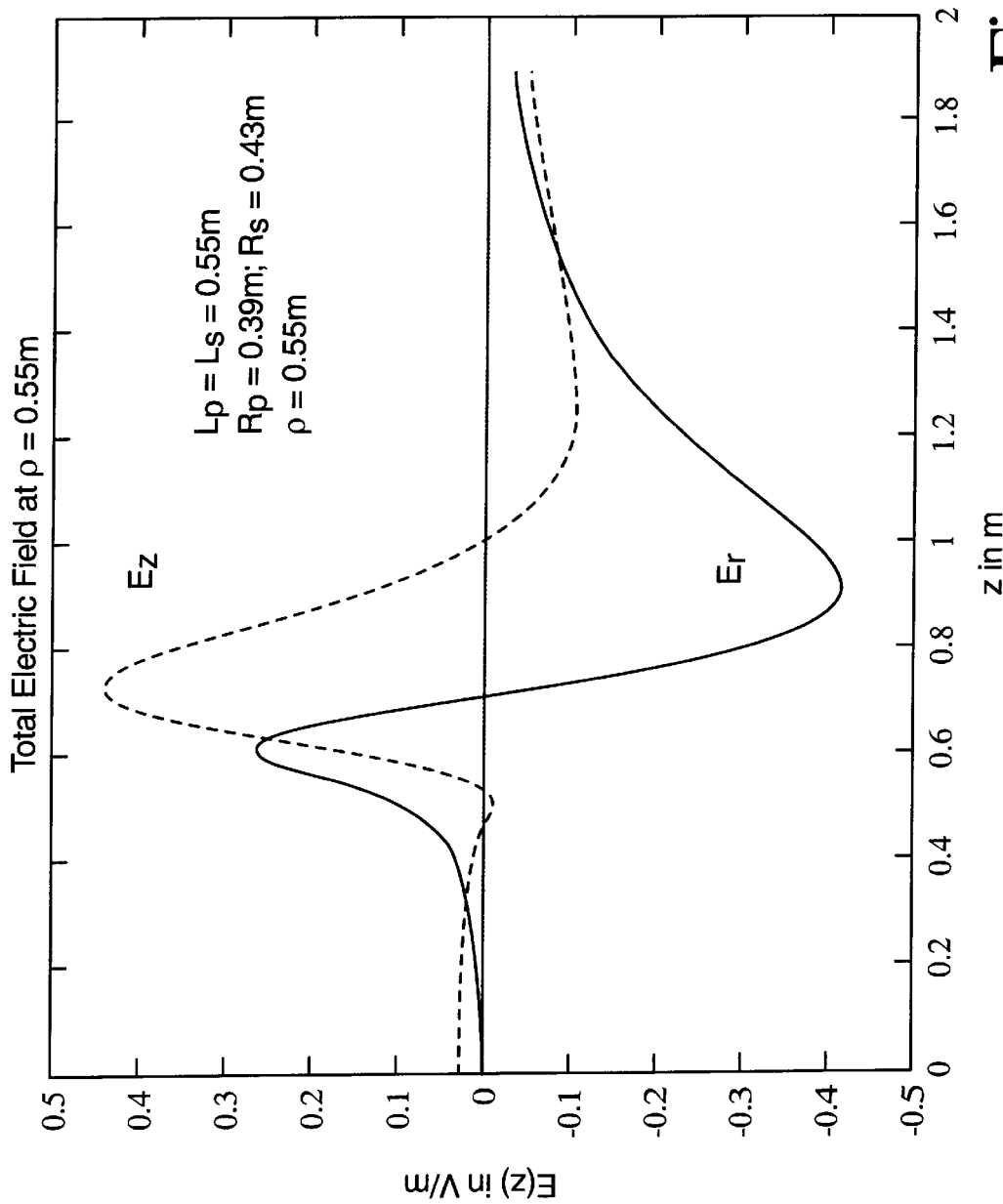

FIGS. 12–17 illustrate the numerical results. In FIG. 12, the results for the z-dependence of the charge density on both surface structures are shown. It is seen that the charge densities on both surface structures have different polarities as z changes from z=0 to the edges of the surface structures. The calculated charge densities are used to find all components of the electric field. FIG. 13A shows the z dependence of the two non-zero components of the total electric field inside the primary surface structure. In particular, it illustrates the behavior of the $E_z$ component at the radial distance ρ=0.0 m and the $E_\rho$ component at the radial distance of ρ=0.1 m. FIG. 13B presents the z dependence of both $E_z$ and $E_\rho$ components of the electric field between the primary and secondary surface structures at the radial distance ρ=0.4 m. It is seen from these figures that the electric field is stronger between the surface structures rather than inside the primary surface structure. This result is consistent with principles of shielding. In order to illustrate the shielding effect, the contributions of the charge density on the primary surface structure to all components of the electric field outside the surface structure system (at the radial distance ρ=0.55 m) are isolated and compared with the corresponding behavior of the total electric field at the same radial distance. FIG. 14A shows this behavior for the primary electric field and FIG. 14B shows similar behavior for the total shielded electric field. The 'shielding factor' is defined as $$\text{shielding factor} = \frac{\max E^{(pr)}(z, \rho = 0.55)}{\max E^{(total)}(z, \rho = 0.55)}$$

In the case under consideration, the shielding factor=6.7× $10^3$.

Figure 15A:
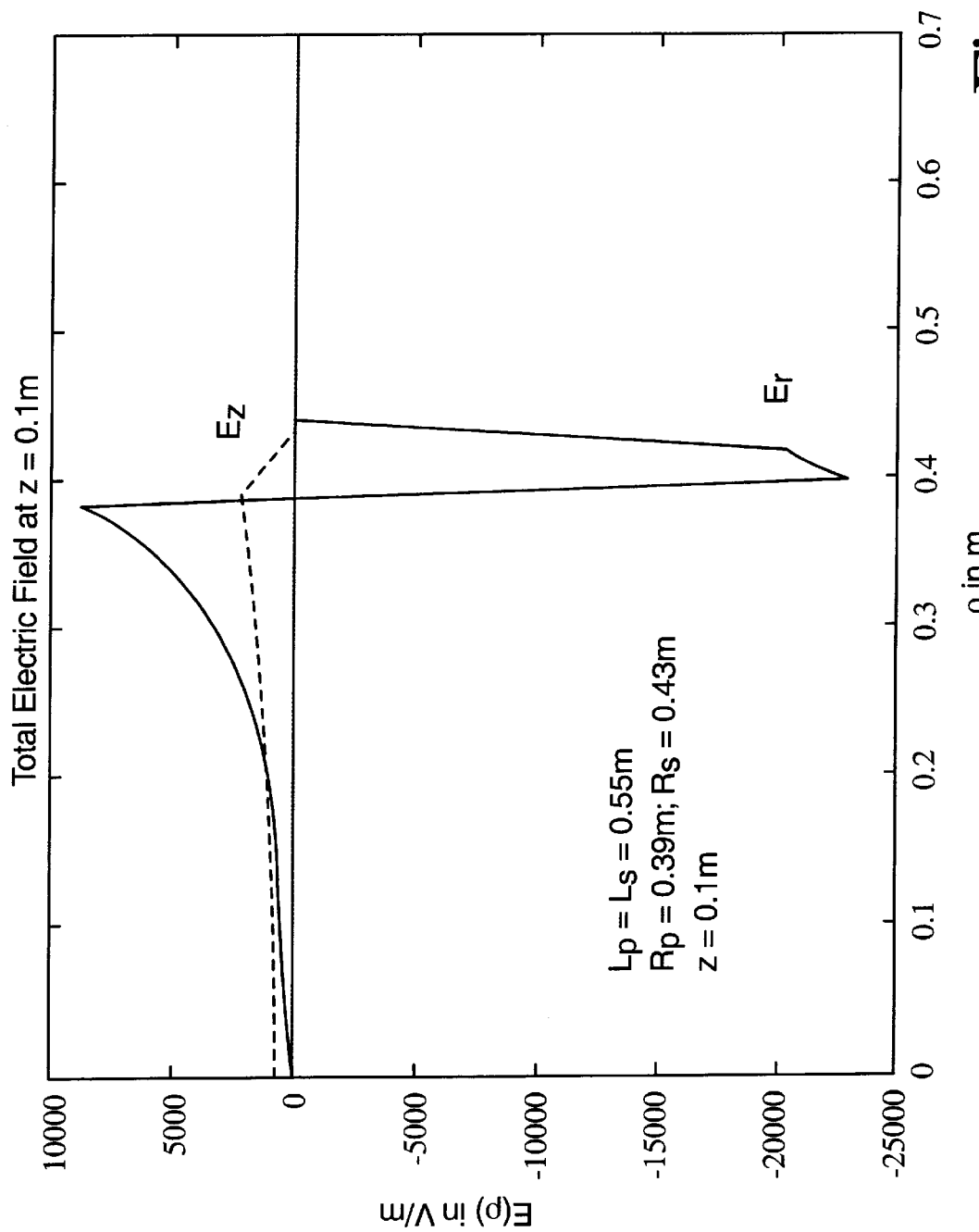
FIGS. 15A through 15C are graphs illustrating the radial $\rho$ dependence of the electric field within the surface structure system in accordance with aspects of the present invention.
Figure 15B:
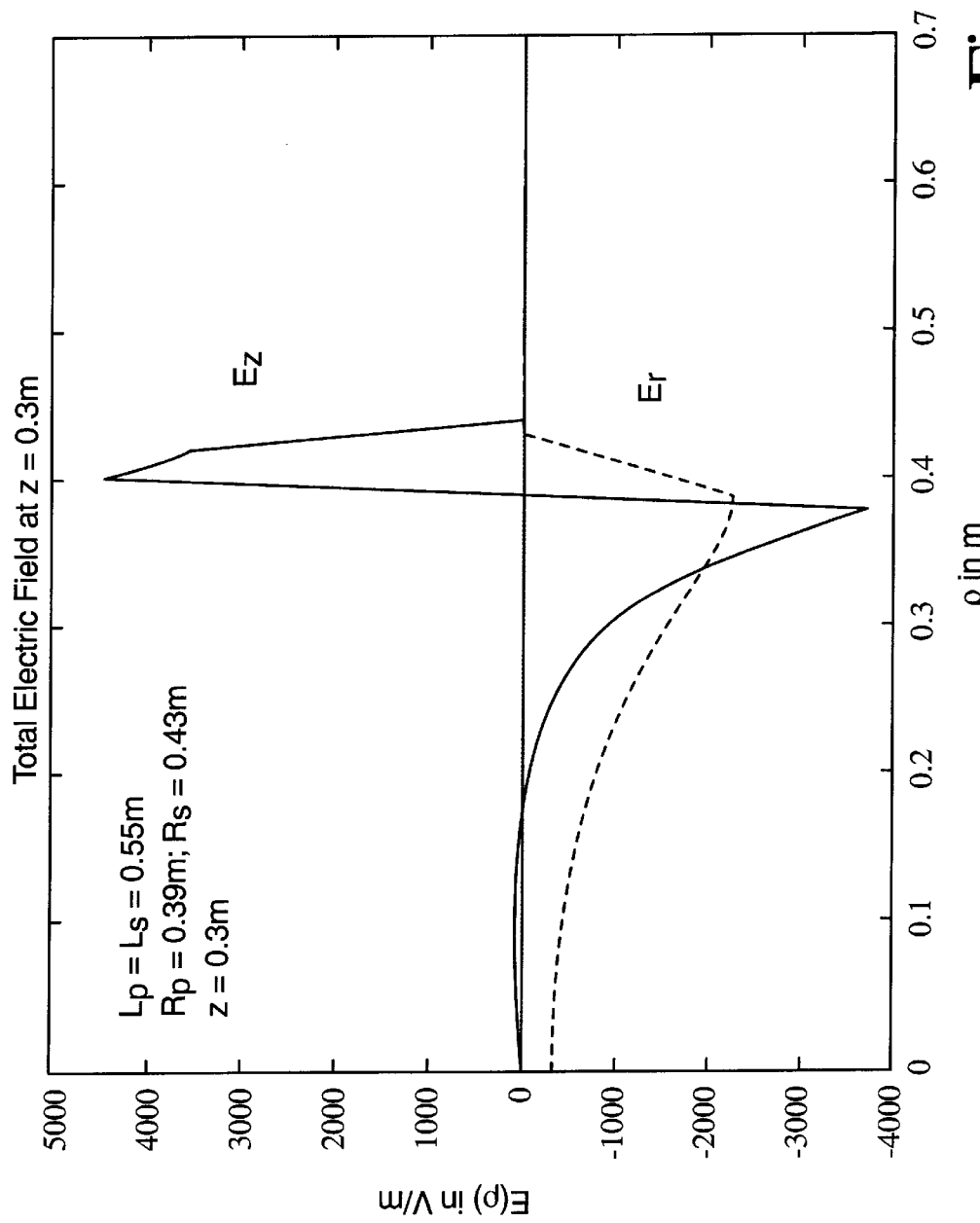
Figure 15C:
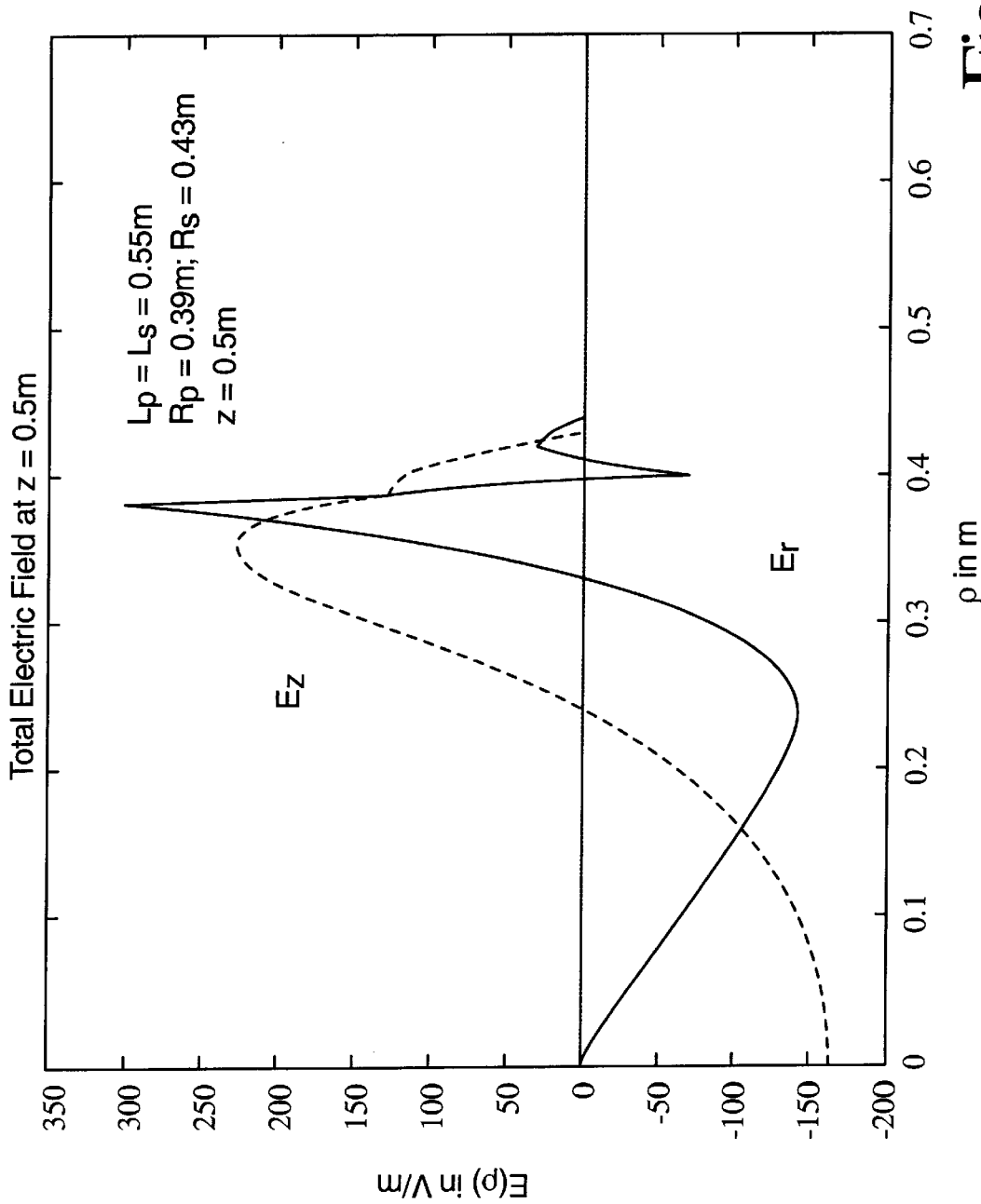
Figure 16:
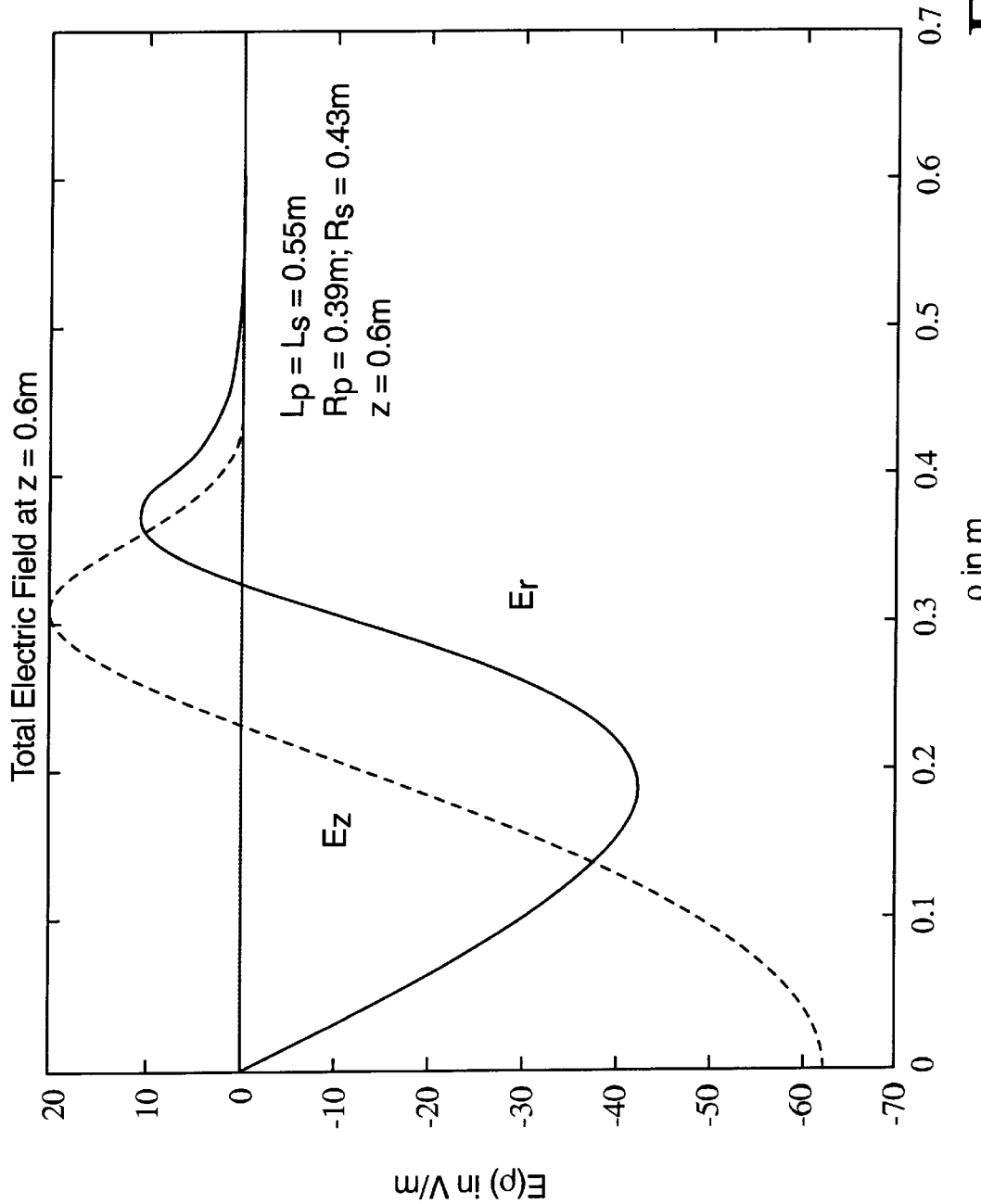
FIG. 16 is a graph showing the $\rho$ dependence of both components of the electric field at the position z=0.6 m which is beyond the length of the surface structure system in accordance with aspects of the present invention; and, FIG. 17 is a graph showing a continuous charge density for a surface structure system wherein the secondary surface structure is substantially twice as long as the primary surface structure in accordance with aspects of the present invention.

FIGS. 15A–15C and 16 show the radial dependence of all components of the total electric field at various z-positions. FIGS. 15A and 15C specifically illustrate the radial ρ dependence of the electric field within the surface structure system. They show that the $E_z$ component of the electric field is continuous as ρ crosses the surface structure former, while the $E_\rho$ component of the electric field is discontinuous in accordance with the presence of a surface charge distribution (Gauss's law). FIG. 16 shows the ρ dependence of both components of the electric field at the position z=0.6 m which is beyond the length of the surface structure system. Here both components of the electric fields are continuous as the radial distance ρ crosses the two cylinders of the surface structure system. Note that beyond ρ=0.43 m which is the radius of the secondary surface structure, both components of the electric field are well shielded.

Figure 17:
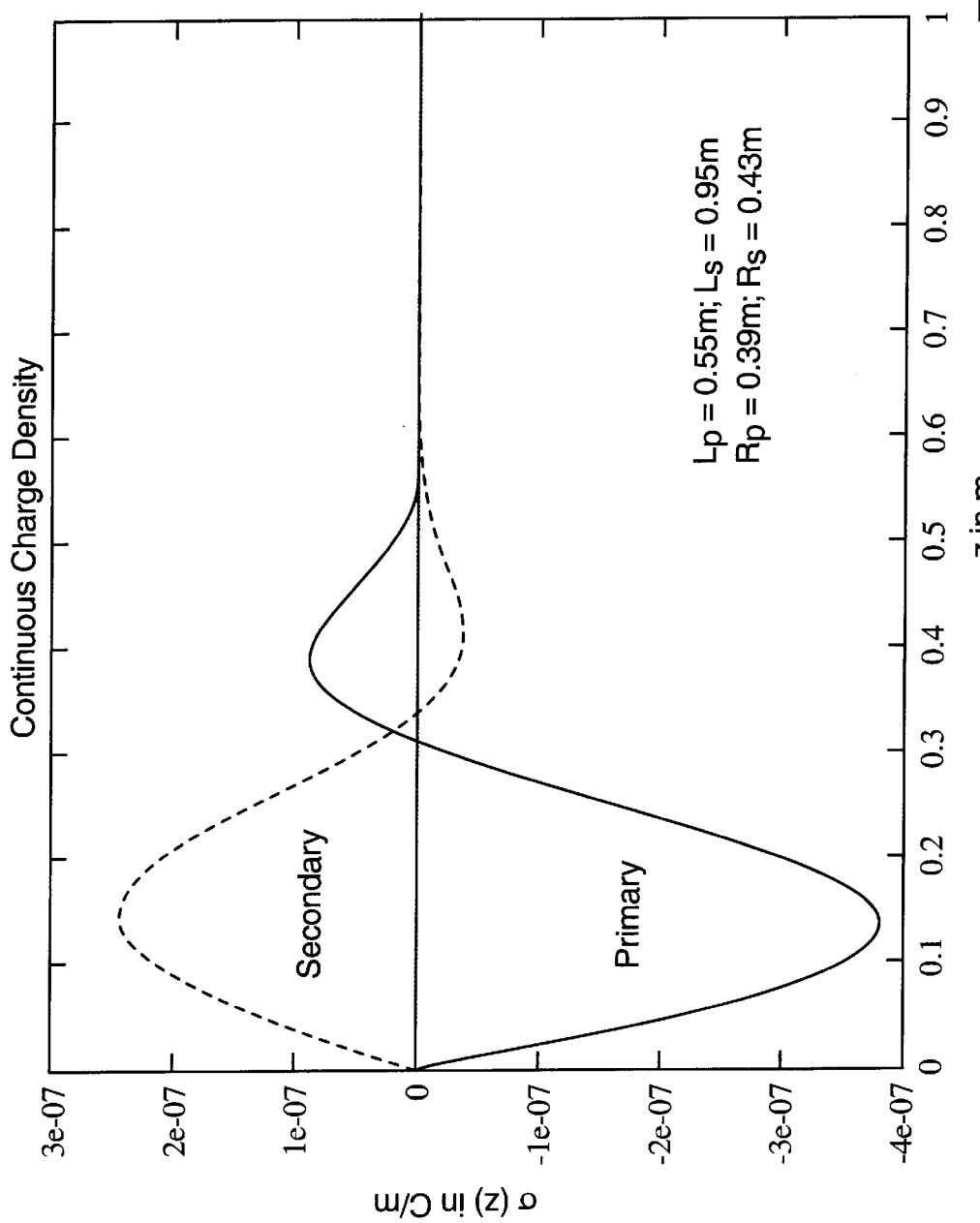

An additional comparison is made when the length of the secondary surface structure $L_s$ is almost twice as long as the length $L_\rho$ of the primary surface structure. In this case the charge density on both surface structures still change sign as z changes from z=0.0 m to the edges of the surface structures as it is shown in FIG. 17. Recall that in the case of the magnetic field, the currents' densities on both surface structures do not change their signs in the case when the secondary surface structure is much longer than the primary surface structure. As it is seen from FIGS. 13A and 14B, the electric field is concentrated mostly within the surface structure system and, outside the surface structures, falls off rapidly as z increases.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of designing an active shield for substantially zeroing a magnetic field on one side of a predetermined boundary in an open magnetic resonance imaging system, the method comprising:
    (a) defining a finite length cylindrical geometry for a primary coil which carries a first current distribution on its surface;
    (b) defining a finite length cylindrical geometry for a secondary coil which carries a second current distribution on its surface, the secondary coil being coaxial with the primary coil and the primary coil being inside the secondary coil;
    (c) constraining a total magnetic field resulting from a combination of the first and second current distributions such that normal components thereof substantially vanish at the surface and beyond of one of the primary and secondary coils;
    (d) constraining the first current distribution to the surface of the primary coil;
    (e) constraining the second current distribution to the surface of the secondary coil; and,
    (f) calculating the first and second current distributions concurrently allowing both the first and second current distributions to vary while observing the constraints such that a predetermined magnetic field is achieved in a first region and a magnetic field on one side of a predetermined boundary is substantially zeroed.

2. The method according to claim 1 wherein the calculating step includes determining the first and second current distributions for exterior shielding of axial coils according to:

$$\Theta(L_s - |z|)f_n^{\pm,(s)}(z) + \frac{1}{\pi}\int_{-L_p}^{L_p} r_a(z-y)f_n^{\pm,(p)}(y)dy = 0$$

where $f_0^{\pm,(s)}$ is said second current distribution on the secondary coil of length $2L_s$ and radius $R_s$, and $f_0^{\pm,(p)}$ is said first current distribution on the primary coil of length $2L_\rho$ and radius $R_\rho$, and $r_a$ is a Fourier transform $$r_a(z-y) = \int_0^\infty R_a(k)\cos k(z-y)dk$$

where $$R_a(k) = \frac{R_p}{R_s}\frac{I'_0(kR_p)}{I'_0(kR_s)}$$

in terms of a modified Bessel function $I_0$.

3. The method according to claim 1, wherein lengths of the primary coil and the secondary coil are substantially the same.

4. The method according to claim 1, wherein the total magnetic field resulting from the combination of the first and second current distributions is constrained such that normal components thereof vanish at the surface of the secondary coil and the substantially zeroed magnetic field is outside the predetermined boundary which is defined by a mathematical cylindrical surface of infinite length containing the secondary coil.

5. The method according to claim 1, wherein the total magnetic field resulting from the combination of the first and second current distributions is constrained such that normal components thereof substantially vanish at the surface of the primary coil and the substantially zeroed magnetic field is inside the predetermined boundary which is defined by a mathematical cylindrical surface of infinite length containing the primary coil.

6. The method according to claim 1, wherein an amount of energy associated with the first and second current distributions is minimized.

7. In an open magnetic resonance scanner having a main magnet for generating a main magnetic field through an examination region, said main magnet being arranged such that its geometry defines said examination region; a couch which supports a subject to be examined within said examination region; a radio frequency coil disposed adjacent said examination region for transmitting radio frequency signals into said examination region and selectively exciting dipoles disposed therein; a radio frequency transmitter for driving said radio frequency coil; a receiver which receives magnetic resonance signals from resonating dipoles within said examination region; and, an image processor which reconstructs an image representation from received magnetic resonance signals for display on a human readable display; a gradient coil assembly which generates substantially linear predetermined magnetic gradients across said main magnetic field in said examination region, said gradient coil assembly comprising:

at least one finite length cylindrical primary coil disposed about said examination region including a first array of current carrying coil loops arranged on a first former to define a first current density; and, at least one finite length cylindrical secondary coil disposed about and substantially coaxial with said primary coil between said primary coil and said main magnet including a second array of current carrying coil loops arranged on a second former to define a second current density;

wherein said first current density is a discretized version of a first continuous current density;

wherein said second current density is a discretized version of a second continuous current density; and, wherein a residual magnetic field outside a boundary coincident with said second former is substantially zeroed by concurrently calculating said first and second continuous current densities both as variables while (i) constraining a magnetic field generated by a combination of said first and second continuous current densities such that normal components thereof substantially vanish at a surface defined by said second former, (ii) constraining said first continuous current density to a surface defined by said first former, and (iii) constraining said second continuous current density to said surface defined by said second former.

8. The method according to claim 1 wherein the calculating step includes determining the first and second current distributions for exterior shielding of transverse coils according to:

$$\Theta(L_s - |z|)q_n^{\pm,(s)}(z) + \frac{1}{\pi}\int_{-L_p}^{L_p} r_t(z-y)q_n^{\pm,(p)}(y)dy = 0$$

where $q_n^{\pm,(s)}$ is said second current distribution on the secondary coil of length $2L_s$ and radius $R_s$, and $\sigma_n^{\pm,(p)}$ is said first current distribution on the primary coil of length $2L_p$ and radius $R_p$, and $r_t$ is a Fourier transform $$r_t(z-y) = \int_0^\infty R_t(k)\cos k(z-y)dk$$

where $$R_a(k) = \frac{R_p^2}{R_s^2}\frac{I'_n(kR_p)}{I'_n(kR_s)}$$

in terms of a modified Bessel function $I_n$.

9. The gradient coil assembly according to claim 7, wherein said first and second formers have substantially the same lengths.

10. The gradient coil assembly according to claim 7, wherein said boundary containing said second former defines an infinitely long mathematical cylindrical surface.

11. The gradient coil assembly according to claim 7, wherein an amount of energy used by said primary and secondary coils is minimized.

12. The gradient coil assembly according to claim 7, wherein the gradient coil assembly includes three pairs of said primary and secondary coils arranged such that each pair generates substantially linear predetermined magnetic gradients along one of three mutually orthogonal axes, said axes arranged such that one of the axes is coincident with a central axis of the primary coil.

13. A method of designing an active shield for substantially zeroing an electric field on one side of a predetermined boundary in an open electric system, the method comprising:

(a) defining a finite length cylindrical primary structure which carries a first charge distribution an its surface;

(b) defining a finite length cylindrical secondary structure, coaxial with the primary structure and outside of the primary structure, which carries a second charge distribution on its surface;

(c) constraining a total electric field resulting from a combination of the first and second charge distributions such that tangential components thereof substantially vanish at the surface and beyond of one of the primary and secondary structures;

(d) constraining the first charge distribution to the surface of the primary structure;

(e) constraining the second charge distribution to the surface of the secondary structure; and, (f) with both the first and second charge distributions as factors, calculating the first and second charge distributions concurrently while observing the constraints such that a predetermined electric field is achieved in a first region and an electric field on one side of a predetermined boundary is substantially zeroed.

14. The method according to claim 13 wherein the calculating step includes determining the first and second charge distributions for exterior shielding of cylindrical structures according to:

$$\theta(L_s - |z|)\sigma_n^{\pm,(s)}(z) + \frac{1}{\pi}\int_{-L_p}^{L_p} r_e(z-y)\sigma_n^{\pm,(p)}(y)dy = 0$$

where $\sigma_n^{\pm,(s)}$ is said second charge distribution on the secondary structure of length $2L_s$ and radius $R_s$ and $\sigma_n^{\pm,(p)}$ is said first charge distribution on the primary structure of length $2L_p$ and radius $R_p$, and $r_e$ is a Fourier transform $$r_e(z-y) = \int_0^\infty R_e(k)\cos k(z-y)dk$$

where $$R_e(k) = \frac{R_p}{R_s}\frac{I_n(kR_p)}{I_n(kR_s)}$$

in terms of a modified Bessel function $I_n$.

15. The method according to claim 13, wherein lengths of the primary structure and the secondary structure are substantially the same.

16. The method according to claim 13, wherein the total electric field resulting from the combination of the first and second charge distributions is constrained such that tangential components thereof vanish at the surface of the secondary structure and the substantially zeroed electric field is outside the predetermined boundary which is defined by a cylinder of infinite length that is coincident with the secondary structure.

17. The method according to claim 13, wherein the total electric field resulting from the combination of the first and second charge distributions is constrained such that tangential components thereof vanish at the surface of the primary structure and the substantially zeroed electric field is inside the predetermined boundary which is defined by a mathematical cylindrical surface of infinite length containing the primary structure.

18. The method according to claim 1 wherein the calculating step includes determining the first and second current distributions for interior shielding of transverse coils according to:

$$\theta(L_p - |z|)q_n^{\pm,(p)}(z) + \frac{1}{\pi}\int_{-L_s}^{L_s} r_\tau(z-y)q_n^{\pm,(s)}(y)dy = 0$$

where $\sigma_\eta^{\pm,(s)}$ is said second current distribution on the secondary coil of length $2L_s$ and radius $R_s$, and $\sigma_\eta^{\pm,(p)}$ is said first current distribution on the primary coil of length $2L_p$ and radius $R_p$, and $r_\gamma$ is a Fourier transform $$r_\tau(z-y) = \int_0^\infty R_\tau(k)\cos k(z-y)\,dk$$

where $$R_\tau(k) = \frac{R_s^2}{R_p^2}\frac{K_n'(kR_s)}{K_n'(kR_p)}$$

in terms of a modified Bessel function $K_n$.

19. The method according to claim 13 wherein the calculating step includes determining the first and second charge distributions for interior shielding of cylindrical structures according to:

$$\theta(L_p - |z|)\sigma_n^{\pm,(p)}(z) + \frac{1}{\pi}\int_{-L_s}^{L_s} r_i(z-y)\sigma_n^{\pm,(s)}(y)dy = 0$$

where $\sigma_\eta^{\pm,(s)}$ is said second charge distribution on the secondary structure of length $2L_s$ and radius $R_s$, and $\sigma_\eta^{\pm,(p)}$ is said first charge distribution on the primary structure of length $2L_p$ and radius $R_p$, and $r_j$ is a Fourier transform $$r_i(z-y) = \int_0^\infty R_i(k)\cos k(z-y)\,dk$$

where $$R_i(k) = \frac{R_s}{R_p}\frac{K_n(kR_s)}{K_n(kR_p)}$$

in terms of a modified Bessel function $K_n$.

20. The method according to claim 1 wherein the calculating step includes determining the first and second current distributions for interior shielding of axial coils according to:

$$\theta(L_p - |z|)f_0^{\pm,(p)}(z) + \frac{1}{\pi}\int_{-L_s}^{L_s} r_A(z-y)f_0^{\pm,(s)}(y)dy = 0$$

where $f_0^{\pm,(s)}$ is said second current distribution on the secondary coil of length $2L_s$ and radius $R_s$, and $f_0^{\pm,(p)}$ is said first current distribution on the primary coil of length $2L_p$ and radius $R_p$, and $r_A$ is a Fourier transform $$r_A(z-y) = \int_0^\infty R_A(k)\cos k(z-y)\,dk$$

where $$R_A(k) = \frac{R_s}{R_p}\frac{K_0'(kR_s)}{K_0'(kR_p)}$$

in terms of a modified Bessel function $K_0$.

* * * * *